US010821890B2

(12) United States Patent
Diana et al.

(10) Patent No.: US 10,821,890 B2
(45) Date of Patent: Nov. 3, 2020

(54) LIGHT ENGINES WITH DYNAMICALLY CONTROLLABLE LIGHT DISTRIBUTION

(71) Applicant: Lumileds LLC, San Jose, CA (US)

(72) Inventors: Frederic Stephane Diana, Santa Clara, CA (US); Yifeng Qiu, San Jose, CA (US); Michael Wasilko, San Jose, CA (US); Nazila Soleimani, San Jose (CA); Jeroen Den Breejen, San Jose, CA (US); Alan Andrew McReynolds, San Jose, CA (US); Gregory Donald Guth, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/403,484

(22) Filed: May 3, 2019

(65) Prior Publication Data
US 2019/0337449 A1 Nov. 7, 2019

Related U.S. Application Data

(63) Continuation-in-part of application No. 16/014,734, filed on Jun. 21, 2018.
(Continued)

(30) Foreign Application Priority Data

Jul. 27, 2018 (EP) .................................... 18186073

(51) Int. Cl.
*B60Q 3/80* (2017.01)
*B60Q 3/56* (2017.01)
(Continued)

(52) U.S. Cl.
CPC ................. *B60Q 3/80* (2017.02); *B60Q 3/56* (2017.02); *B60Q 3/66* (2017.02); *F21V 23/005* (2013.01);
(Continued)

(58) Field of Classification Search
None
See application file for complete search history.

(56) References Cited

U.S. PATENT DOCUMENTS 2,347,665 A 5/1944 Bandy et al.
4,293,987 A 10/1981 Gottbreht, et al.
(Continued)

FOREIGN PATENT DOCUMENTS

JP 2009158260 7/2009
JP 2012084316 4/2012
(Continued)

OTHER PUBLICATIONS

US 10,580,824 B2, 03/2020, Diana et al. (withdrawn)
(Continued)

*Primary Examiner* — Dedei K Hammond
(74) *Attorney, Agent, or Firm* — Schwgman Lundberg & Woessner, P.A.

(57) ABSTRACT

An apparatus and system are disclosed and include a vehicle interior lighting system comprising that includes a light engine with a plurality of independently addressable light emitting diode (LED) segments, each independently addressable LED segment including at least one LED, a flexible printed circuit board (PCB) having a base and plurality of legs extending from the base, each leg supporting an independently addressable LED segment, and a light guide plate configured to provide illumination from the plurality of independently addressable LED segments inside the vehicle. A processor may be configured to receive information from a o vehicle sensing system, a vehicle communication system, or a detection system, and may generate a signal. A controller may be configured to provide one or more light control signals to modify at least one light
(Continued)

characteristic of at least one of the plurality of independently addressable LED segments based on the signal.

20 Claims, 55 Drawing Sheets

Related U.S. Application Data

(60) Provisional application No. 62/667,180, filed on May 4, 2018.

(51) Int. Cl.
  *H05K 1/18* (2006.01)
  *F21V 23/00* (2015.01)
  *B60Q 3/66* (2017.01)
  *F21Y 115/10* (2016.01)

(52) U.S. Cl.
  CPC ......... *H05K 1/189* (2013.01); *B60Q 2900/30* (2013.01); *F21V 2200/20* (2015.01); *F21Y 2115/10* (2016.08); *H05K 2201/10106* (2013.01)

(56) References Cited

U.S. PATENT DOCUMENTS

| | | |
|---|---|---|
| 5,555,160 A | 9/1996 | Tawara et al. |
| 5,890,794 A | 4/1999 | Abtahi et al. |
| 6,053,621 A | 4/2000 | Yoneda |
| 7,333,344 B2 | 2/2008 | Huang |
| 7,696,441 B2 | 4/2010 | Kataoka |
| 8,011,818 B2 | 9/2011 | Negley |
| 8,434,913 B2 | 5/2013 | Vissenberg |
| 8,545,056 B2 | 10/2013 | Kajiya et al. |
| 8,702,295 B2 | 4/2014 | Lin et al. |
| 9,004,722 B2 | 4/2015 | Sampsell et al. |
| 9,374,869 B1 | 6/2016 | Wright et al. |
| 9,395,074 B2 | 7/2016 | Hussell et al. |
| 9,482,416 B2 | 11/2016 | Narag et al. |
| 9,618,678 B1 | 4/2017 | Tickner et al. |
| 9,857,520 B2 | 1/2018 | Parker et al. |
| 9,989,195 B2 | 6/2018 | Marinus et al. |
| 10,362,679 B2 | 7/2019 | Gielen |
| 10,416,377 B2 | 9/2019 | Girotto et al. |
| 10,622,405 B2 | 4/2020 | Diana et al. |
| 2002/0172039 A1 | 11/2002 | Lee et al. |
| 2005/0174769 A1 | 8/2005 | Yong et al. |
| 2005/0207152 A1* | 9/2005 | Maxik ............... F21K 9/232 362/231 |
| 2006/0193130 A1 | 8/2006 | Ishibashi |
| 2009/0073689 A1 | 3/2009 | Patrick |
| 2009/0086480 A1 | 4/2009 | Chen |
| 2009/0262530 A1 | 10/2009 | Tickner et al. |
| 2010/0277904 A1 | 11/2010 | Hanley et al. |
| 2011/0298371 A1 | 12/2011 | Brandes et al. |
| 2011/0310605 A1 | 12/2011 | Renn et al. |
| 2012/0014128 A1 | 1/2012 | Lin |
| 2012/0139425 A1 | 6/2012 | Kim |
| 2013/0021811 A1 | 1/2013 | Goldwater |
| 2013/0235578 A1 | 9/2013 | Hsieh et al. |
| 2013/0240920 A1 | 9/2013 | Chen, et al. |
| 2013/0271981 A1 | 10/2013 | Lopez et al. |
| 2013/0279175 A1 | 10/2013 | Hussell et al. |
| 2013/0294092 A1 | 11/2013 | Hussell et al. |
| 2014/0036497 A1 | 2/2014 | Hussell et al. |
| 2014/0146536 A1 | 5/2014 | Li |
| 2014/0226330 A1 | 8/2014 | Yun |
| 2014/0240990 A1* | 8/2014 | Bae .................... F21V 29/70 362/294 |
| 2014/0300274 A1 | 10/2014 | Acatrinei |
| 2015/0260352 A1 | 9/2015 | Bhattarai et al. |
| 2015/0260353 A1 | 9/2015 | Bhattarai et al. |
| 2015/0377421 A1 | 12/2015 | Chen |
| 2017/0322364 A1 | 11/2017 | Girotto et al. |
| 2018/0168047 A1 | 6/2018 | Van Uden, et al. |
| 2018/0372276 A1 | 12/2018 | Su et al. |
| 2019/0016254 A1* | 1/2019 | Salter ..................... B60Q 1/18 |
| 2019/0339441 A1 | 11/2019 | Diana et al. |
| 2019/0341421 A1 | 11/2019 | Diana et al. |
| 2019/0341422 A1 | 11/2019 | Diana et al. |
| 2019/0341423 A1 | 11/2019 | Diana et al. |
| 2019/0342963 A1 | 11/2019 | Diana et al. |
| 2019/0342975 A1 | 11/2019 | Diana et al. |
| 2019/0377128 A1 | 12/2019 | Diana et al. |

FOREIGN PATENT DOCUMENTS

| | | |
|---|---|---|
| KR | 1020100003326 | 1/2010 |
| KR | 20100003326 | 3/2010 |
| WO | 2014179519 | 11/2014 |
| WO | 2019213634 | 11/2019 |
| WO | 2019213635 | 11/2019 |
| WO | 2019213636 | 11/2019 |
| WO | 2019213637 | 11/2019 |
| WO | 2019213638 | 11/2019 |

OTHER PUBLICATIONS

"U.S. Appl. No. 16/014,734, Final Office Action dated Nov. 15, 2019", 9 pgs.
"Taiwanese Application Serial No. 108115638, Office Action dated Nov. 27, 2019", 3 pgs.
"U.S. Appl. No. 16/014,734, Non Final Office Action dated May 17, 2019", 10 pgs.
"International Application Serial No. PCT US2019 030761, International Search Report dated Jun. 25, 2019", 4 pgs.
"International Application Serial No. PCT US2019 030761, Written Opinion dated Jun. 25, 2019", 8 pgs.
"International Application Serial No. PCT US2019 030762, International Search Report dated Jun. 28, 2019", 4 pgs.
"International Application Serial No. PCT US2019 030762, Written Opinion dated Jun. 28, 2019", 8 pgs.
"International Application Serial No. PCT US2019 030763, International Search Report dated Jun. 25, 2019", 5 pgs.
"International Application Serial No. PCT US2019 030763, Written Opinion dated Jun. 25, 2019", 10 pgs.
"International Application Serial No. PCT US2019 030759, International Search Report dated Jun. 28, 2019", 3 pgs.
"International Application Serial No. PCT US2019 030759, Written Opinion dated Jun. 28, 2019", 8 pgs.
"International Application Serial No. PCT US2019 030764, International Search Report dated Jul. 3, 2019", 4 pgs.
"International Application Serial No. PCT US2019 030764, Written Opinion dated Jul. 3, 2019", 6 pgs.
"U.S. Appl. No. 16/014,734, Response filed Aug. 16, 2019 to Non-Final Office Action dated May 17, 2019", 11 pgs.
"U.S. Appl. No. 16/403,456, Notice of Allowance dated Oct. 24, 2019", 11 pgs.
"U.S. Appl. No. 16/014,734, Notice of Allowance dated Feb. 4, 2020", 9 pgs.
"U.S. Appl. No. 16/014,734, Response filed Jan. 15, 2020 to Final Office Action dated Nov. 15, 2019", 9 pgs.
"U.S. Appl. No. 16/403,452, Non Final Office Action dated Apr. 17, 2020", 17 pgs.
"U.S. Appl. No. 16/403,455, Notice of Allowance dated Apr. 7, 2020", 10 pgs.
"U.S. Appl. No. 16/403,456, Corrected Notice of Allowability dated Mar. 6, 2020", 2 pgs.
"U.S. Appl. No. 16/403,457, Non Final Office Action dated Jan. 30, 2020", 26 pgs.
"U.S. Appl. No. 16/403,457, Response filed Apr. 29, 2020 to Non Final Office Action dated Jan. 30, 2020", 13 pgs.
"U.S. Appl. No. 16/403,478, Non Final Office Action dated Feb. 26, 2020", 12 pgs.
"U.S. Appl. No. 16/403,485, Non Final Office Action dated Feb. 7, 2020", 12 pgs.

(56) References Cited

OTHER PUBLICATIONS

"U.S. Appl. No. 16/786,836, Preliminary Amendment filed Mar. 5, 2020", 8 pgs.

"Taiwanese Application Serial No. 108115638, Response filed Dec. 27, 2019 to Office Action dated Nov. 27, 2019", w/ Translation, 57 pgs.

U.S. Appl. No. 16/403,485, filed May 3, 2019, Light Engines With Dynamically Controllable Light Distribution.

"U.S. Appl. No. 16/403,457, Final Office Action dated May 21, 2020", 20 pgs.

"U.S. Appl. No. 16/403,478, Response filed May 26, 2020 to Non-Final Office Action dated Feb. 26, 2020", 12 pgs.

"U.S. Appl. No. 16/403,485, Response filed May 7, 2020 to Non Final Office Action dated Feb. 7, 2020", 14 pgs.

"U.S. Appl. No. 16/014,734, Notice of Allowance dated May 13, 2020", 9 pgs.

* cited by examiner

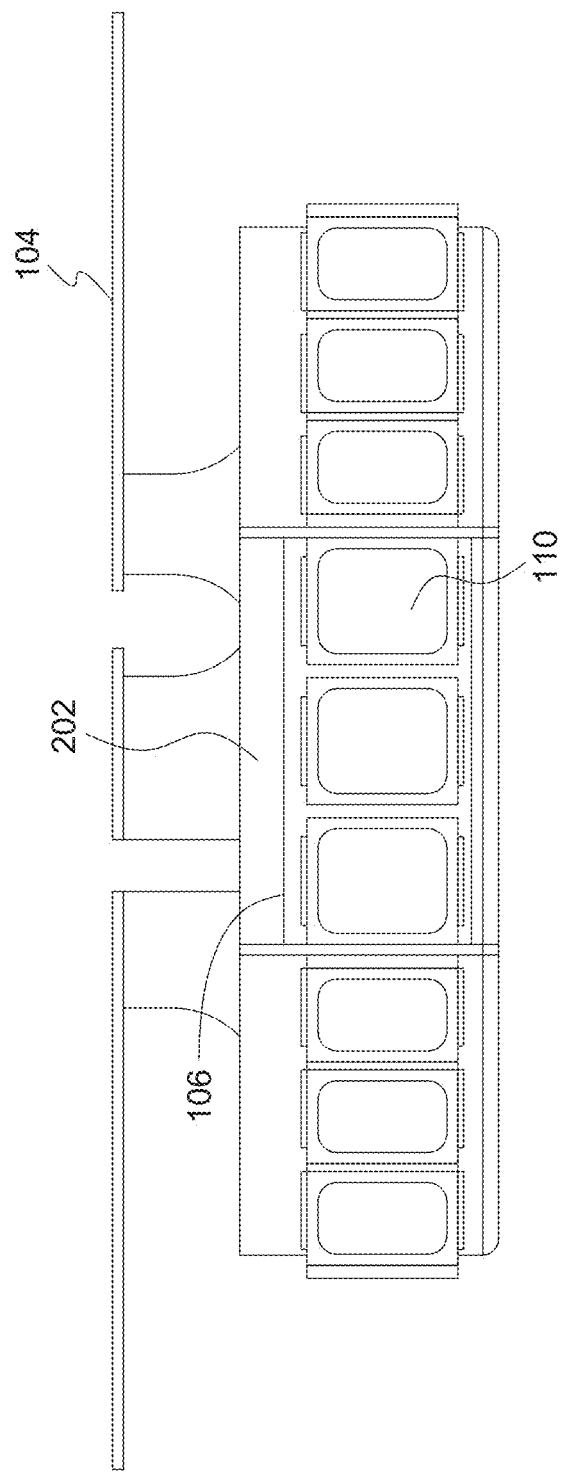

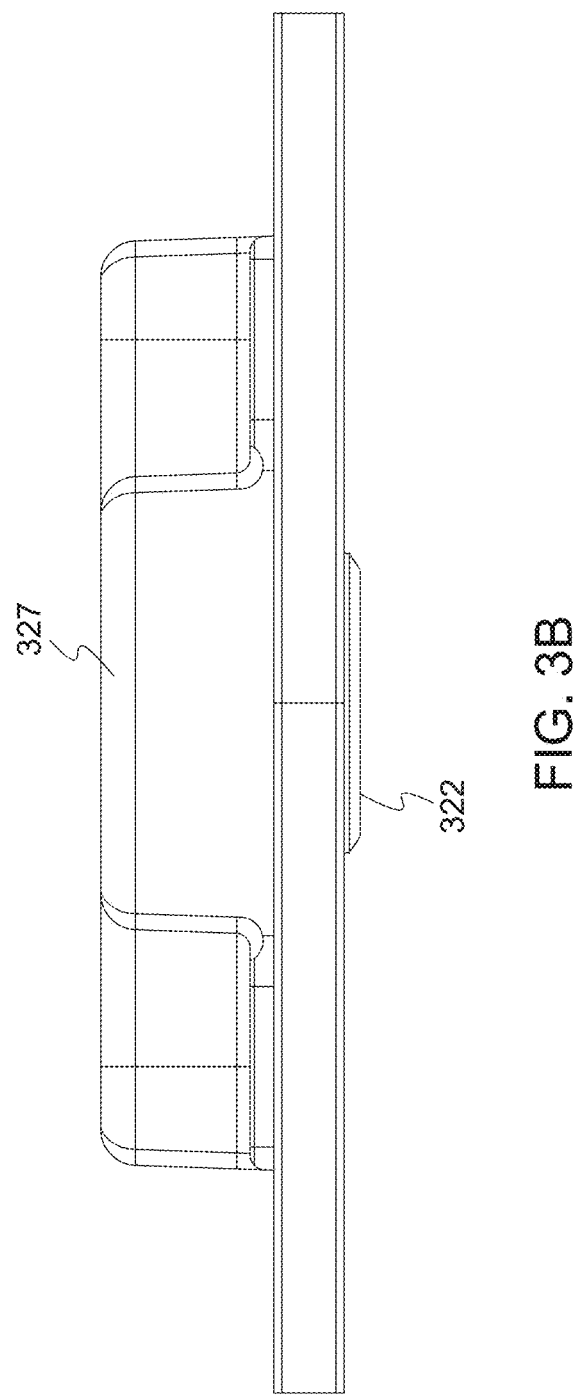

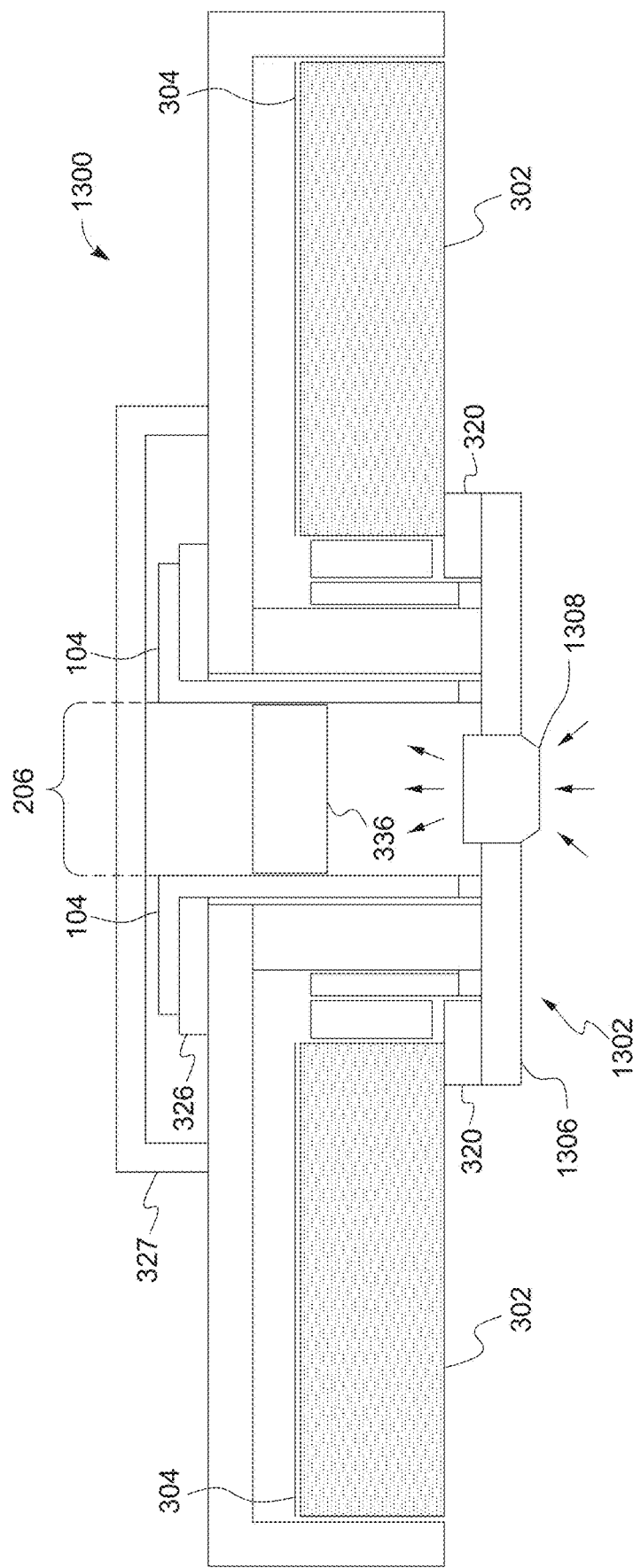

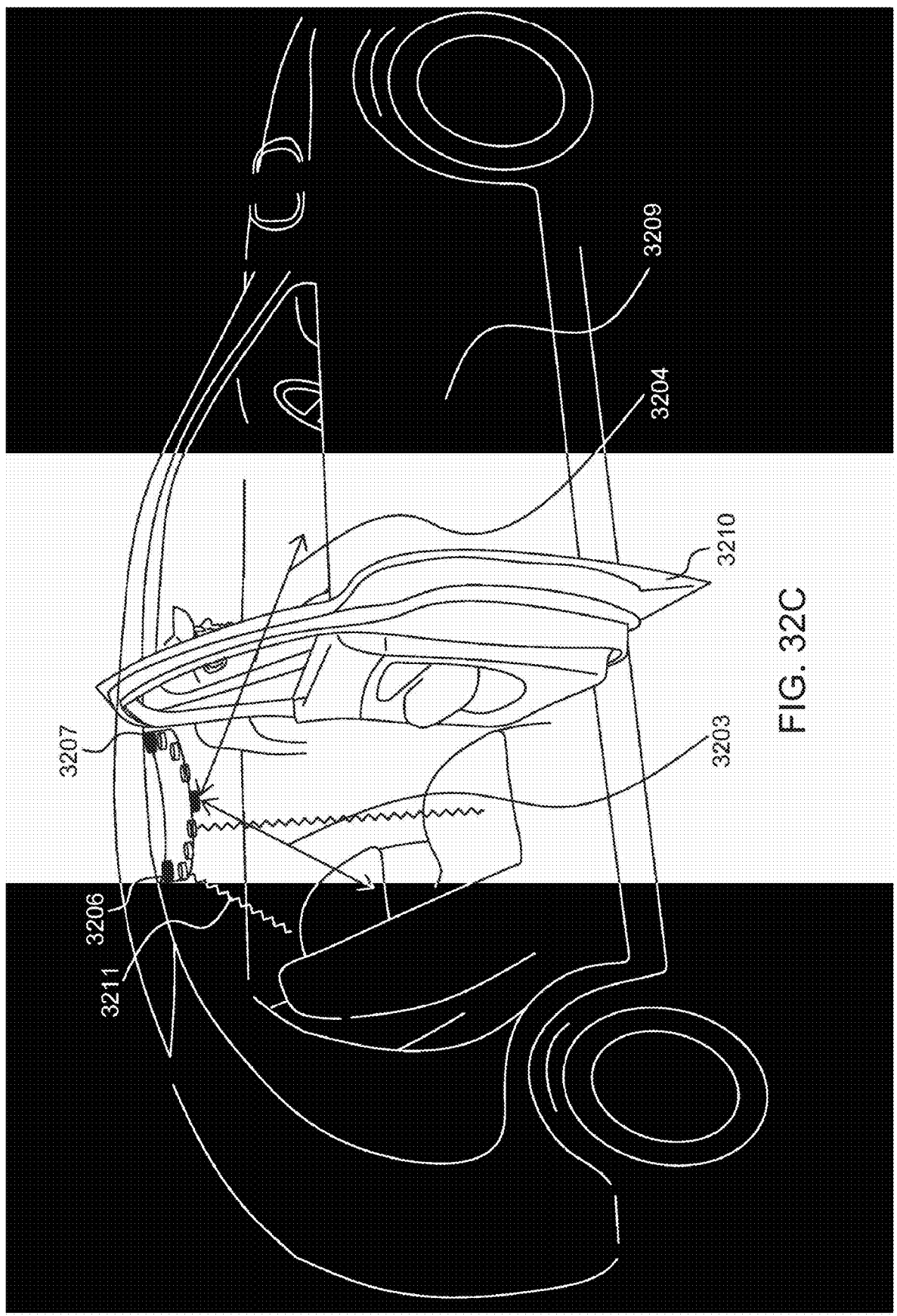

LIGHT ENGINES WITH DYNAMICALLY CONTROLLABLE LIGHT DISTRIBUTION

PRIORITY CLAIM

This application claims the benefit of U.S. Provisional Application Ser. No. 62/667,180, filed May 4, 2018, U.S. application Ser. No. 16/014,734, filed Jun. 21, 2018, and EP Application Serial No. 18186073.5 filed, Jul. 27, 2018, each of which is incorporated by reference as if fully set forth.

BACKGROUND

According to aspects of the disclosure, a vehicle interior lighting system may include a light engine. The light engine may include a plurality of independently addressable light emitting diode (LED) segments each with at least one LED. The light engine may also include a flexible printed circuit board (PCB) that has a base and plurality of legs extending from the base, each leg supporting an independently addressable LED segment. The light engine may also include light guide plate with an inner surface configured to receive light from the plurality of independently addressable LED segments, and extending outward from the plurality of independently addressable LED segments. The light guide plate may be configured to provide illumination from the plurality of independently addressable LED segments inside the vehicle. A processor may be configured to receive information from a vehicle sensing system, a vehicle communication system, and/or a detection system, and generate a signal. A controller may be electrically coupled to one or more legs of the flexible PCBs, and may be configured to provide one or more light control signals to modify at least one light characteristic of at least one of the plurality of independently addressable LED segments based on the signal.

The vehicle sensing system, vehicle communication system, and/or detector may dynamically provide updated information such that at least one light characteristic is updated based on the change in an object, event, or an action.

BRIEF DESCRIPTION OF THE DRAWINGS

The drawings described below are for illustration purposes only. The drawings are not intended to limit the scope of the present disclosure. Like reference characters shown in the figures designate the same parts in the various embodiments.

FIG. 2C is a side view of the illumination source of FIG. 2A, according to aspects of the disclosure;

FIG. 3B is a side view of the combined light fixture of FIG. 3A, according to aspects of the disclosure;

FIG. 13A is a cross-sectional side view of yet another example of a light fixture, according to aspects of the disclosure;

FIG. 32C is another cross-sectional view of a light engine with dynamically controllable LED segments to illuminate the interior of a vehicle, according to aspects of the disclosure;

DETAILED DESCRIPTION

Figure 1A:
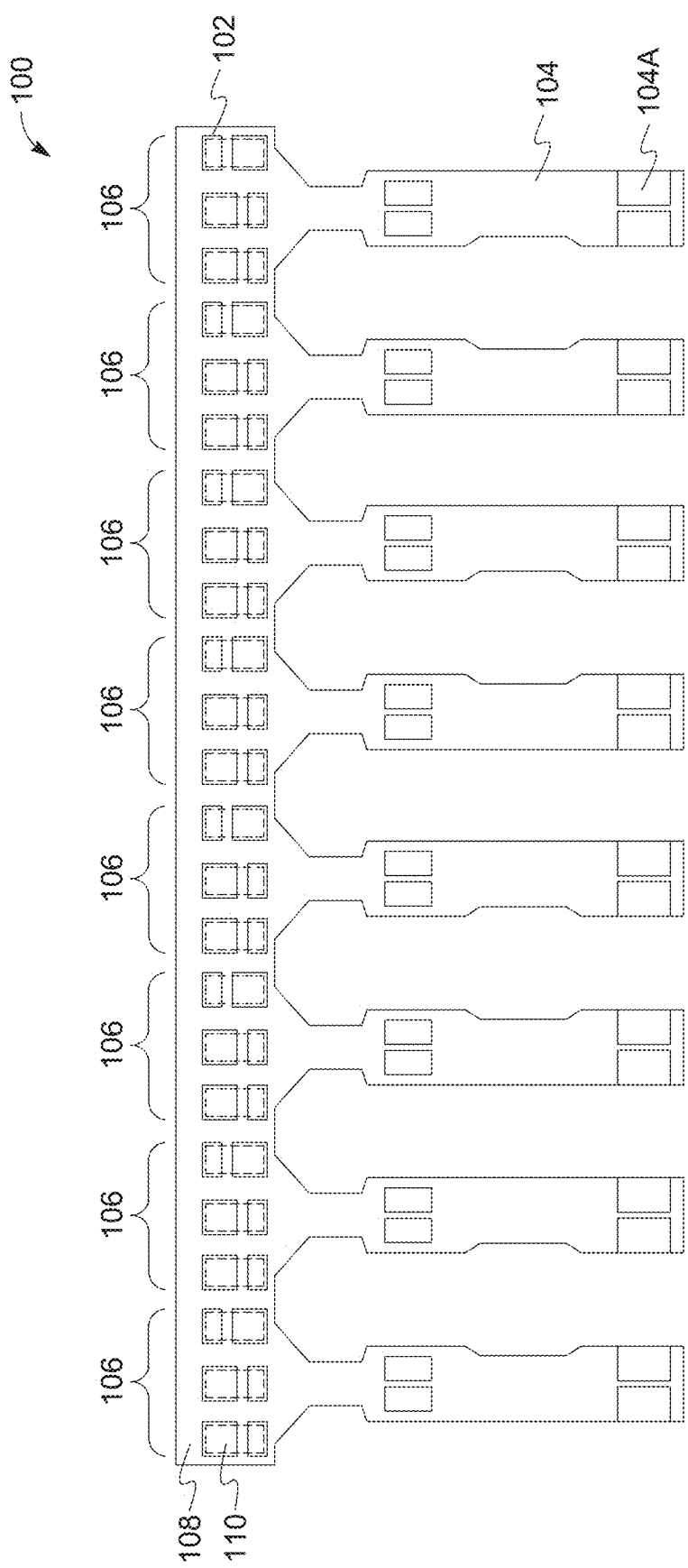
FIG. 1A is a diagram of an example of a flexible printed circuit board, according to aspects of the disclosure.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

According to aspects of the disclosure, a flexible printed circuit board, method of fabricating the flexible printed circuit board, illumination device (or light fixture) using of the flexible printed circuit board, electronics of the illumination device, and method of using the flexible printed circuit board to control illumination device, among others, are described. For example, in some embodiments, the flexible printed circuit board contains a substantially rectangular body having a plurality of segments. At least one of the segments has a body contact to which an illumination source, such as an LED, or set of illumination sources (also referred to as a bank of illumination sources) is attached. In some instances, at least one of the segments may have multiple body contacts. One or more flexible legs extend substantially perpendicularly from the body, such as one flexible leg for each segment. Each flexible leg contains at least one pair of leg contacts disposed proximate to a distal end of the leg from the body. The flexible printed circuit board is formed from a multilayer structure that comprises an adhesive layer configured to adhere the structure to a material contacting the adhesive layer, at least one pair of dielectric and metal layers, with one of the dielectric layers adjacent to the adhesive layer. Exposed portions of the metal layer through the dielectric layer form the leg contacts, and exposed portions of the metal layer through an overlying solder mask layer form the pair of body contacts.

The flexible printed board may be incorporated in a light fixture. The light fixture may include a light guide having an interior opening that defines an interior edge of the light guide. The light guide may be planar, and thus be formed as a light guide plate. An illumination source is inserted in the interior opening and may include a plurality of LEDs that are arranged to inject light into the light guide through the interior edge of the light guide. The LEDs may be arranged around the circumference of a base that is part of the illumination source. According to an implementation, the base may be thermally conductive. According to an implementation, the base may be coupled to a heat-dissipating element that is disposed over the light guide. The heat-dissipating element may be arranged to receive heat generated by the LEDs via the thermally conductive base and dissipate the received heat.

Various types of light guides can be used to address different types of applications. Flat light guide panels may be used to cover applications ranging from intermediate batwings (typically ~45-60 degree beam angle) to concentrated lambertians for some outdoor (parking garages) and indoor (downlights) applications. Flat+chamfered outer edge light guide panels may be used for similar applications, but with higher efficiency targets and less cost constrained, can be used too. This geometry can also be used for spots applications. Wedge light guide panels may be used for applications demanding batwing light distributions with high beam angles (>60 degrees) and high optical efficiency, such as for bollards or street lighting. The light guide panel may have a main flat surface facing the backside of the light engine to achieve good mechanical support and rigidity. The flat surface (or both surfaces in some cases) can include additional light extracting elements (such as ink dot patterns or 3D textures or also the electrically-controllable inks already proposed in a previous ID) to provide increased performance for light output, or added dynamic control of light distributions, or simply for light extraction from the flat light guide panels or for additional emitting surface uniformity purpose. The center hole from which light is injected can also be shaped circularly or be multifaceted (octagon for instance to match the number of LEDs or angular segments) to tune the light distribution as well. Planar facets allow to generate more concentrated beams in the horizontal planes. The outer light guide panel edge can also include a reflective layer (white or mirror tape, or white glue, or clear glue+ white reflective or mirror film) to recycle the light that otherwise would escape and likely get absorbed in the housing.

Examples of different light fixtures are described more fully hereinafter with reference to the accompanying drawings. These examples are not mutually exclusive, and features found in one example can be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

FIGS. 1A-1F are diagrams of an example of a flexible printed circuit board, according to aspects of the disclosure. In particular, FIG. 1A is a top view of the flexible printed circuit board 100. The flexible printed circuit board 100 may include a body 108 and one or more legs 104. As shown, the flexible printed circuit board 100 contains multiple legs 104. The body 108 may be substantially rectangular and the legs 104 may extend substantially perpendicularly from the body 108.

The body 108 may include one or more segments 106 associated with a set of pairs of body contacts 102. Each pair of body contacts 102 may be used to provide electrical connection to a different illumination source 110 mounted thereon (or otherwise attached thereto). Each set of pairs of body contacts 102 may include a single pair of body contacts 102 or multiple pairs of body contacts 102. Different segments 106 may contain the same number of pairs of body contacts 102, as shown, or one or more of the segments 106 may contain a different number of pairs of body contacts 102 from at least one other segment 106.

The set of illumination sources 110 within a particular segment 106 may be the same color or one or more of the illumination sources 110 within the segment 106 may be different colors. Similarly, in some embodiments, each segment 106 may contain a set of illumination sources 110 having the same color or set of colors. In other embodiments, one or more of the colors may be different in different segments 106. In some embodiments, each set of illumination sources 110 (the illumination sources 110 of a segment 106) may be independently controllable. In further embodiments, each illumination source 110 within the set of illumination sources 110 may be independently controllable via the body contacts 102 connected to each illumination source 110. In some embodiments, one or more of the segments 106 may not contain any illumination sources 110.

As shown in FIG. 1A, each of the legs 104 may include one or more electrical connections, shown as leg contacts 104*a*, that are disposed at a distal end thereof. The leg contacts 104*a* of each leg are used to control the set of illumination sources 110 in a different one of the segments 106. Thus, in the embodiment shown in FIG. 1A, multiple illumination sources 110 of a particular segment 106 are controlled by a single pair of leg contacts 104*a* associated with the segment 106. As shown, test contacts on each leg 104 may be disposed between the body 108 and the leg contacts 104*a*. The test contacts may be used during testing of the flexible printed circuit board 100, either to test the connectivity between the leg contacts 104*a* and the body contacts 102 or connectivity to the set of illumination sources 110.

To control the illumination sources 110, each leg 104 may include one or more electrical connections and/or wiring to activate/deactivate one or more of the illumination sources 110 in the associated segment 106, change the brightness of one or more of the illumination sources 110 in the associated segment 106, change the color of light output of in the associated segment 106, and/or control other characteristics of the operation of the one or more of the illumination sources 110 in the associated segment 106. The set of illumination sources 110 in each segment 106 may be connected to one another in series, in parallel, and/or in any other suitable way. As above, the set of illumination sources 110 in each segment 106 may be configured to output the same color of light or different colors of light such as, for example, red, green, and blue. Additionally or alternatively, the set of illumination sources 110 in each of the segments 106 may output light having the same correlated color temperature (CCT). Additionally or alternatively, the light outputs of at least two of the illumination sources 110 in a segment 106 may have different CCTs.

Figure 1B:
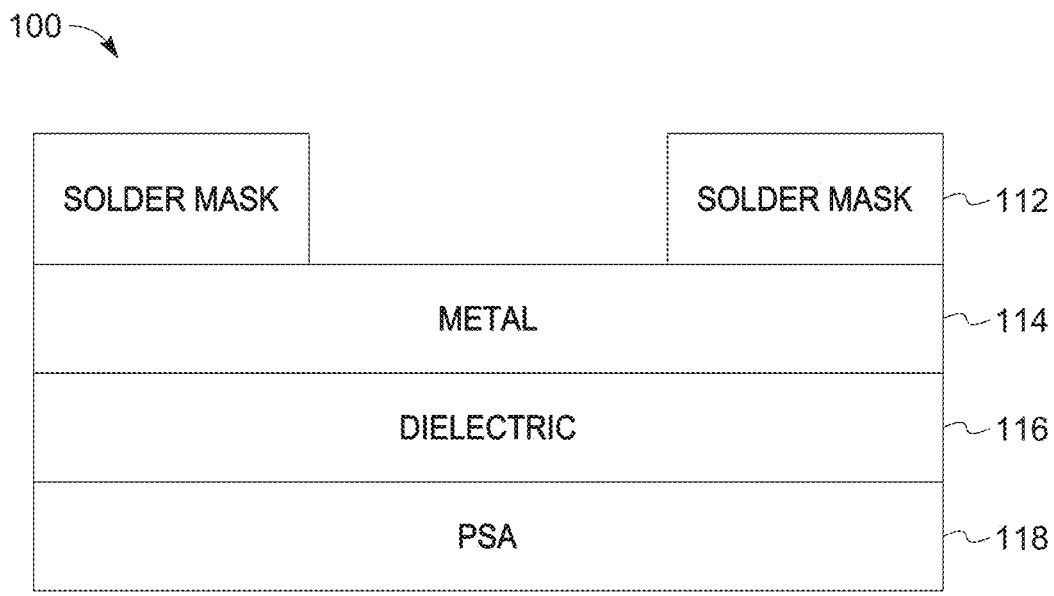
FIG. 1B is a cross-sectional view of the flexible printed circuit board of FIG. 1A, according to aspects of the disclosure.
Figure 1C:
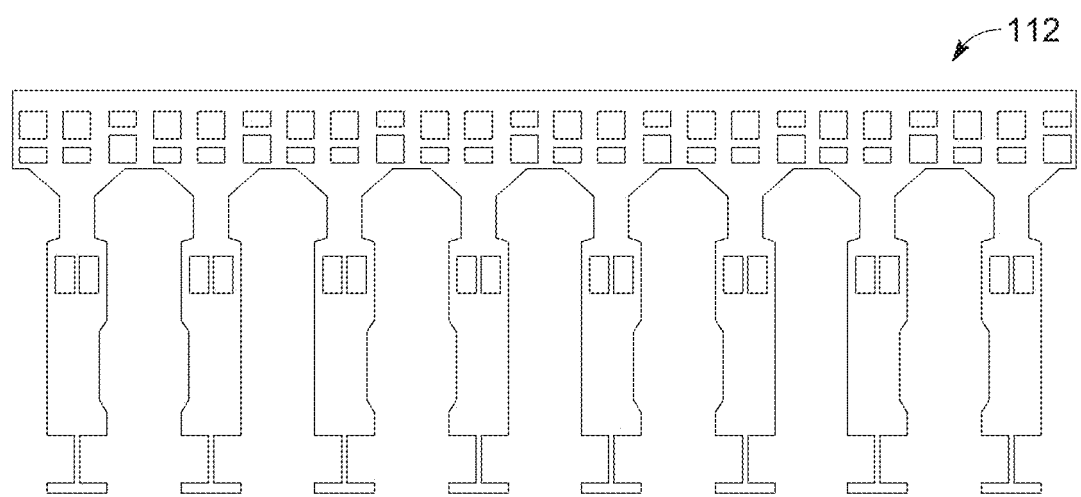
FIG. 1C is a planar top-down view of a solder mask layer of the flexible printed circuit board of FIG. 1A, according to aspects of the disclosure.
Figure 1D:
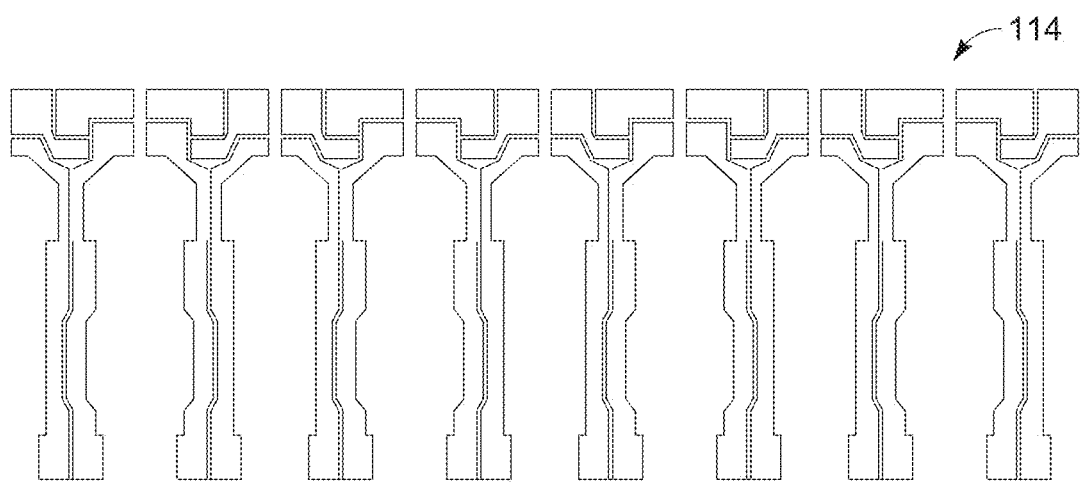
FIG. 1D is a planar top-down view of a metal layer of the flexible printed circuit board of FIG. 1A, according to aspects of the disclosure.
Figure 1E:
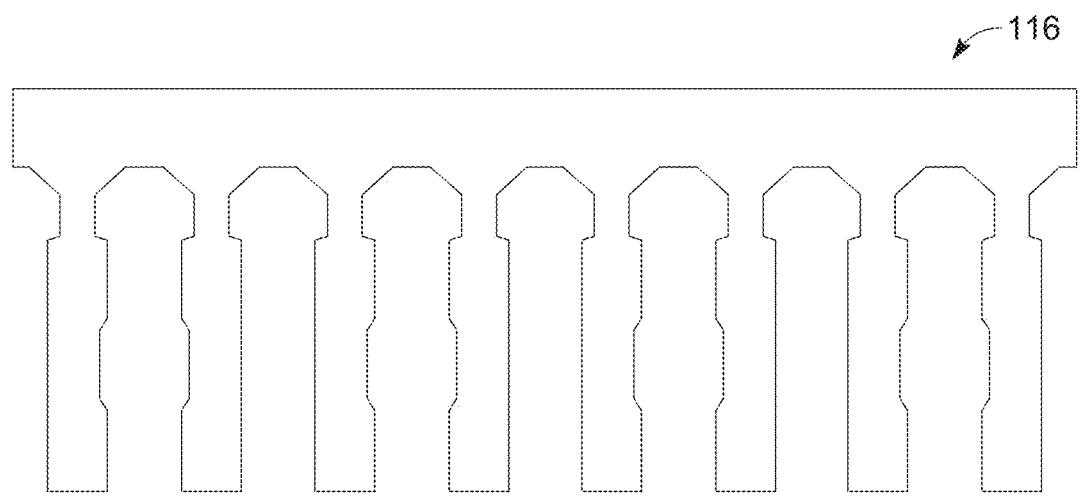
FIG. 1E is a planar top-down view of a dielectric layer of the flexible printed circuit board of FIG. 1A, according to aspects of the disclosure.
Figure 1F:
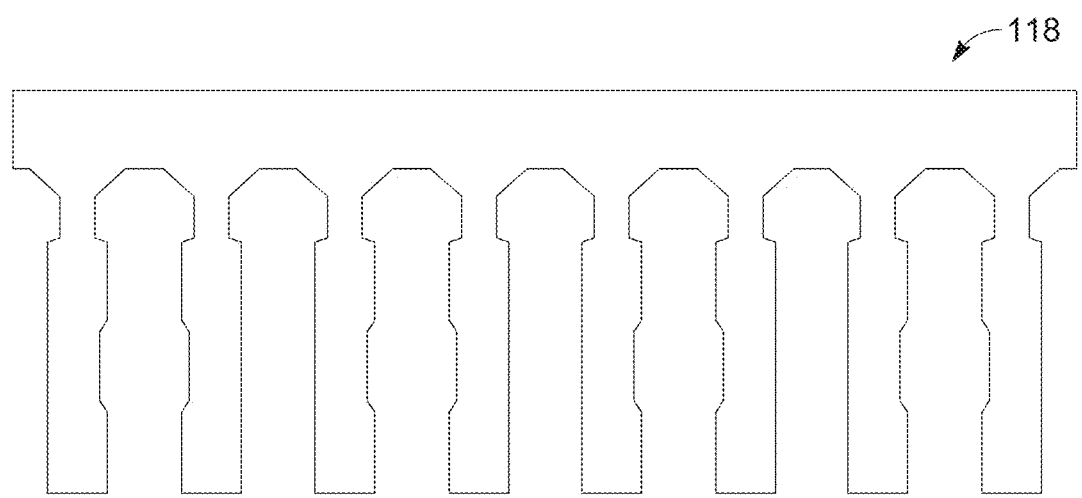
FIG. 1F is a planar top-down view of an adhesive layer of the flexible printed circuit board of FIG. 1A, according to aspects of the disclosure.
Figure 1G:
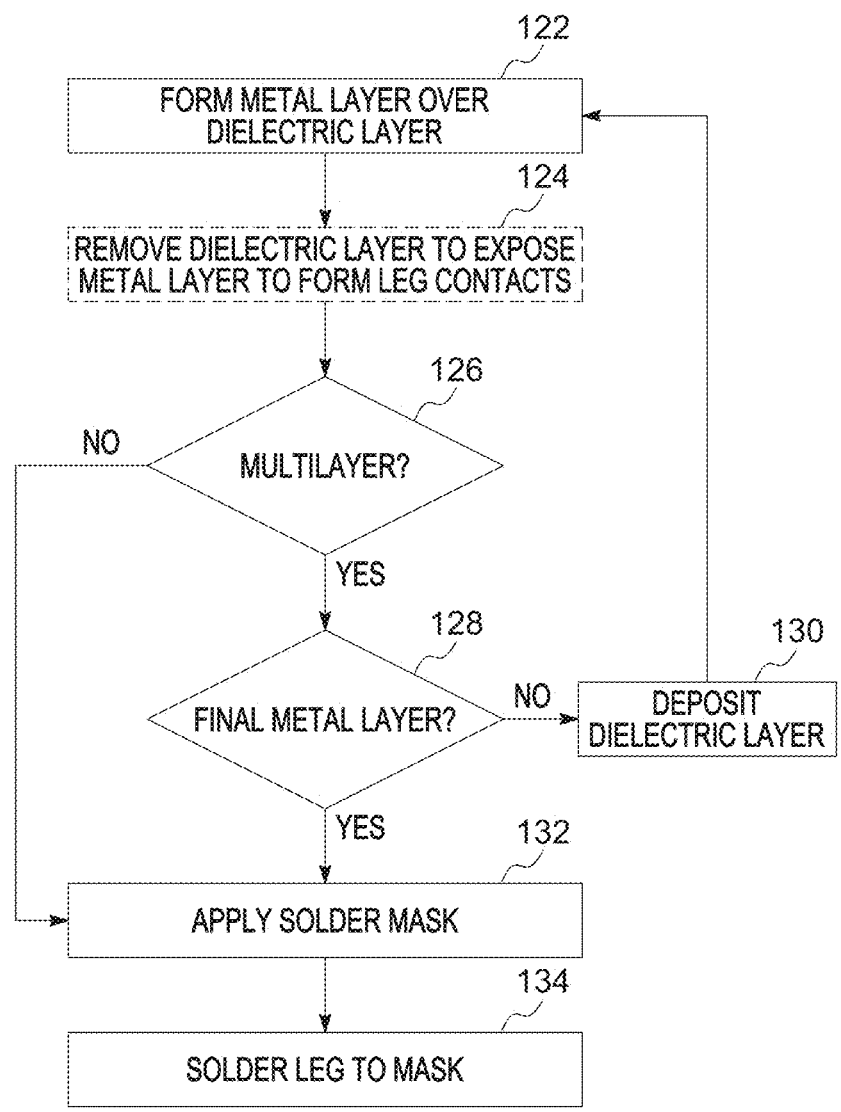
FIG. 1G is a flowchart of a method of fabricating the flexible printed circuit board of FIG. 1A, according to aspects of the disclosure.

FIG. 1B is a cross-sectional view of the flexible printed circuit board of FIG. 1A, according to aspects of the disclosure, while FIG. 1G is a flowchart of a method of fabricating the flexible printed circuit board of FIG. 1A, according to aspects of the disclosure. The flexible printed circuit board 100 may be a multilayer structure that contains at least one pair of metal and dielectric layers 114, 116 and a solder mask 112 on a topmost metal layer 114. A pressure-sensitive adhesive (PSA) 118 may be attached to the underside of a portion of the dielectric layer 116. The PSA 118 is a non reactive adhesive that forms a bond when pressure is applied without the use of a solvent, water, or heat. The PSA 118 may be between about 50 μm and 1 mm, but is typically around 100 μm.

The dielectric layer 116 may be formed from polyimide, or any other suitable insulating material that is sufficiently flexible when of the desired thickness. The dielectric layer 116 may be between about 25 μm and 100 μm, sufficient to support the metal layer 114. As shown in FIG. 1G, the metal layer 114 may be formed on the dielectric layer 116 at operation 122. In different embodiments, the metal layer 114 may be deposited or plated on the dielectric layer 116. The metal layer 114 may be formed from copper, or any other suitable conductive material. The metal layer 114 may be between about 17.5 μm and 100 μm, nominally 70 μm or so.

In some embodiments, after formation of the metal layer 114 on the dielectric layer 116, leg contacts may be formed at operation 124. In some embodiments, portions of the dielectric layer 116 may be removed by etching or other chemical or mechanical process to permit contact to the metal layer 114 at the appropriate location. In other embodiments, the portions of the dielectric layer 116 may not be removed. If a multilayer structure is used (operation 126) and the metal layer is not the final metal layer (operation 128), a new dielectric layer may be deposited or otherwise formed on underlying the metal layer at operation 130. The process may then return to operation 122.

If a multilayer structure is not used (operation 126) or the metal layer is the final metal layer (operation 128), the solder mask 112 may be deposited on the topmost metal layer 114 at operation 132. The solder mask 112 may be between about 25 μm and 50 μm. The solder mask 112, when applied, may have openings to expose portions of the topmost metal layer 114 to form the body contacts. The solder mask 112 may also have openings to expose portions of the topmost metal layer 114 to form the leg contacts, if not formed in the dielectric layer 116. In other embodiments, the openings in the solder mask 112 may be formed after application of the solder mask 112. The LEDs or other illumination sources may then be soldered or affixed to the solder mask 112. The PSA 118 may be applied at any point during the process shown in FIG. 1G, such as before the illumination sources are attached or before the solder mask is applied. The PSA 118 may be applied to areas to which the multilayer structure is attached, or at least areas other than the leg contacts.

FIG. 1C is a planar top-down view of a solder mask layer of the flexible printed circuit board of FIG. 1A, according to aspects of the disclosure. As shown in FIG. 1C, the solder mask 112 has openings for both the body and leg contacts.

FIG. 1D is a planar top-down view of a metal layer of the flexible printed circuit board of FIG. 1A, according to aspects of the disclosure. As above, the metal layer 114 may be formed from copper, or any other suitable conductive material. As shown, the metal layer 114 is split into individual connections. The portion of the metal layer 114 corresponding to the leg 104 is split into two sections, each connected to a different body contact 102 of the body 108. The portion of the metal layer 114 corresponding to the body 108 is further split into multiple sections. Each section of the metal layer 114 is electrically isolated from each other section of the metal layer 114. The sections as shown in FIG. 1D are configured such that the set of illumination sources 110 in a segment 106 are series connected, with one of the pairs of body contacts 102 being electrically connected to another of the pairs of body contacts 102. In other embodiments, however, one or more of the illumination sources 110 in the set of illumination sources 110 may be independently addressable using the metal layer 114 via additional sections of the metal layer 114 or using a different (underlying) metal layer.

FIG. 1E is a planar top-down view of a dielectric layer of the flexible printed circuit board of FIG. 1A, according to aspects of the disclosure. The dielectric layer 116 may, as above, be formed from polyimide. FIG. 1F is a planar top-down view of an adhesive layer of the flexible printed circuit board of FIG. 1A, according to aspects of the disclosure. As above, portions of the PSA 118 may be removed prior to adhesion to the dielectric layer 116 and/or surface to which the structure is attached. Although multiple pairs of body contacts are described as being associated with a single pair of leg contacts, multiple pairs of leg contacts may be used, e.g., one pair for each color LED if multiple LED colors are present within the LED segment. In addition, although pairs of contacts are described, in some embodiments, more than two contacts may be used (e.g., the LED or other illumination source may use more than two contacts).

Figure 2A:
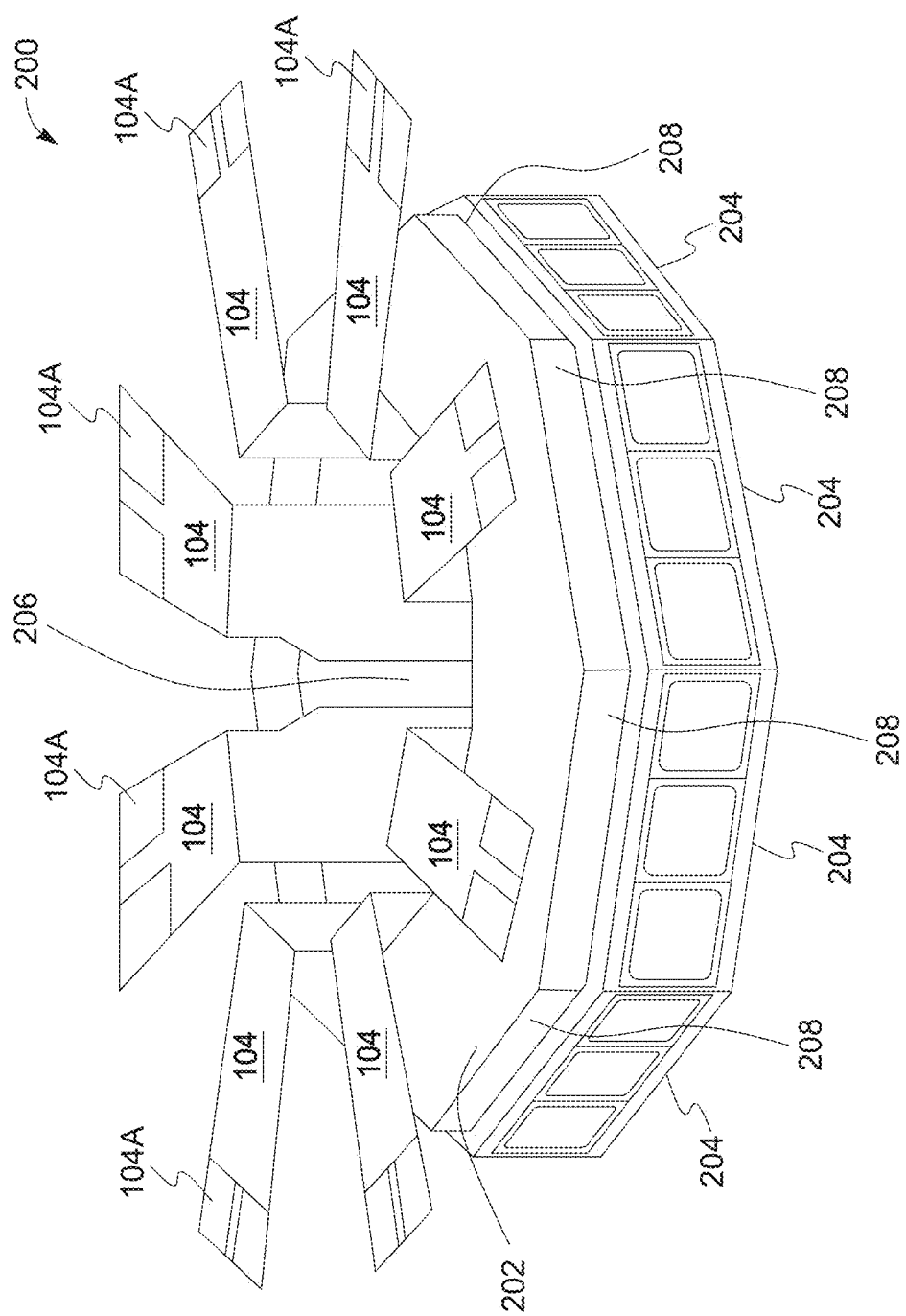
FIG. 2A is a perspective view of an example of an illumination source utilizing the flexible printed circuit board of FIG. 1, according to aspects of the disclosure.
Figure 2B:
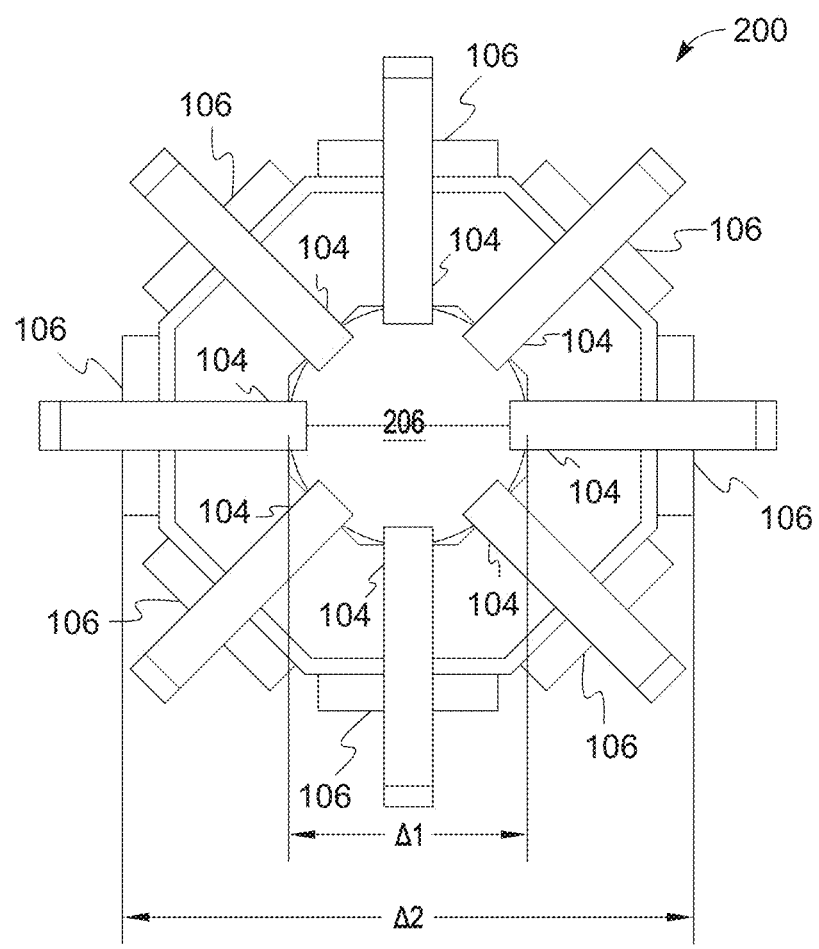
FIG. 2B is a planar top-down view of the illumination source of FIG. 2A, according to aspects of the disclosure.
Figure 2D:
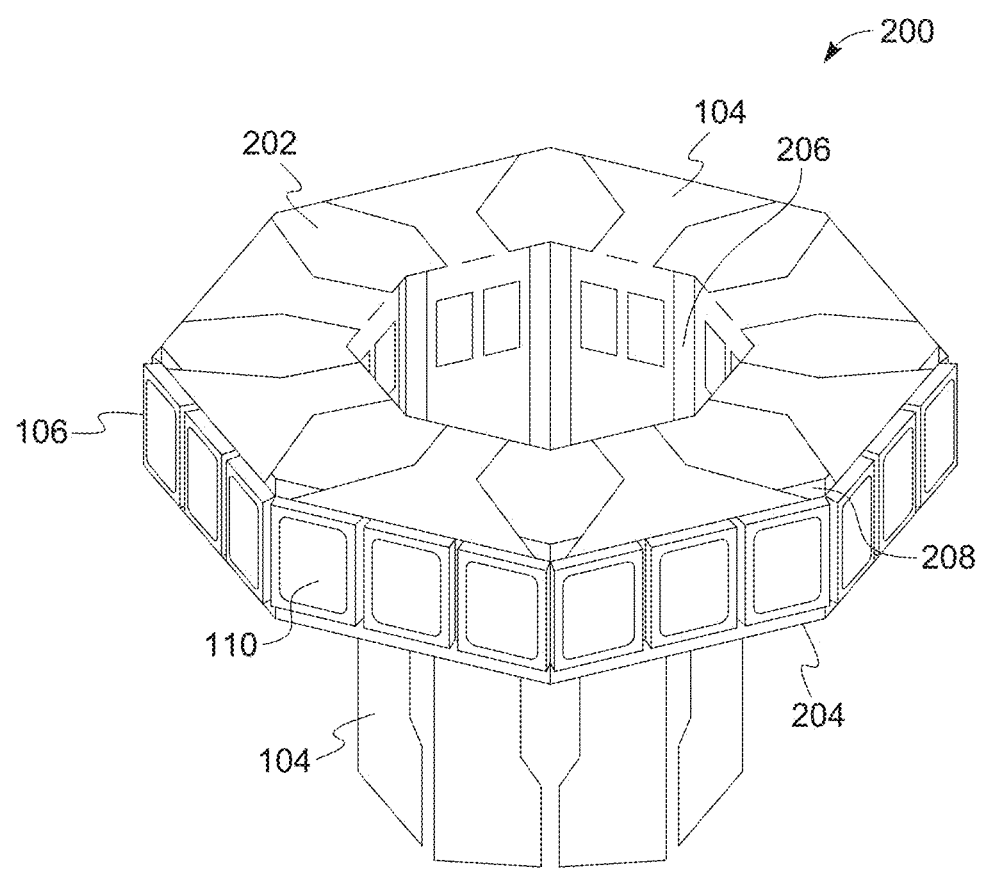
FIG. 2D is a perspective bottom-up view of the illumination source of FIG. 2A, according to aspects of the disclosure.

FIGS. 2A-D show diagrams of an example illumination source according to aspects of the disclosure. In particular, FIG. 2A is a perspective view of an example of an illumination source utilizing the flexible printed circuit board of FIG. 1, FIG. 2B is a planar top-down view of the illumination source of FIG. 2A, FIG. 2C is a side view of the illumination source of FIG. 2A and FIG. 2D is a perspective bottom-up view of the illumination source of FIG. 2A. The flexible printed circuit board 100 is shown in FIGS. 2A-2D, as is a base 202 (also referred to as a core) to which the flexible printed circuit board 100 is attached.

As shown in FIGS. 2A-2D, the base 202 contains multiple sides 208 and a opening or opening 206 in the center of the base 202 that extends between the top and bottom surfaces of the base 202. As shown, the base 202 may be formed in an octagonal shape, although in other embodiments, the base 202 may be formed in a hexagonal, pentagonal, square or triangular shape, among others. The base 202 may thus have a round cross-section or a cross-section that is shaped as another type of polygon (e.g., a rectangle, a hexagon, a decagon, etc.).

The legs 104 of flexible printed circuit board 100 may be routed around a bottom edge 204 of the base 202, along the bottom of the base 202, and into the opening 206 at the bottom of the base 202 as shown more clearly in FIG. 2D. In some embodiments, the legs 104 may extend into the opening 206 without coming out of the top of the base 202. As shown in the embodiment of FIG. 2D, the legs 104 extend entirely through the opening 206, to come out above the base 202. In some embodiments, the legs 104 may be attached to the inner sides of the opening 206 using the PSA, although in other embodiments, the legs 104 may not be attached to the inner sides of the opening 206. As shown in FIGS. 2A-2C, the legs 104 may be bent such that terminal portions of the legs 104 (which contain the leg contacts 104a) may be parallel to the top surface of the base 202. As shown, the bent portions of the legs 104 may extend from the edge of the opening 206 farther radially outward than the sides 208 of the base 202, or the set of illumination sources 102 of the segment 106. In other embodiments, the body 108 may be attached to the inner wall of the base 202. In this case, the legs 104 of flexible printed circuit board 100 may be bent to extend transverse to the outer wall of the base 202.

Although in the present example the base 202 includes one or more LEDs 102 on each of its sides 208, alternative implementations are possible in which at least one of the sides 208 does not have any LEDs mounted thereon. For example, in instances in which the base 202 is rail-shaped or has a rectangular cross-section, there may be LEDs disposed on only one or two of the sides. In some implementations, the base 202 of the illumination source 200 may be formed of metal or other heat dissipating material, and it may be configured to lead heat away from the flexible printed circuit board 100. Although in the present example the LEDs in the illumination source 200 are part of the flexible printed circuit board, alternative implementations are possible in which the LEDs are part of another type of circuit, such as a non-flexible circuit.

Figure 3A:
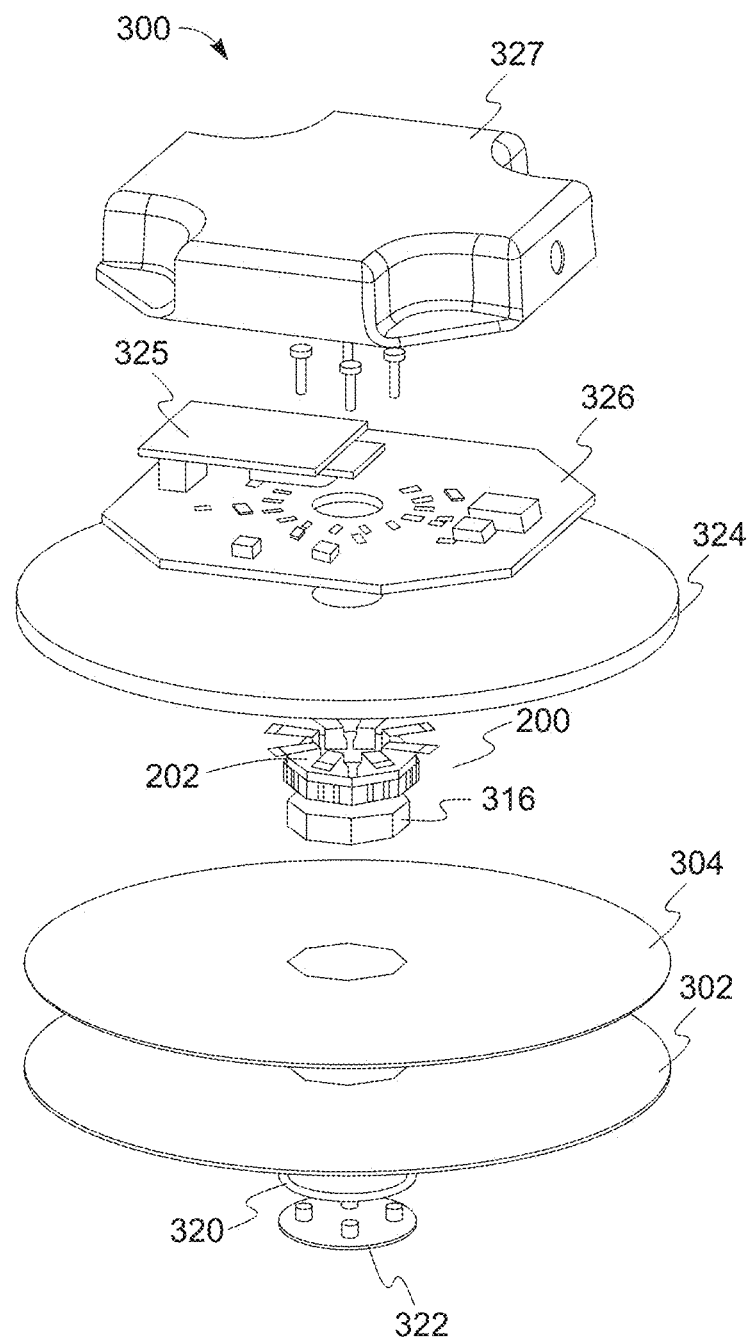
FIG. 3A is an exploded view of an example of a light fixture utilizing the illumination source of FIG. 2A, according to aspects of the disclosure.

FIG. 3A shows an exploded view of an example of a light fixture 300 that utilizes the illumination source 200, according to aspects of the disclosure. The light fixture 300 may include, among others, a light guide 302 and a reflector 304 disposed over the light guide 302. The reflector 304 described in the various embodiments herein may be placed at the back of the light guide panel to reflect downwards the light that otherwise would be directed upwards. The specularity and diffusivity properties of the reflector 304 can be tuned to broaden the light distributions in both vertical and horizontal planes. Although the various light fixtures 300 show the reflector 304 as having a cylindrical shape with a substantially rectangular cross-section, like the other elements being formed in a shape circular or multi-sided (e.g., octangular) shape, the various aspects are not so limited. For example, the reflector may extend over the outer edge of the light guide and have a frustoconical shape. The frustoconical shape has a trapezoidal cross-section, similar to the shape of the light guide in FIG. 10A. The underlying light guide may retain the same frustoconical shape.

In some embodiments, the light fixture may include further elements, such as a diffuser disposed under the light guide 302, to diffuse light directed out from the light guide to an external environment. Although in the present example the light guide 302 is shaped as a disk having an interior opening (e.g., an opening in the middle of the disk or at another location), alternative implementations are possible in which the light guide 302 has a different shape. For example, the light guide 302 may be shaped as a rectangle or another polygon (e.g., octagon, hexagon, etc.), a rail, etc. The shape may be determined based on any applicable reason such as light distribution preference, physical space requirements, or the like. A light distribution preference may be based on an application of a light fixture, an environmental conduction (e.g., objects to illuminate, distance to illuminate, available ambient light, etc.), or a user input. It should be noted that although one or more specific light guide shapes are shown in the figures contained herein, the shape of a light guide may be adjusted to be any applicable shape that results in a desired light distribution.

The illumination source 200 may be connected to a PCB structure containing one or more control boards, such as printed circuit board (PCB) 326 for controlling the operation of the LEDs. As illustrated in FIG. 3, the PCB 326 may be situated above the base 202. In addition, a secondary control board 325 (or daughterboard) may be situated above the PCB 326 (or motherboard). The secondary control board 325 contain communication electronics through which a user device is able to wirelessly communicate lighting settings to set the lighting of the illumination source 200 via the PCB 326 and the secondary control board 325. As different protocols (e.g., WiFi, Bluetooth, Zigbee) may be used, and the secondary control board 325 may only support a single protocol, the secondary control board 325 may be removable (swappable) to change the protocol used to communicate the information from the user device. The secondary control board 325 may also communicate information to the user device, such as present lighting conditions, available lighting conditions, and error messages. The PCB 326 and the secondary control board 325 may be protected by a removable cover 327 formed from an opaque material, such as metal or plastic.

Figure 4A:
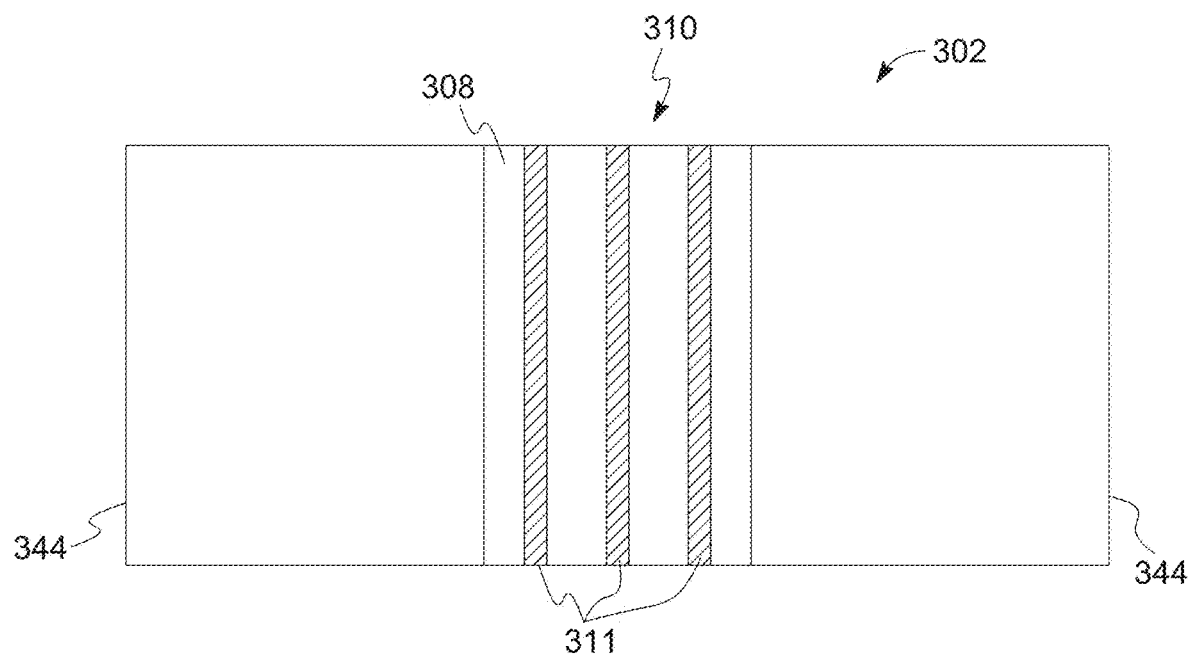
FIG. 4A is a cross-sectional side view of an example of a light guide that is part of the light fixture of FIG. 3, according to aspects of the disclosure.
Figure 4B:
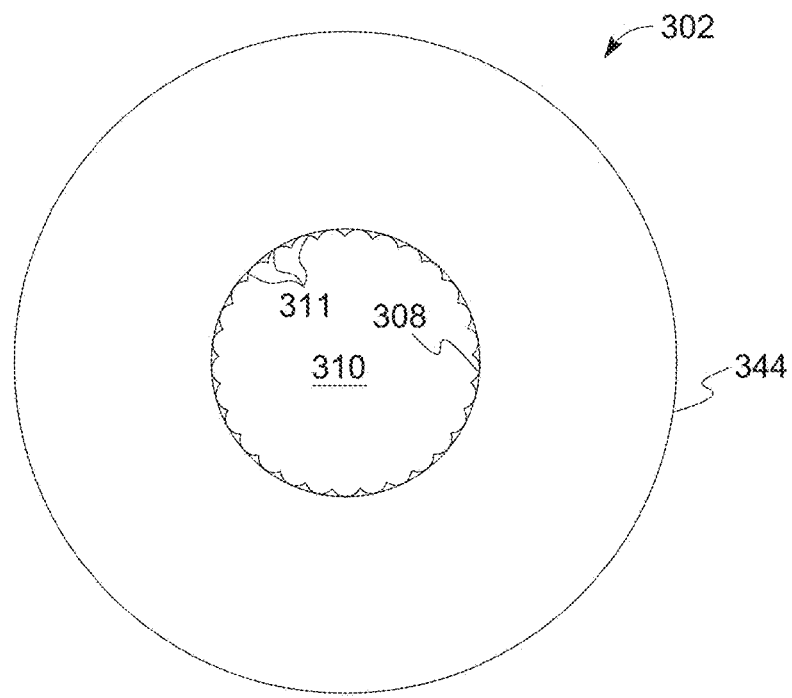
FIG. 4B is a planar top-down view of the light guide of FIG. 4A, according to aspects of the disclosure.

FIGS. 4A-B show the light guide 302 in further detail, in accordance with one particular implementation. FIG. 4A shows a vertical cross-section of the light guide 302 and FIG. 4B shows a top view of the light guide 302. As illustrated, in some implementations, the sidewalls 308 of the opening 310 of the light guide 302 may have one or more grooves (or indentations) 312 formed thereon. The sidewalk 308 may define an interior edge of the light guide 302 that faces the illumination source 200 when the illumination source 200 is at least partially disposed in the opening 310. The grooves may have any suitable shape, such as a circular shape, linear shape, a curved shape, etc. In the present example, the grooves 311 may be vertical, and they may have a linear shape that extends fully or partially between the top and bottom surfaces of the light guide 302. Additionally or alternatively, in some implementations, the grooves 311 may be horizontal, and they may have a linear shape that extends fully or partially around the circumference of the opening 310 of the light guide 302. The grooves 311 may have any suitable type of depth. In some implementations, the grooves 312 may be less than 1 mm deep. Additionally or alternatively, in some implementations, the grooves 311 may be less than 2 mm deep. Additionally or alternatively, in some implementations, the grooves 311 may be less than 3 mm deep. Additionally or alternatively, in some implementations, the grooves 311 may be less than 4 mm deep. Additionally or alternatively, in some implementations, the grooves 311 may be less than 5 mm deep. Additionally or alternatively, in some implementations, the grooves 311 may be less than 10 mm deep. Additionally or alternatively, in some implementations, the grooves 311 may be less than 20 mm deep, etc. Although in the present example the grooves 311 are formed on the interior edge of the light guide 302, alternative implementations are possible in which the same or similar groves are formed on the outer edge 344 of the light guide 302. In such instances, there may be additional LEDs that are optically coupled to the outer edge 344 of the light guide 302 (e.g., see FIG. 8).

Figure 8:
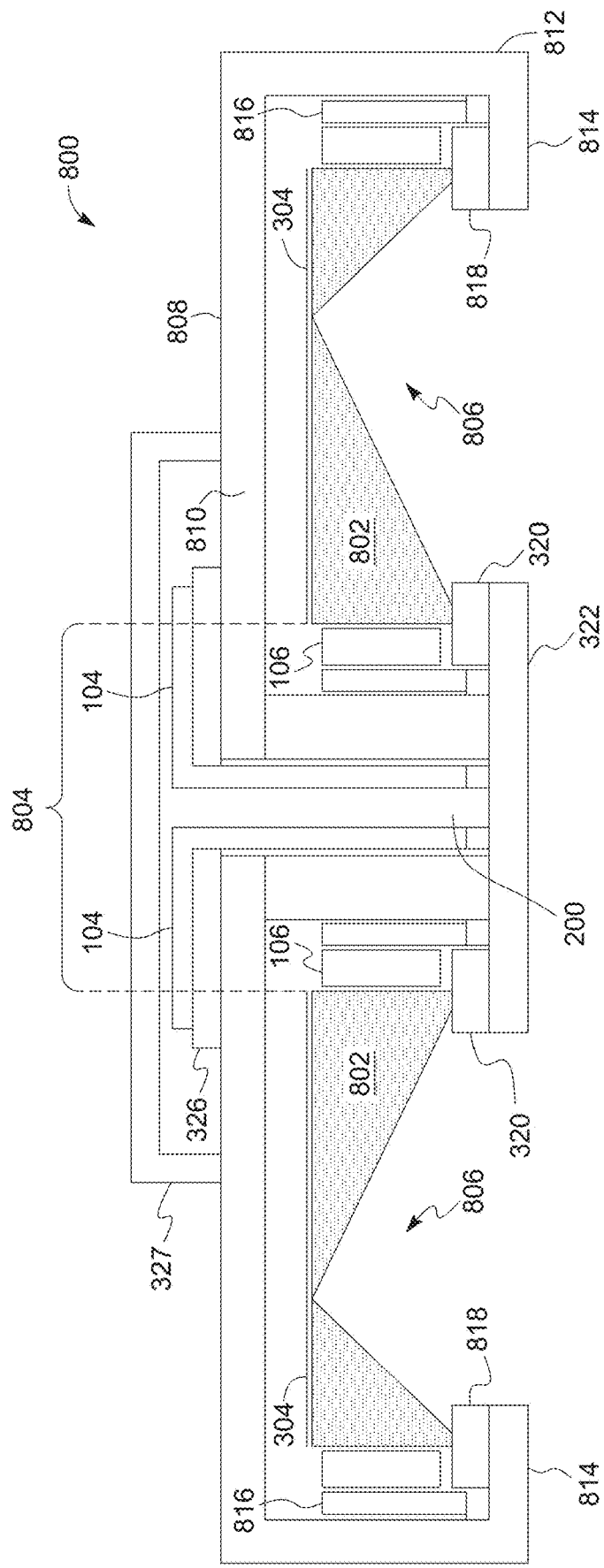
FIG. 8 is a cross-sectional side view of yet another example of a light fixture, according to aspects of the disclosure.

Although the light guide 302 has a flat surface in the example of FIGS. 4A-B, alternative implementations are possible in which the light guide has a recess formed in its surface (e.g., see FIG. 8). Furthermore, alternative implementations are possible in which the light guide 302 is tapered and or chamfered (e.g., see FIGS. 9 and 10).

Notably, the present disclosure is not limited to a specific configuration of the light guide 302.

Figure 6:
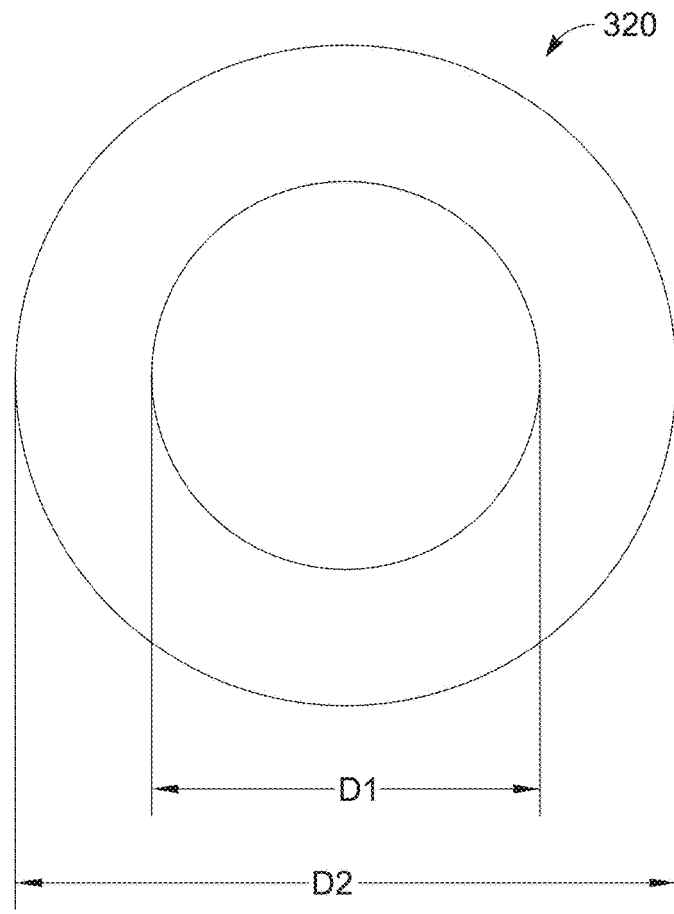
FIG. 6 is a cross-sectional side view of the light fixture of FIG. 3, according to aspects of the disclosure.

As shown in FIG. 3, the illumination source 200 may be coupled to a mounting post 316. In some implementations, the illumination source 200 may be disposed at least partially inside the opening 310 in the light guide 302, as shown in FIGS. 4A-B, such that light emitted from the illumination source 200 is injected into the light guide 302 through the opening's sidewalk 308 of FIGS. 4A-B (e.g., the interior edge of the light guide 302). A reflector 320 may be disposed under the illumination source 200, as shown. The reflector 320 is shown in further detail in FIG. 6. As illustrated, in some implementations, the reflector 320 may be ring-shaped. In some implementations, the reflector 320 may have an inner diameter D1 that is smaller than the inner diameter Δ1 of the illumination source 200, as shown in FIG. 2B. Additionally or alternatively, the reflector 320 may have an outer diameter D2, as shown in FIG. 6, that is greater than the outer diameter Δ2 of the illumination source 200, as shown in FIG. 2B. Dimensioning the reflector 320 in this way may ensure a complete overlap between the illumination source 200 and the reflector 320, such that all, or a large portion, of light that is emitted by the illumination source 200 towards the reflector 320, without being injected into the light guide 302, is reflected back to be injected into the light guide 302 through the interior edge of the light guide.

In some implementations, as shown in FIG. 3, a cap 322 may be disposed under the light guide 302 and the reflector 320. The cap 322 may be formed of plastic, metal, and/or any other suitable type of material. In some implementations, the cap 322 may be formed of a reflective material, such that the surface of the cap 322 that faces the illumination source 200 is configured to reflect at least some of the light emitted from the illumination source 200 back towards the light guide 302. Additionally or alternatively, in some implementations, the cap 322 may be light transmissive (e.g., transparent or translucent). Additionally or alternatively, in some implementations, the cap 322 may be opaque.

In the example shown in FIG. 3, the opening 310 in the light guide 302 is a through-hole. However, alternative implementations are possible in which the opening is a blind hole. In such implementations, the reflector 320 and the cap 322 may be altogether omitted, while the illumination source 200 remains at least partially disposed inside the blind hole.

In some implementations, a heat dissipating element such as a housing/pan/heat spreading element 324 may be disposed above the illumination source 200, as shown. The pan 324 may be formed of metal and/or any other suitable type of thermally conductive material. In some implementations, the pan 324 may be thermally coupled to the base 202 of the illumination source 200. In such instances, heat that is generated by the LEDs on the illumination source 200 may be led away from the LEDs by the base 202 of the illumination source 200, into the pan 324, to be subsequently dissipated by the pan 324. In some implementations, the pan 324 may have an interior opening to allow the legs 104 of the flexible printed circuit board 100 (which is part of the illumination source 200) to be routed through the pan 324 and connected to circuitry, such as the PCB 326, that is overlying the pan 324. The pan 324 thus may form the back of the light engine 300, provide mechanical protection, and spread the heat generated by the LEDs 102 for good thermal dissipation since the pan may be contact with a center rod (shown below). The outer edge of the pan 324 may be used to shape optimally as the outer edge may significantly impact the overall photometric performance, mechanical protection, cosmetic aspect, and also ingress protection. If the light engine is not highly mechanical robust, and thermal dissipative is not too high, the reflector may be used as the housing.

In some implementations, the PCB 326 disposed over the pan 324 may include circuitry for individually addressing/controlling the operation of the LEDs or sets of the LEDs in the illumination source 200. The circuitry may be configured to control each segment 106 in the illumination source 200 independently of the remaining segments and/or each LED within the segment independently of each other LED within the segment. For example, each segment 106 may be turned on/off independently of the rest as a result of this arrangement. Additionally or alternatively, in some implementations, the brightness of each segment 106 may be changed independently of the rest as a result of this arrangement. Additionally or alternatively, in some implementations, the color of light output by each of the segments 106 may be changed independently of the rest as a result of this arrangement. Additionally or alternatively, in some implementations, the CCT of light output by each of the segments 106 may be changed independently of the rest as a result of this arrangement.

Figure 5A:
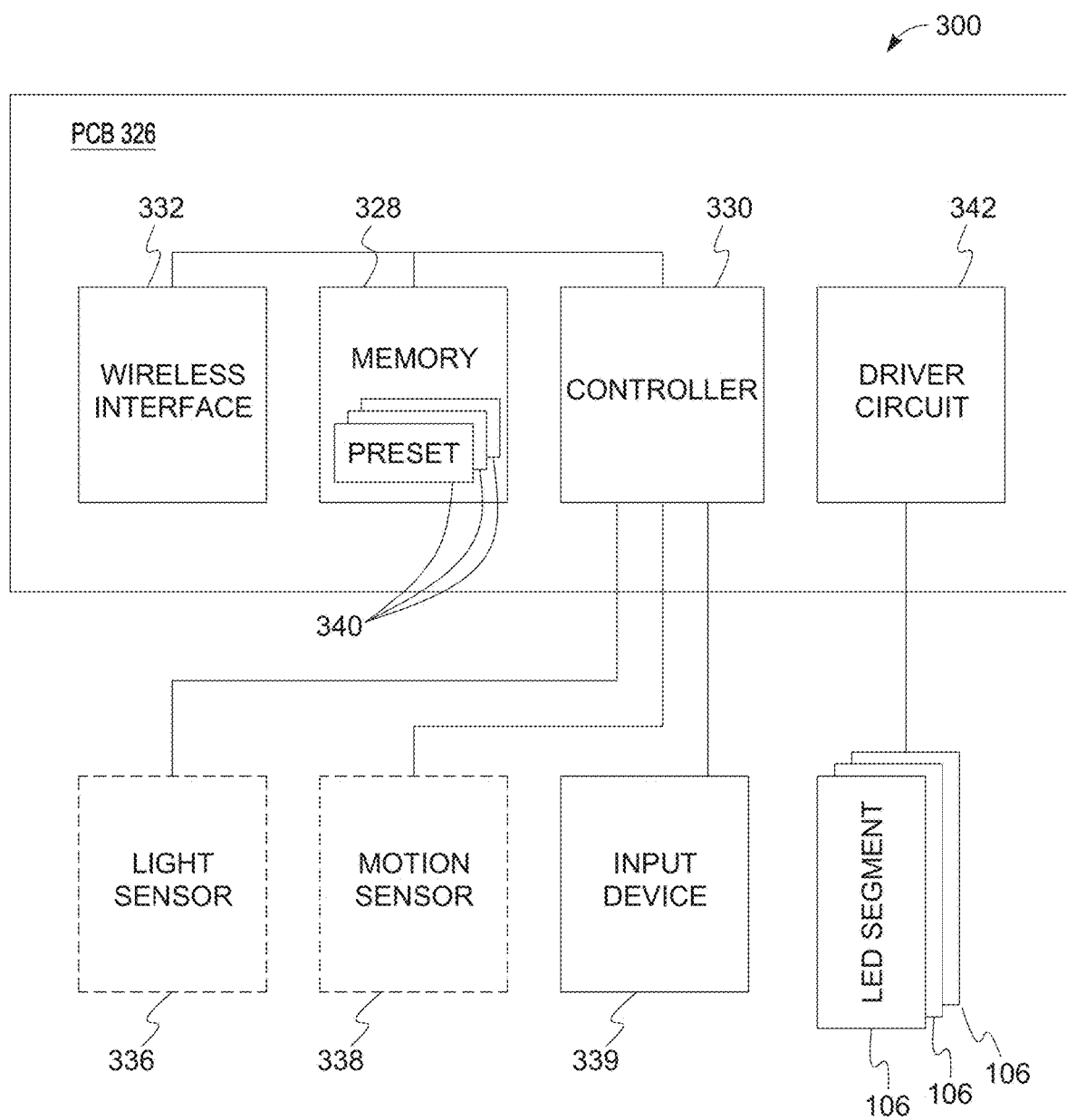
FIG. 5A is a schematic diagram of the light fixture of FIG. 3, according to aspects of the disclosure.
Figure 5B:
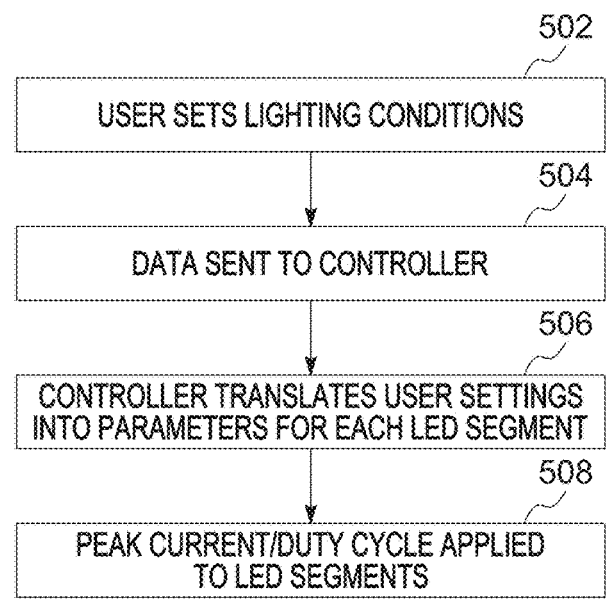
FIG. 5B is a flowchart of operation of the light fixture of FIG. 3, according to aspects of the disclosure.

FIG. 5A shows a schematic diagram of the light fixture 300 of FIG. 3 illustrating its electrical aspects, according to aspects of the disclosure. FIG. 5B is a flowchart of operation of the light fixture of FIG. 3, according to aspects of the disclosure. As illustrated, the light fixture 300 may include the PCB 326, an input device 334, and the LED segments 106. The PCB 326 may include a memory 328, a controller 330, a wireless interface 332, and a driver circuit 342. Any of the memory 328, the input device 334, the wireless interface 332, may be operatively coupled to the controller 330. The memory 328 may include any suitable type of volatile or non-volatile memory, such as one or more of a read-only memory, flash memory, EEPROM, Random Access Memory (RAM), Dynamic Random Access Memory (DRAM), etc. The controller 330 may include one or more of a general-purpose processor, an application specific integrated circuit (ASIC), a field-programmable gate array, and/or any other suitable type of electronic circuitry. The wireless interface 332 may be any applicable interface such as a Bluetooth interface, a Zigbee interface, and/or any other suitable type of wireless interface. The input device 334 may include a knob, a button, a mouse, a track pad, a keypad, or a touchscreen that can be used to select and/or specify a current preset for the light fixture.

In some implementations, the distribution of the light output by the light fixture 300 may be modified by selectively (and/or dynamically) by changing the state of different segments on the illumination source 200 independently of one another. This may be initiated by the user setting a lighting condition using a wired or wireless device at operation 502. The data corresponding to the lighting condition may then be sent at operation 504 to the controller of the light fixture 300. The controller may subsequently translate the user settings into individual parameters for each LED segment at operation 506. In such instances, the memory 328 may store respective representations of a plurality of presets 340. Any of the presets 340 may specify one or more settings for each of the LED segments 106 in the illumination source 200. Specifying settings for a given LED segment 106 may include specifying one or more of: (1) whether the LED segment is to be turned on, (2) the color of light output by the LED segment, (3) the brightness of the LED segment, (4) the CCT of light output by the LED segment, and/or any other suitable characteristic of the operation of the LED segment. Each of the settings may be represented as a number, a string, and/or any other suitable type of alphanumerical string. Each preset may be represented as any suitable type of data structure for encapsulating and/or relating the settings in the preset to one another, such as a table, a row in a table, a one-dimensional array, a two-dimensional array, etc. The presets may be stored in a lookup table in the memory 328 that are selected by a remote device (e.g., wirelessly) or local device (e.g., via a wired connection). The lookup table may serve to steer the light beam by selecting the characteristics of the LED segments, as described later.

The controller 330 may thus be configured to receive or detect user input selecting a given preset 340, retrieve the selected preset 340 from the memory 328, and/or change the state of one or more of the LED segments 106 in the illumination source 200 based on the retrieved preset 340. For each given LED segment 106, the controller may use the preset 340 to identify one or more settings corresponding to the given segment 106 and change the state of the given segment based on the identified settings. Changing the state of the given LED segment 106 may include one or more of: turning on or off the given segment 106, changing the brightness of the given segment 106, changing the color of light that is output by the given segment 106, changing the CCT of light that is output by the given segment 106, and/or changing any other suitable characteristic of the operation of the given LED segment 106.

In some implementations, the controller 330 may receive user input selecting one of the plurality of presets 340 that are stored in the memory 328, through the wireless interface 332. The memory 328 may contain a lookup table that contains a correspondence between a light distribution selected by a user equipment (e.g., smartphone, connected controller) and parameters associated with each LED segment. The parameters may include one or more of the duty cycle of current flowing to each LED segment or peak current associated with each LED segment, as shown in FIG. 5B, which may be adjusted to provide the desired illumination, as explained in more detail with reference to FIGS. 15-18 below. The lookup table may be preprogrammed based on an association between the number and placement of LED segments on the base and within the light engine (e.g., center-lit, edge lit, offset) and predetermined light distribution patterns.

Alternatively, the controller may receive input specifying a preset that the user wants to be used, through the interface 332. Thus, although in the present example the presets 340 are retrieved from a non-volatile memory located on the PCB 326 or the secondary control board 325, alternative implementations are possible in which a particular preset 340 is specified or selected by the user (e.g., on the user's smartphone) and received by the controller via the wireless interface 332. In the latter case, the preset 340 may be stored in volatile memory and deleted or discarded, eventually. The present disclosure is not limited to any specific method for storing, implementing, or selecting the presets. Additionally or alternatively, in some implementations, the PCB 326 may be coupled to an input device 339, such as a knob, keypad, or a touchscreen that can be used to select and/or specify a current preset for the light fixture.

Figure 20:
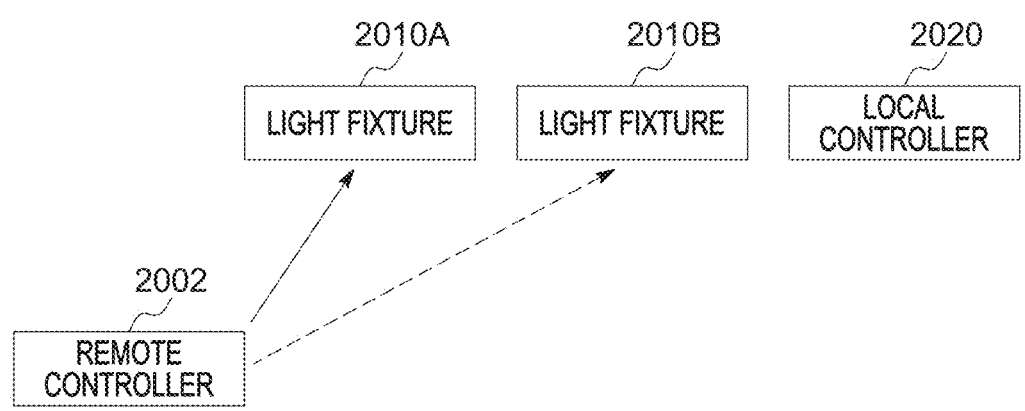
FIG. 20 shows an environment in which the system is used, according to aspects of the disclosure.

FIG. 20 shows an environment in which the system is used, according to aspects of the disclosure. As shown, one or more light fixtures 2010a, 2010b may be present in an environment 2000. The environment 2000 may be a home, office or other environment where the light fixtures 2010a, 2010b are present. Each light fixture 2010a, 2010b may contain a light engine, such as one of the light engines described herein. The LED segments in each of the light fixtures 2010a, 2010b may be wirelessly controlled by a remote controller 2002, such as a smartphone or specialized controller, using the techniques described herein. One or more of the light fixtures 2010a, 2010b may also be controlled using a local controller 2020, such as a wall panel. Control of the light fixtures 2010a, 2010b (and the light engines and the LED segments therein) may be independent of each other. Alternatively, a single light distribution may be selected by the controller 2002, 2020 and distributed to the light fixtures 2010a, 2010b. In some embodiments, the single light distribution may be the same across the light fixtures 2010a, 2010b, affecting similarly oriented LED segments in each light fixture 2010a, 2010b. In other embodiments, the single light distribution may be complementary—affecting the same number of LED segments in the light fixtures 2010a, 2010b, but in which the orientation is rotated to take into account the relative locations of the light fixtures 2010a, 2010b. Note that while only two light fixtures 2010a, 2010b are shown, there may be more than two light fixtures that include light engines. Wireless and/or wired control may be user-selectably effected over one, all or only some of the multiple light fixtures in a single command. The user may establish programs, stored in the memory of the user device and/or of the individual light fixtures to control sets of the light fixtures. In some cases, an ID may be assigned to sets of the light fixtures, the individual controllers of the light engines in the light fixtures matching an ID of the light fixture (of a group to which the light fixture is a member) to a command from the user device before controlling the light distribution of the light engine. The light fixtures 2010a, 2010b may have the same type of light engine (shown in the figures herein) or one or more of the light fixtures 2010a, 2010b may have a different light engine. For example, although not shown, one or more of the light fixtures 2010a, 2010b may include motion sensors, which may adjust the light distribution of those light fixtures 2010a, 2010b and may further adjust the light distribution of light fixtures 2010a, 2010b that do not have the motion sensors through wireless communication, sending a similar signal from device to device as that sent by the user device.

Although in the present example the light fixture 300 of FIG. 3 does not include any sensors, alternative implementations are possible in which the light fixture 300 includes a light sensor 336, as denoted by one of the dashed rectangles in FIG. 5. The light sensor 336 may be operatively coupled to the controller 330. The light sensor 336, such as a photodiode, may be configured to measure the amount of ambient light that enters the light fixture through the cap 322 and the opening 310 in the light guide 302. The light sensor 336 may thus be disposed within the opening 310. The light sensor 336 may be further configured to generate a signal that indicates the amount of ambient light in the vicinity of the light fixture 300. The controller 330 may be configured to receive the signal and switch on or otherwise change the state of the light fixture 300 when the level of the signal crosses (e.g., exceeds or falls below a threshold). Changing the state of the light fixture 300 may include one or more of switching on the light fixture 300, changing the distribution of the light output of the light fixture 300, changing the color of the light output of the light fixture 300, changing the CCT of the light fixture 300, etc. Although in the present example the light sensor 336 is depicted as being separate from the PCB 326, alternative implementations are possible in which the light sensor 336 is mounted on the PCB 326.

Although in the present example the light fixture 300 of FIG. 3 does not include any sensors, alternative implementations are possible in which the light fixture 300 includes a motion sensor 338, as denoted by one of the dashed rectangles in FIG. 5. The motion sensor 338 may be operatively coupled to the controller 330. In some implementations, the controller 330 may be configured to receive a signal that is generated using the motion sensor 338 and turn on or otherwise change the state of the light fixture 300 when the level of the signal crosses a threshold. In such implementations, the cap 322 may be configured to permit the motion sensor to operate correctly. For example, the thickness of the cap 322 and/or the material of the cap 322 may be selected so that the motion sensor 338 can operate properly inside the light fixture. Changing the state of the light fixture may include one or more of switching on the light fixture 300, changing the distribution of the light output of the light fixture, changing the color of the light output of the light fixture, changing the CCT of the light fixture, etc. Although in the present example the motion sensor 338 is depicted as being separate from the PCB 326, alternative implementations are possible in which the motion sensor 338 is mounted on the PCB 326. The input device 339 may include a knob, a keypad, or a touch screen for controlling the light fixture.

Although in the present example, the light fixture is depicted as including both a light sensor and a motion sensor, alternative implementations are possible in which both the light sensor and the motion sensor are omitted. Furthermore, alternative implementations are possible in which the light fixture 300 includes only a motion sensor. And still furthermore, alternative implementations are possible in which the light includes only a light sensor. Notably, the present disclosure is not limited to any specific sensor configuration of the light fixture 300.

Figure 7A:
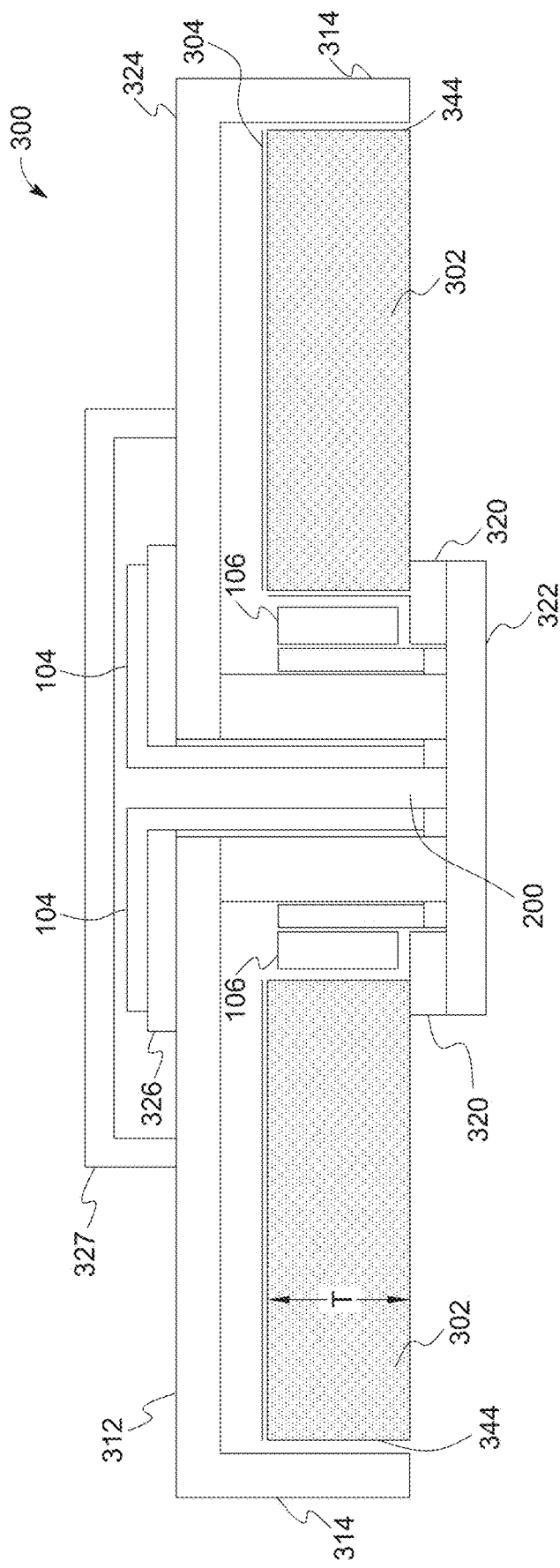
FIG. 7A is a cross-sectional side view of another example of a light fixture, according to aspects of the disclosure.
Figure 7C:
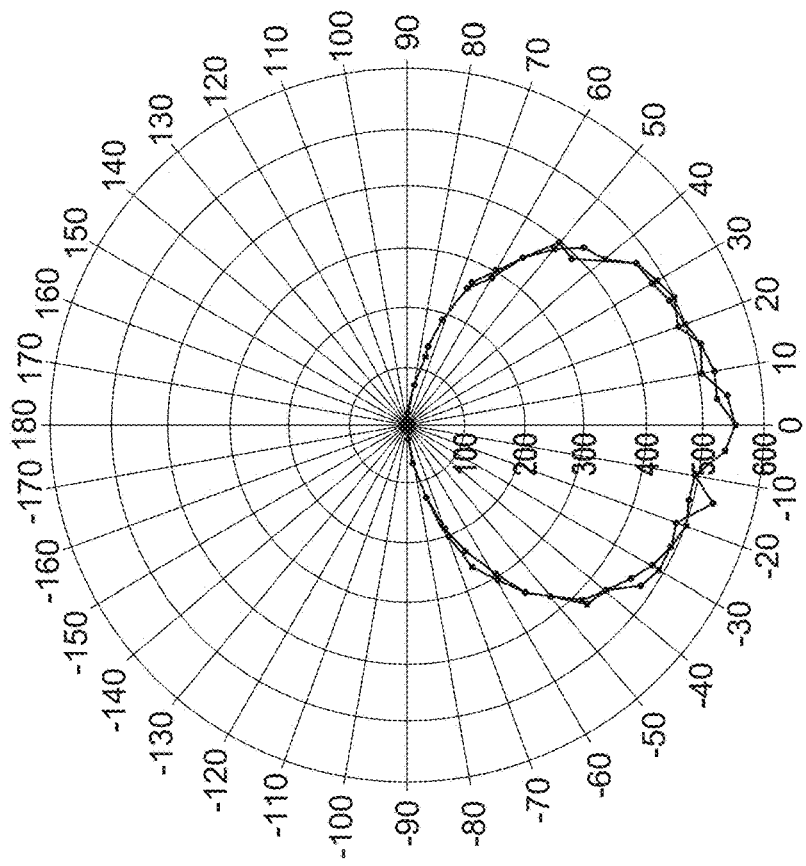
FIGS. 7B and 7C are luminance distributions, in accordance the light fixture of FIG. 7A.
Figure 7B:
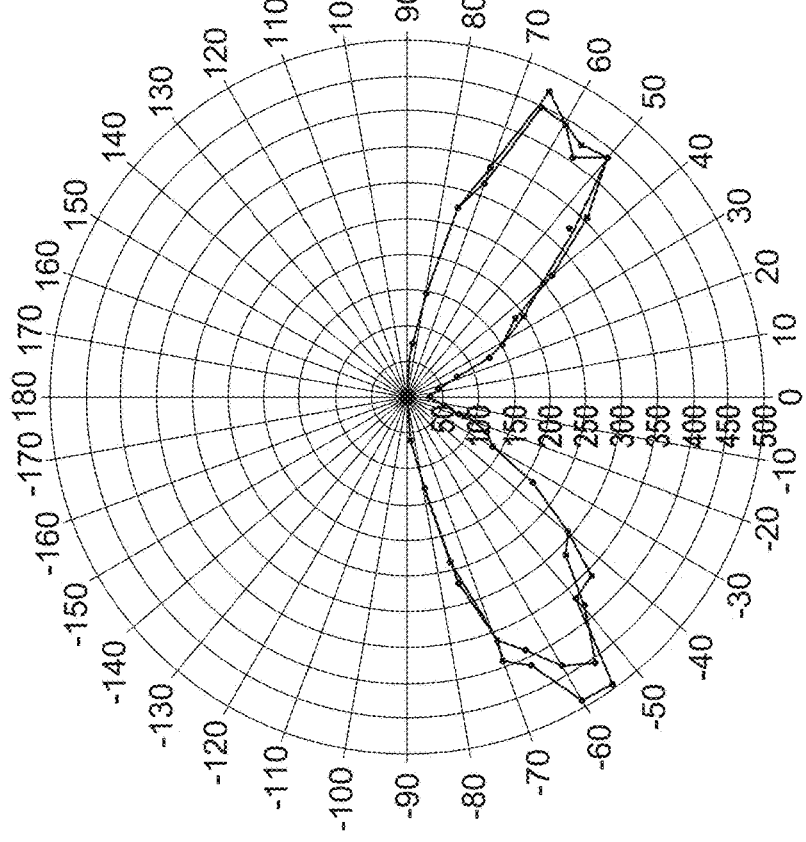

FIG. 7A shows a planar cross-sectional side view of a light fixture of FIG. 3, according to aspects of the disclosure. Note that although the opening is shown here and in other figures as extending completely through the base 202 to above the PCB 326, with the terminal portions of the legs 104 of the flexible PCB extending parallel to the PCB 326, in other embodiments, the opening may terminate within the base 202, and the terminal portions of the legs 104 of the flexible PCB remaining unbent. As illustrated, the pan 324 may have a top surface 312 and a sidewall 314. In the present example, the sidewall 314 has a length L that is greater than or equal than the thickness T of the light guide 302, such that the outer edge 344 of the light guide 302 is covered completely by the sidewall 314 of the pan 324. However, in some implementations, the length L of the sidewall may be less than the thickness T of the light guide 302, such that the outer edge 344 of the light guide 302 is only partially covered by the sidewall 314 of the pan 324. Furthermore, alternative implementations are possible in which sidewall 314 of the pan 324 is altogether omitted. The pan 324 may comprise any applicable material such as aluminum and may act as a heat sink, as further disclosed herein. FIGS. 7B and 7C are luminance distributions, in accordance the light fixture of FIG. 7A. The flat shape of the light guide may be used for intermediate batwing beam angle or Lambertian applications.

FIG. 8 shows a planar cross-sectional view of a light fixture 800, according to aspects of the disclosure. The light fixture 800 differs from the light fixture 300 of FIG. 3 in that in it includes a light guide 802 with a recess 806 in it, an LED strip 816 that is wrapped around an outer edge of the light guide 802, and a pan 808 that is provided with a lip. As illustrated, the light fixture 800 includes a disk-shaped light guide 802, having an interior opening 804 and a recess 806 that is formed around the interior opening 804. The light guide 802 thus, as shown, has a cross-section of two substantially triangular areas with different areas, with a vertex near but not at, the center of the length of the light guide 802. In other embodiments, the areas may be the same. An illumination source 200 may be at least partially disposed in the interior opening, and a cap 322 may be disposed underneath the light source, while a reflector 320 is disposed between the cap 322 and the illumination source 200, as shown.

In some implementations, the recess 806 may completely or partially surround the interior opening 804. The recess 806 may have a triangular cross-section, and or any suitable shape of cross-section. A pan 808 may be disposed over the light guide 802, as shown. The pan 808 may be formed of metal and/or any other suitable type of thermally conductive material. In some implementations, the pan 808 may be thermally coupled to the base 202 of the illumination source 200. In such instances, heat that is generated by the LEDs on the illumination source 200 may be led away from the LEDs by the base 202 of the illumination source 200, into the pan 808, to be subsequently dissipated by the pan 808.

As illustrated, the pan 808 may include a top portion 810 that is coupled to a sidewall 812. The sidewall 812 may be provided with a lip 814, and an LED strip 816 may be disposed between the sidewall 812 and the light guide 802. In some implementations, the LED strip 816 may have adhesive backing that is adhered to the interior surface of the sidewall 812. A reflector 818 may be provided between the lip 814 and at least a portion of the LED strip 816. In some implementations, the reflector 818 may be ring-shaped and it may have an inner diameter that is smaller than the outer diameter of the light guide 802. Additionally or alternatively, the reflector 818 may have an outer diameter that is greater than the diameter of the light guide 802. As discussed above with respect to the reflector 320, configuring the reflector 818 in this manner may reflect upwards light emitted by the LED strip 816 that is not injected into the light guide 802. The use of both center edge and outer edge LED strips may provide a higher light output and/or increased degree of control over light distributions in the horizontal and vertical planes.

Figure 9A:
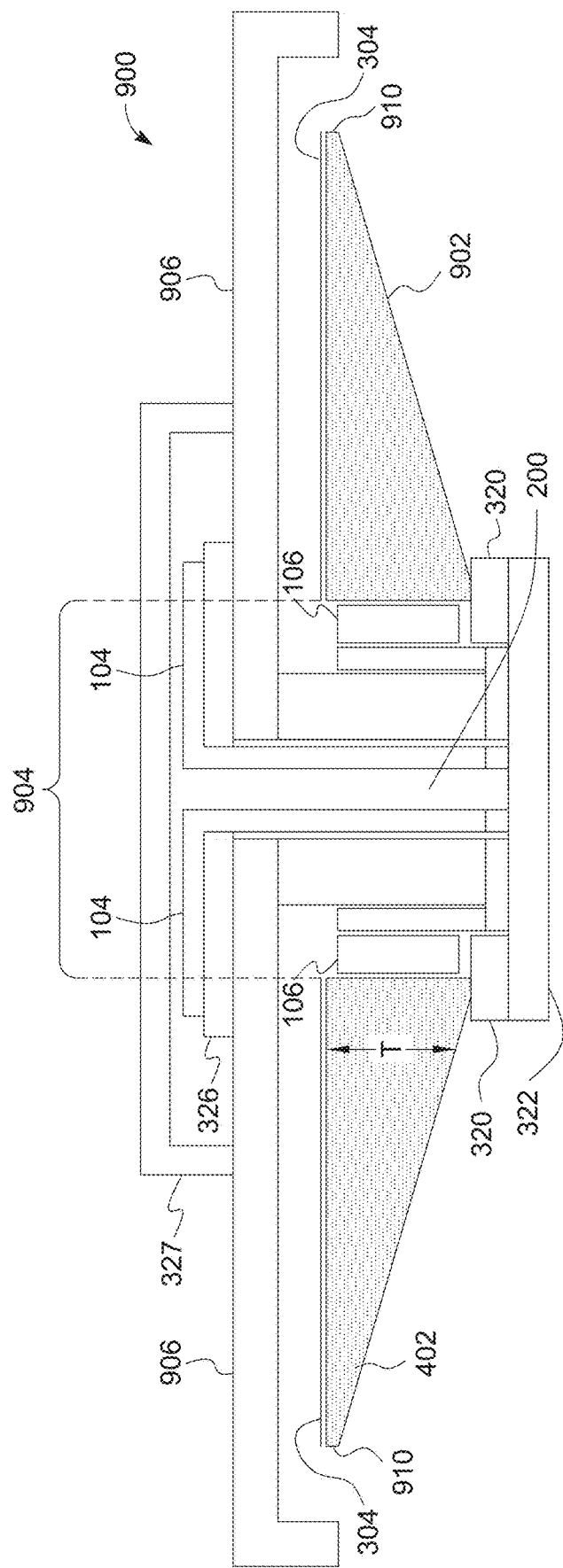
FIG. 9A is a cross-sectional side view of yet another example of a light fixture, according to aspects of the disclosure.
Figure 9C:
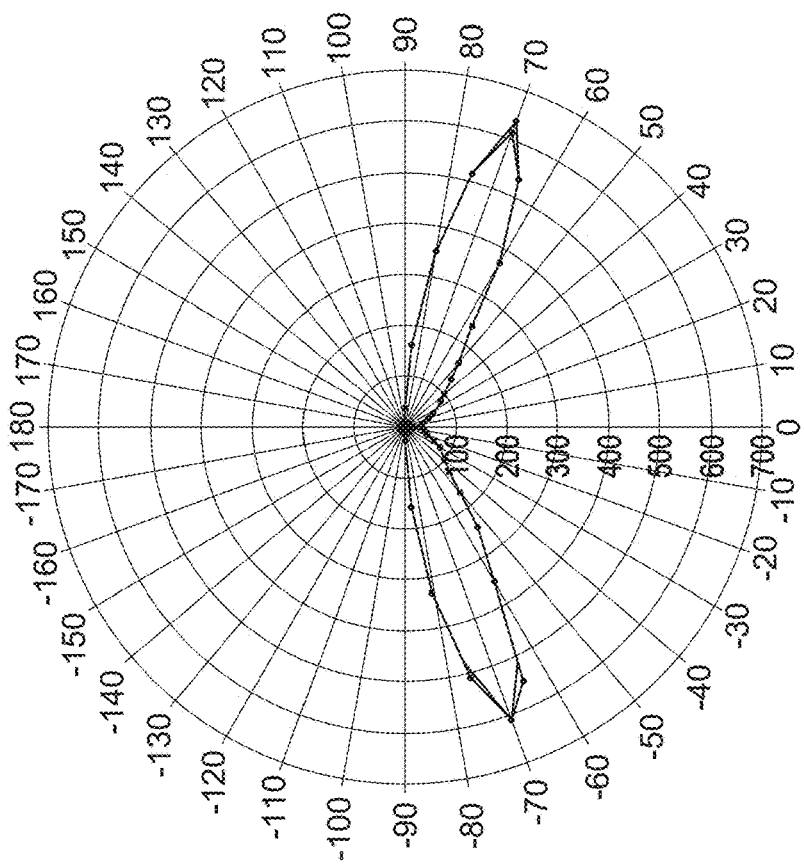
FIG. 9C is a luminance distribution, in accordance the light fixture of FIG. 9A.
Figure 9B:
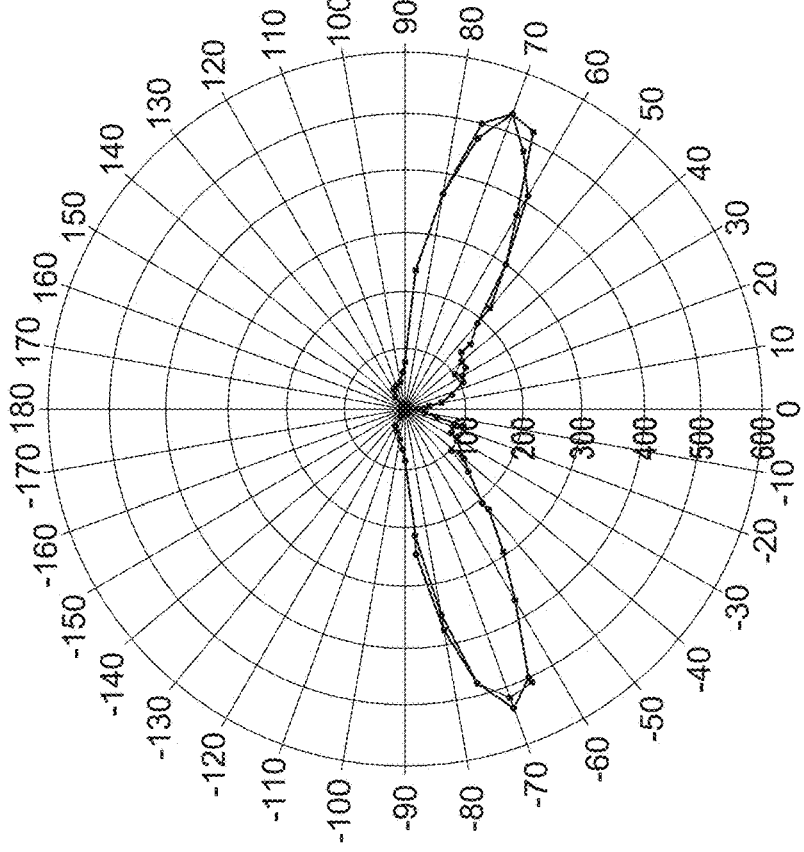
FIG. 9B is a luminance distribution, in accordance the light fixture of FIG. 9A.

FIG. 9 shows a planar cross-sectional view of a light fixture 900, according to aspects of the disclosure. The light fixture 900 differs from the light fixture 300 of FIG. 3 in that in it includes a tapered light guide 902. As illustrated, the light fixture 900 includes a disk-shaped light guide 902 having an interior opening 904. An illumination source 200 may be at least partially disposed in the interior opening, and a cap 322 may be disposed underneath the light source, while a reflector 320 may be disposed between the cap 322 and the illumination source 200, as shown. A pan 906 may be disposed over the illumination source 200. The pan 906 may be thermally coupled to the illumination source 200 and configured to dissipate heat generated by the illumination source 200. In the example of the light fixture 900, the bottom light-emitting surface 908 of the light guide 902 may be tapered, such that the thickness T of the light guide 902 decreases from the interior opening 904 of the light guide 902 to its outer edge 910 in a substantially triangular shape. FIG. 9B and FIG. 9C are luminance distributions, in accordance the light fixture of FIG. 9A. As shown in FIGS. 9B and 9C, the tapering of the light guide 902 may result in a high batwing beam angle light distribution.

Figure 10A:
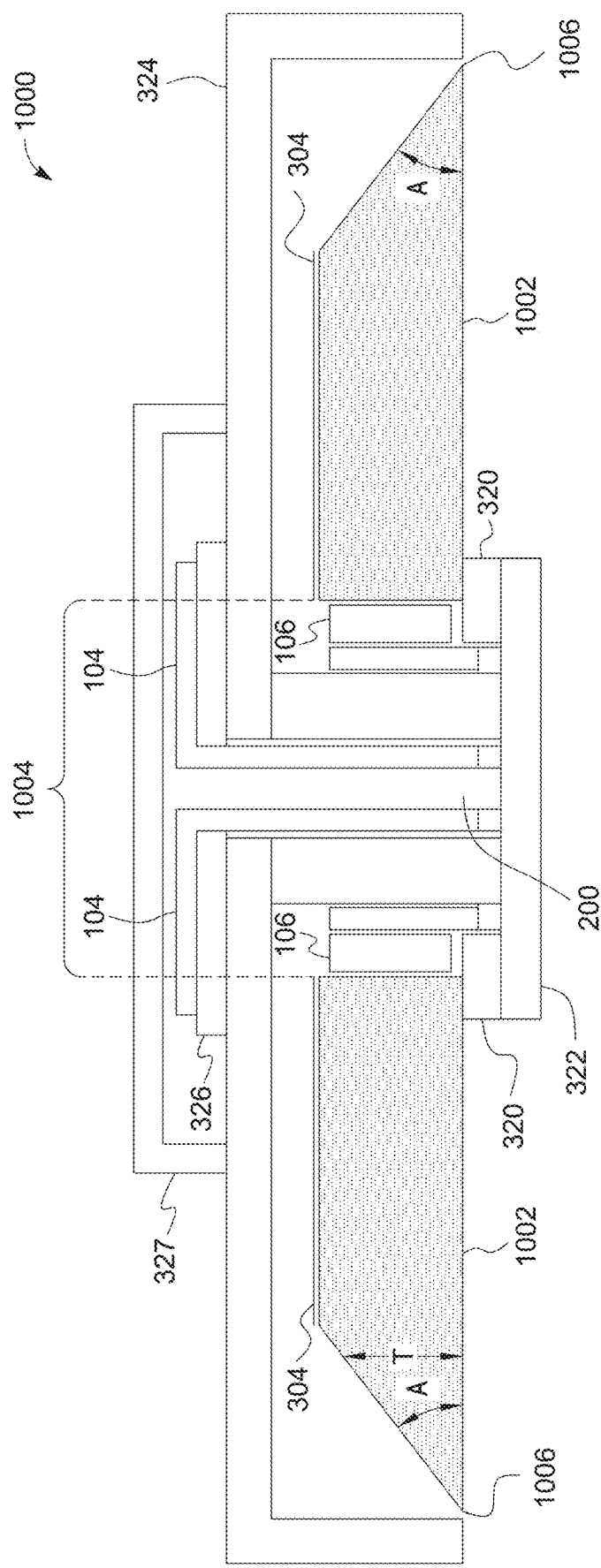
FIG. 10A is a cross-sectional side view of yet another example of a light fixture, according to aspects of the disclosure.

FIG. 10A shows a planar cross-sectional view of a light fixture 1000, according to aspects of the disclosure. The light fixture 1000 differs from the light fixture 300 of FIG. 3 in that in it includes a chamfered light guide 1002. As illustrated, the light fixture 1000 includes a disk-shaped light guide 1002, having an interior opening 1004. An illumination source 200 may be at least partially disposed in the interior opening 1004, and a cap 322 may be disposed underneath the light source, while a reflector 320 is disposed between the cap 322 and the illumination source 200, as shown.

Figure 10C:
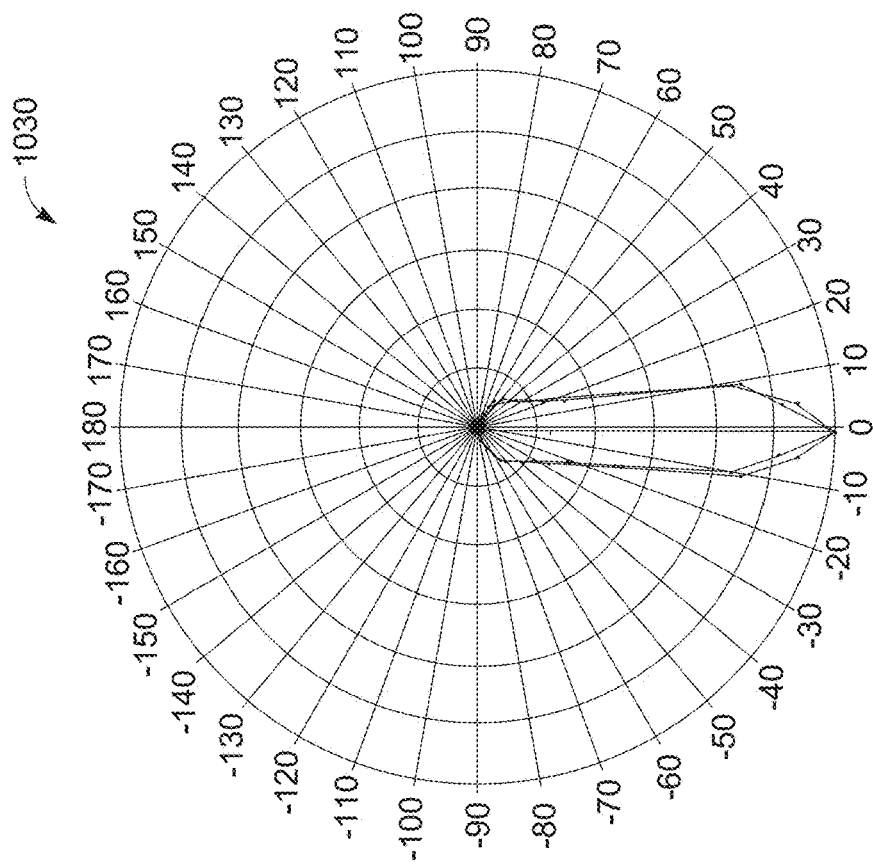
FIG. 10C is a luminance distribution, in accordance the light fixture of FIG. 10A.
Figure 10B:
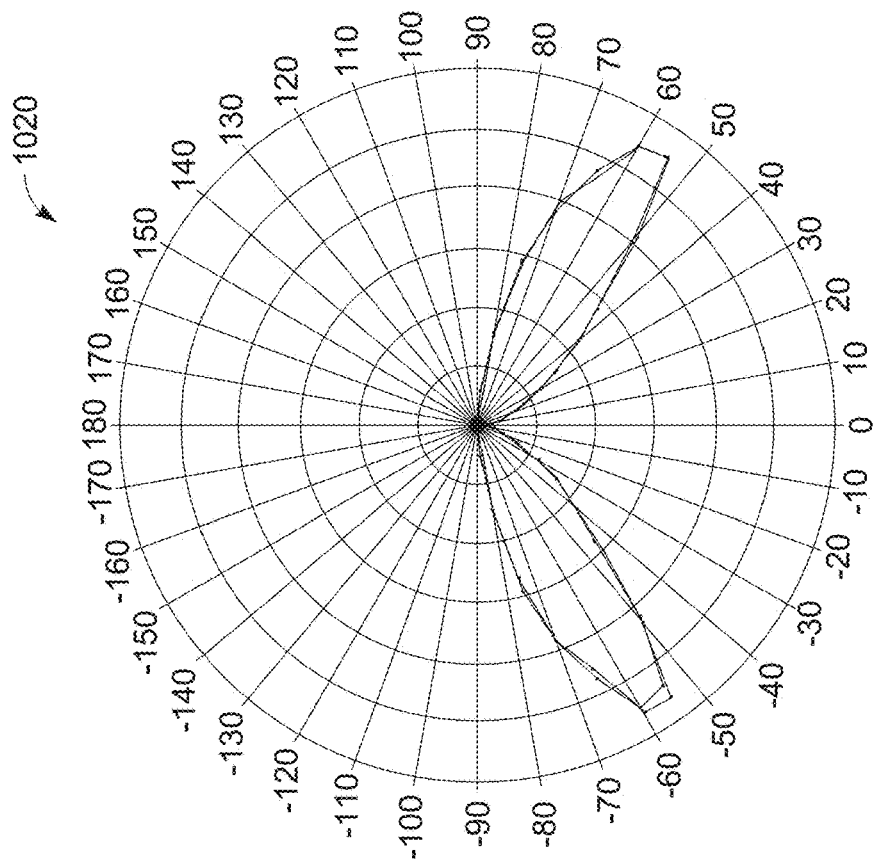
FIG. 10B is a luminance distribution, in accordance the light fixture of FIG. 10A.

In the example of the light fixture 1000, the light guide 1002 has a chamfered outer edge, such that the thickness T of the light guide 1002 increases from the light guide's exterior edge 1006 towards the interior opening until it reaches it's a constant thickness level, as shown. According to aspects of the disclosure, the angle A of the chamfer may be used to deliberately shape the distribution of the light output of the light fixture. For example, the polar diagram 1020, which is shown in FIG. 10B shows the light distribution produced by a light guide having a chamfer angle of approximately 10 degrees. As illustrated, when the chamfer angle of the light guide is approximately 10 degrees, the light guide 1002 may produce a batwing distribution having lobes that are spaced apart from one another. As another example, the polar diagram 1030, which is shown in FIG. 10C, shows the light distribution produced by a light guide having a chamfer angle A of approximately 45 degrees. As illustrated, when the chamfer of the light guide is approximately 45 degrees, the light guide may produce a "spotlight" distribution having lobes that are approximately coincident.

Stated succinctly, the chamfer angle A of the light guide 1002 may be used to control the spread of the light output of the light fixture 1000. In some implementations, the chamfer of the light guide 1002 may be configured to produce a light distribution having at least two lobes that are at least partially coincident. The angle of the chamfer may produce a desired degree of overlap between the two lobes, and it may be somewhere between 10 and 45 degrees, in some implementations. The flat shape of the light guide may be used for intermediate batwing beam angle or spot applications.

Figure 11:
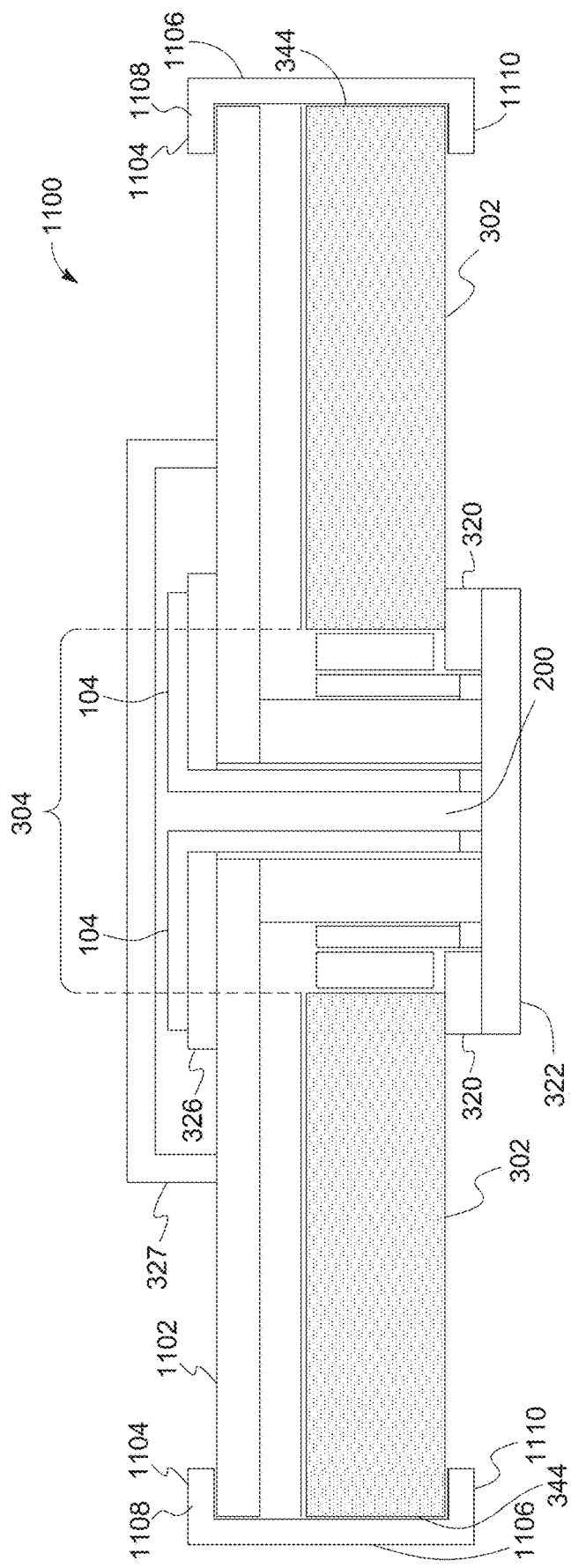
FIG. 11 is a cross-sectional side view of yet another example of a light fixture, according to aspects of the disclosure.

FIG. 11 is a planar cross-sectional view of a light fixture 1100, according to aspects of the disclosure. The light fixture 1100 differs from the light fixture 300 of FIG. 3 in that in it includes a reflective gasket 1104 disposed around the circumference of the light fixture 1100. As illustrated, the light fixture 1100 includes a disk-shaped light guide 302, having an interior opening 305. An illumination source 200 may be at least partially disposed in the interior opening, and a cap 322 may be disposed underneath the light source, while a reflector 320 is disposed between the cap 322 and the illumination source 200, as shown. A pan 1102 may be disposed over the illumination source 200. The pan 1102 may be thermally coupled to the illumination source 200 and configured to dissipate heat generated by the illumination source 200. Unlike the pan 324 of FIG. 3, the pan 1102 does not have any sidewalk. However, a reflective gasket 1104 is edge coupled to the pan 1102 and the light guide 302, as shown.

In some implementations, the reflective gasket 1104 may be shaped as a ring and it may be formed of plastic, metal and/or any other suitable type of material. In the present example, the reflective gasket 1104 has a main portion 1106 that is wrapped around the outer edge of the light guide 302 and the pan 324, as well as a top lip 1108 and a bottom lip 1110. The top lip 1108 is disposed over the pan 324 and the bottom lip 1110 is disposed under the light guide 302. Although in the present example, the reflective gasket 1104 has both a top lip 1108 and a bottom lip 1110, alternative implementations are possible in which the reflective gasket 1104 includes only a top lip. Furthermore, alternative implementations are possible in which the reflective gasket has only a bottom lip.

Figure 12:
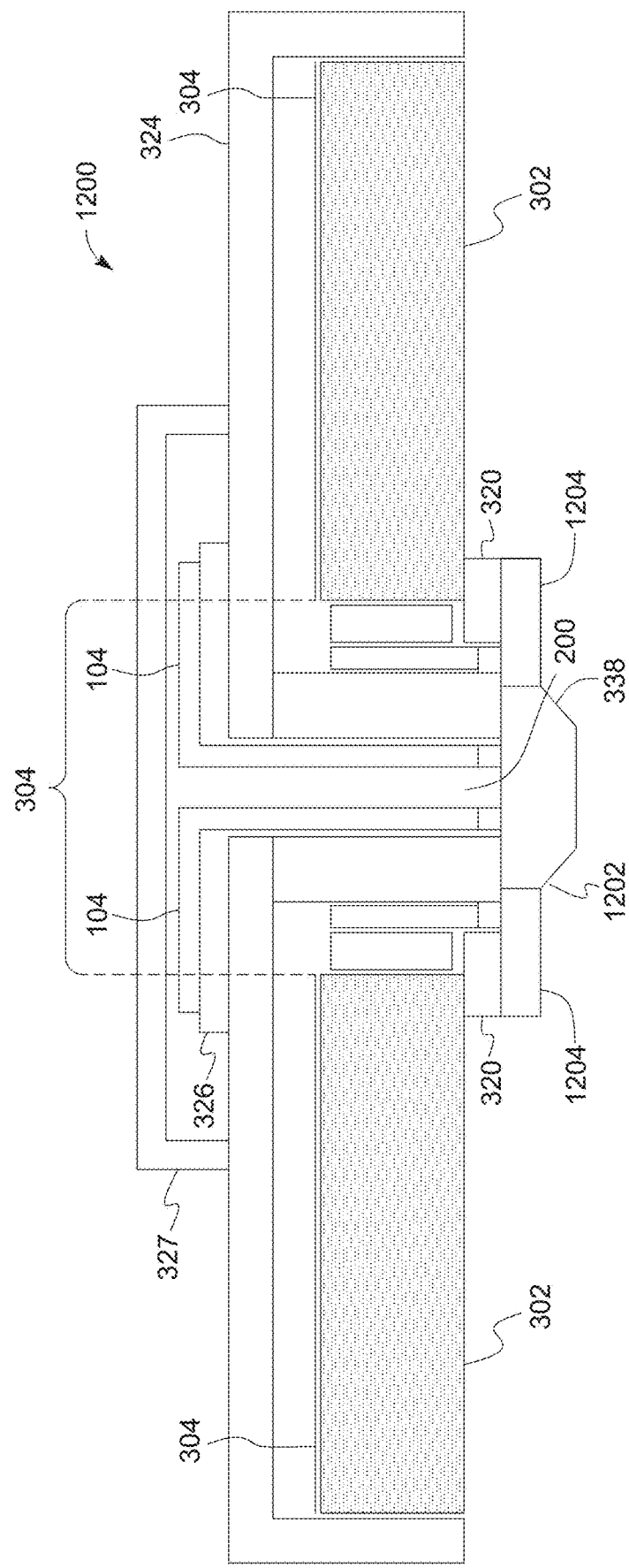
FIG. 12 is a cross-sectional side view of yet another example of a light fixture, according to aspects of the disclosure.

FIG. 12 is a planar cross-sectional view of a light fixture 1200, according to aspects of the disclosure. The light fixture 1200 differs from the light fixture 300 of FIG. 3 in that in it includes a cap assembly 1202 in place of the cap 306. As illustrated, the cap assembly 1202 may include a frame 1204 and a motion sensor 338 that is coupled to the frame 1204. The motion sensor 338 may be operatively coupled to at least one controller (not shown) that is part of the light fixture 1200. As discussed above with respect to FIG. 3, the controller may be configured to receive a signal that is generated using the motion sensor 338 and turn on or otherwise change the state of the light fixture 1200 when a level of the signal crosses a threshold.

FIG. 13A is a planar cross-sectional view of a light fixture 1300, according to aspects of the disclosure. The light fixture 1300 differs from the light fixture 300 of FIG. 3 in that in it includes a cap assembly 1302 in place of the cap 306, which is arranged to allow a light sensor 336, as shown in FIG. 5, to detect ambient light in the vicinity of the light fixture 300. As illustrated, the cap assembly 1302 may include a frame 1306 and a light-transmissive portion 1308 that is coupled to the frame 1306. The light-transmissive portion 1308 may be made of any suitable type of light-transmissive material, such as glass or plastic. In some implementations, the light transmissive portion 1308 may include a window. Additionally or alternatively, in some implementations, the light-transmissive portion 1308 may include a lens. The light sensor 336, in some implementations, may include a photodiode or a charge-coupled device (CCD). Additionally or alternatively, in some implementations, the light sensor 336 may include or be proximate to a camera. The light sensor 336 may be disposed in the opening 206 of the illumination source 200, such that at least some of light passing through the light-transmissive portion 1308 of the cap assembly 1302 reaches the light sensor 336. The light sensor 336 may be operatively coupled to at least one controller (not shown) that is part of the light fixture 1200. As discussed above with respect to FIG. 3, the controller may be configured to receive a signal that is generated using the light sensor 336 and turn on or otherwise change the state of the light fixture 1300 when the level of the signal crosses a threshold.

In some implementations, the controller may be configured to track the position of a person or another object relative to the light fixture 1300 based on one or more signals (e.g., image signals) that are received from the light sensor 336. When the position is a first location relative to the light fixture 1300, the controller (not shown) may activate a first preset, as described herein, thereby causing the light fixture 1300 to output light having a first distribution pattern. When the position at a second location relative to the light fixture 1300, the controller (not shown) may activate a second preset, thereby causing the light fixture 1300 to output light having a second distribution pattern. The first location may be different from the second location, and the first distribution pattern may be different from the second distribution pattern.

Figure 13B:
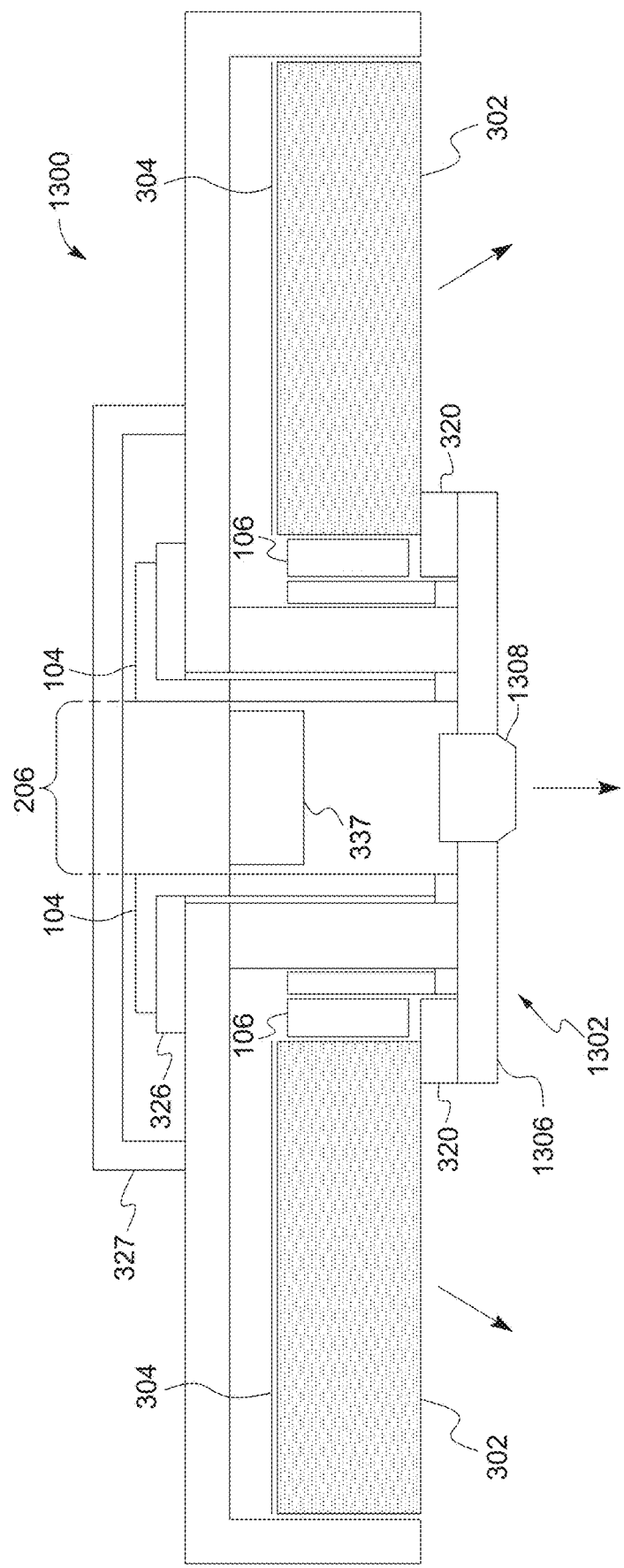
FIG. 13B is a cross-sectional side view of yet another example of a light fixture, according to aspects of the disclosure.

FIG. 13B is a planar cross-sectional view of a light fixture, according to aspects of the disclosure. The light fixture 1300 differs from the light fixture 300 of FIG. 13A in that the cap assembly 1302 is arranged to transmit light from another LED strip 337. The light-transmissive portion 1308 may be made of any suitable type of light-transmissive material, such as glass or plastic. In some implementations, the light transmissive portion 1308 may include a window. Additionally or alternatively, in some implementations, the light-transmissive portion 1308 may include a lens. The additional LED strip 337 may be disposed in the opening 206 of the illumination source 200, such that at least some of light passing through the light-transmissive portion 1308 of the cap assembly 1302 reaches the environment. The additional LED strip 337 may be operatively coupled to at least one controller (not shown) that is part of the light fixture 1200. As discussed above with respect to FIG. 3, the controller may be configured to receive a signal and change the state of the additional LED strip 337.

Thus, as shown, the front bezel-cap assembly 1302, or a bezel-ring may support a lens or a window or a motion sensor, hide the direct light from the LEDs and include mechanical threaded bosses into which screws are used to mechanically close the light engine and compress the gasket that may be present at that location. The cap may be a translucent material to allow part of the LEDs direct light to be extracted directly. A collimating film can be inserted between LEDs and light guide panel to tighten the beams and increase angular resolution if desired.

Figure 14:
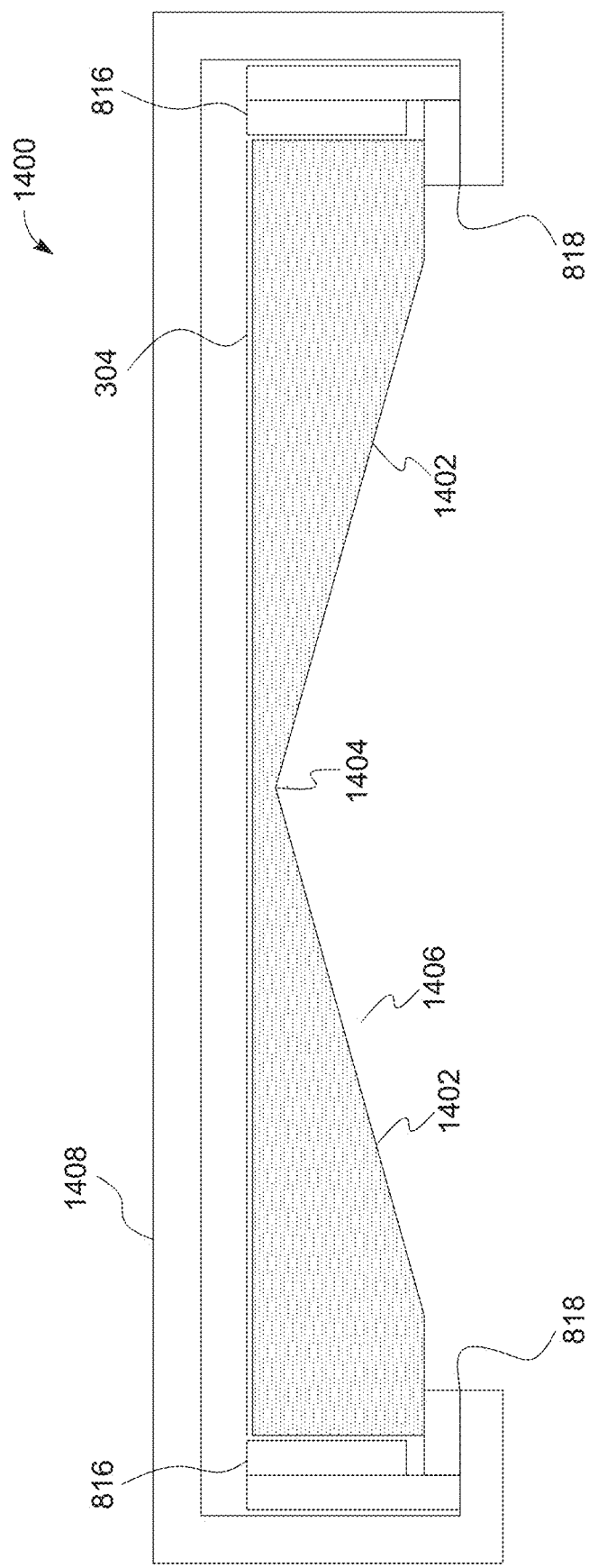
FIG. 14 is a cross-sectional side view of yet another example of a light fixture, according to aspects of the disclosure.

FIG. 14 is a planar cross-sectional view of a light fixture 1400, according to aspects of the disclosure. The fixture 1400 is similar to the fixture 800 of FIG. 8, and includes a concave light guide 1402 that provides high batwing beam angles. As illustrated, the concave light guide 1402 may lack a central opening with the centrally located illumination source 200, as shown in FIG. 8, and may instead have a recess 1404 formed thereon. The recess 1404 may have a triangular cross-section or another applicable cross-section as discussed in relation to FIG. 8. In some implementations, the recess 1404 may include a surface 1406 that defines the shape of cone. The vertex of the cone may be situated in the center of the light guide 1402 or at an off-center position. In some implementations, the light fixture 1400 may include a pan 1408 placed above the light guide 1402 such that it does not contain an internal opening, such as the internal opening 804 in FIG. 8.

Figure 15:
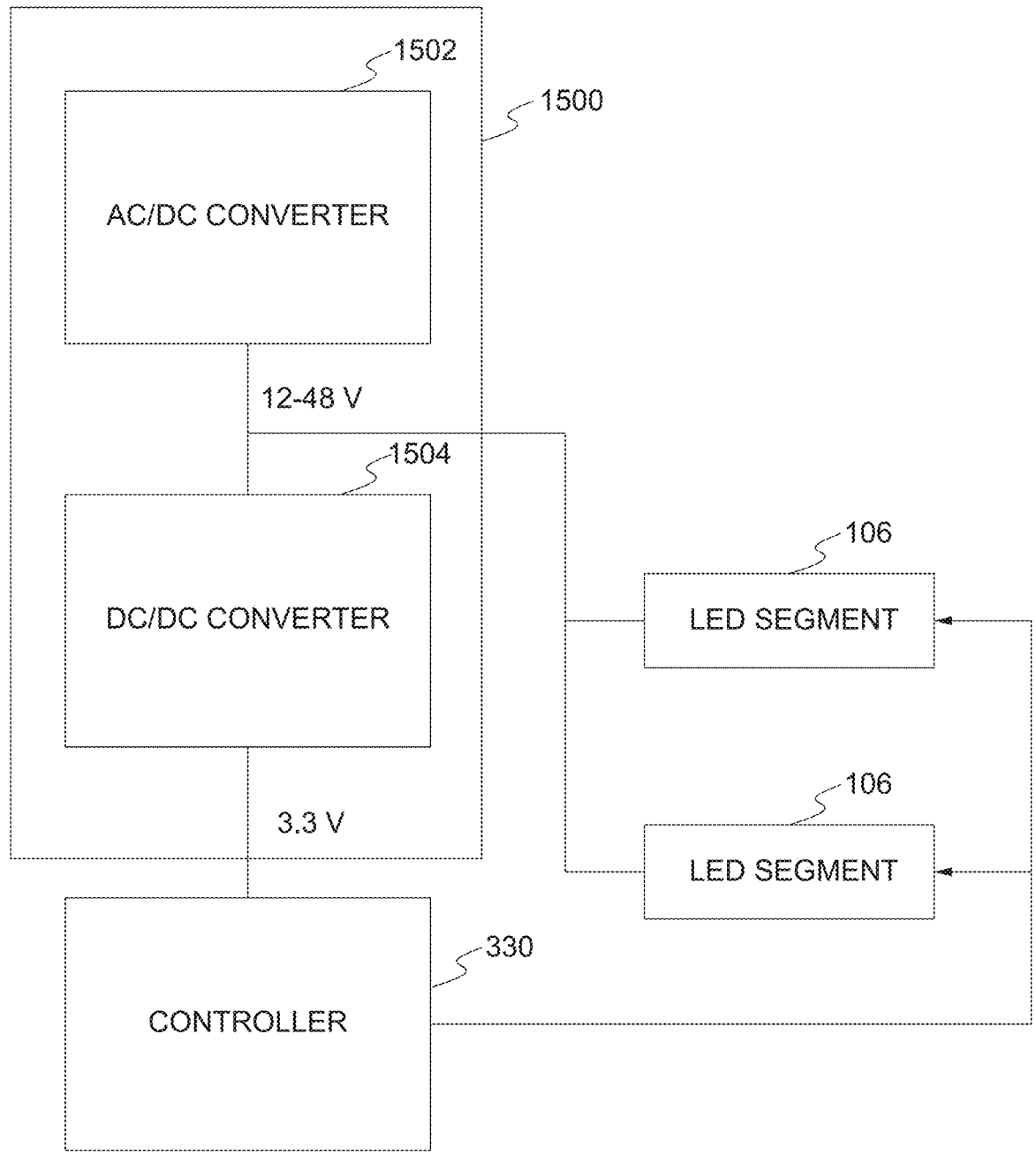
FIG. 15 is a diagram of an example of a driver circuit, in accordance with one possible electrical layout of a light fixture.

FIG. 15 is a diagram of an example driver circuit 1500, in accordance with one possible electrical layout of the light fixtures disclosed herein. As illustrated, the driver circuit 1500 may include an AC/DC converter 1502 that is configured to provide constant voltage to the LED segments 106 and a DC/DC converter 1504. The DC/DC converter 1504 may be configured to reduce the voltage supplied by the AC/DC converter 1502 and feed the reduced voltage to the controller 330 and/or other components of the light fixtures disclosed herein. The LED segments 106 are each supplied with a fixed peak current that is pre-programmed by a constant current regulator. The controller 330 may be configured to receive user input via any applicable input mechanism such as a wireless interface or an input device, select a duty cycle based on the input, and impart the selected duty cycle on current that is flowing across the LED segments 106. In the example of FIG. 15, the LED segments 106 are matched to one another (equal resistances) and the forward voltage of the LEDs in each of the LED segments 106 may be 1-2V below the voltage output by the AC/DC converter 1502. The use of a constant current regulator permits the controller 330 to individually control the light intensity of each LED segment 106 using different duty cycles for the different LED segments 106. The duty cycle may be effected, for example, by pulse width modulation supplied to the LED segment driver.

Figure 16:
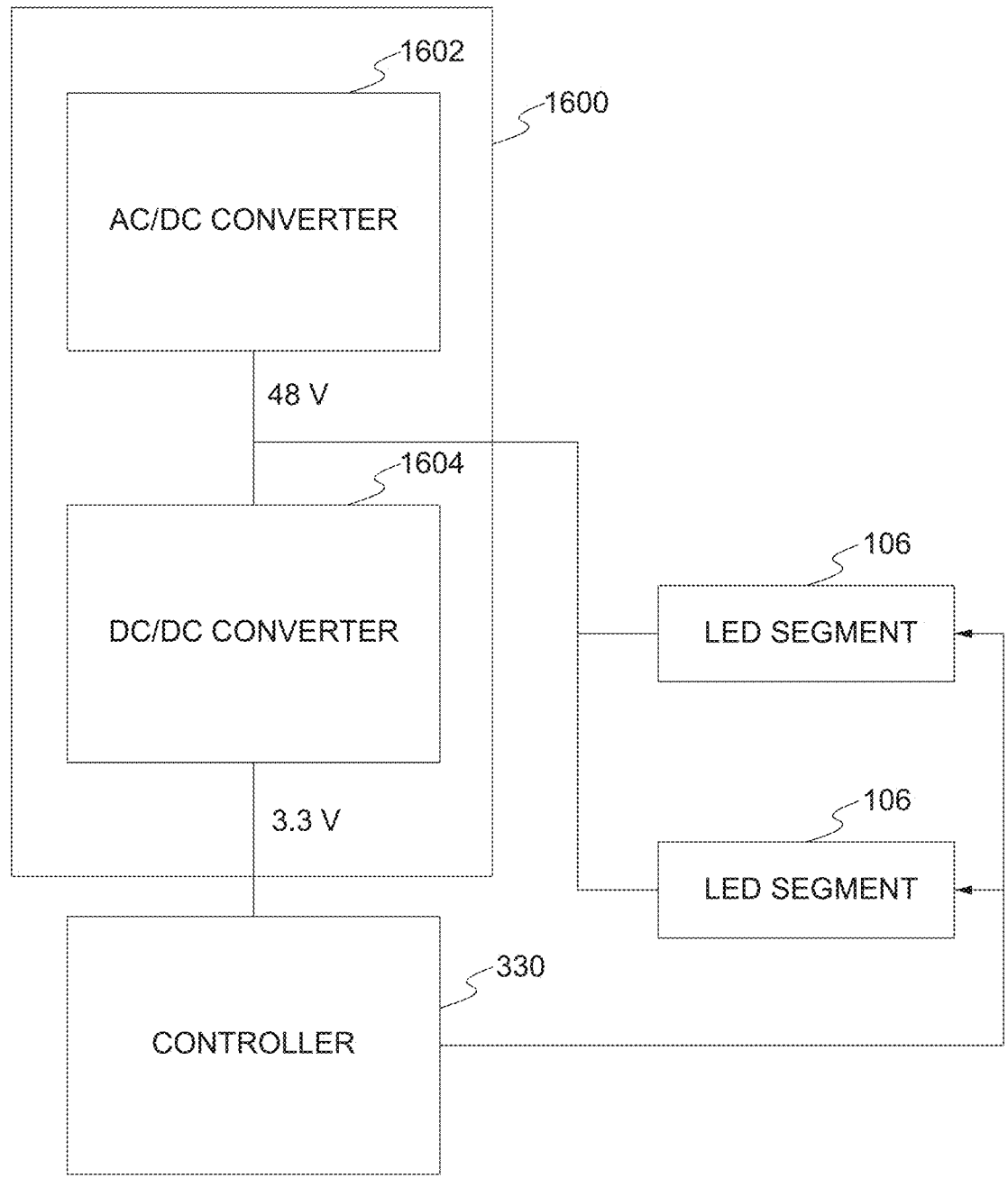
FIG. 16 is a diagram of another example of a driver circuit, in accordance with one possible electrical layout of a light fixture.

FIG. 16 is a diagram of an example driver circuit 1600, in accordance with another possible electrical layout of the light fixtures disclosed herein. As illustrated, the driver circuit 1600 may include an AC/DC converter 1602 that is configured to provide constant voltage to the LED segments 106 and a DC/DC converter 1604. The DC/DC converter 1604 may be configured to reduce the voltage supplied by the AC/DC converter 1602 and feed the reduced voltage to the controller 330 and/or other components of the light fixtures disclosed herein. In accordance with the example of FIG. 16, each of the LED segments 106 is provided with a different DC/DC converter that is used to power that LED segment 106. The controller 330 may be configured to receive user input via at least one of a wireless interface and an input device, select at least one of a peak current or duty cycle for any of the LED segments' 106 respective DC/DC converters. Afterwards, the controller 330 may impart the selected peak current(s) and/or duty cycle(s) on respective ones of the DC/DC converters. The use of individual DC/DC converters permits the controller 330 to individually control the light intensity of each LED segment 106 using different duty cycles for the DC/DC converters and/or by changing the peak current for the different LED segments 106.

Figure 17:
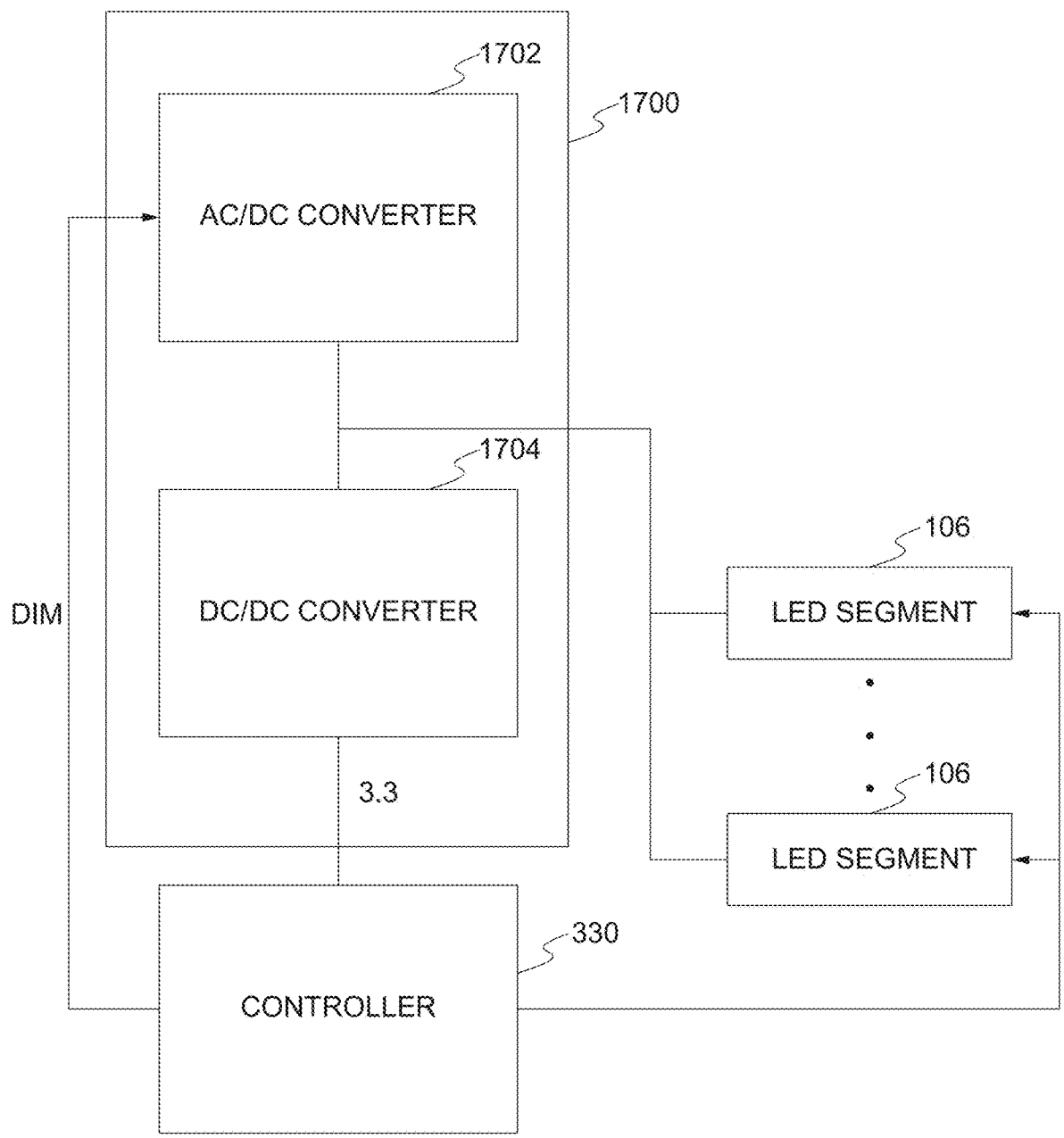
FIG. 17 is a diagram of yet another example of a driver circuit, in accordance with one possible electrical layout of a light fixture.

FIG. 17 is a diagram of an example driver circuit 1700, in accordance with yet another possible electrical layout of the light fixtures disclosed herein. As illustrated, the driver circuit may include an AC/DC converter 1702 that is configured to provide constant current to the LED segments 106 and a DC/DC converter 1704. The constant current provided to the LED segments 106 may be shared by the LED segments 106. As in the example of FIG. 15, the LED segments 106 are matched to one another. The DC/DC converter 1704 may be configured to reduce the voltage supplied by the AC/DC converter 1702 and feed the reduced voltage to the controller 330 and/or other components of the light fixtures disclosed herein. The controller 330 may be configured to receive user input, via any applicable input mechanism such as a wireless interface or an input device, and feed a dimming signal (DIM) to the AC/DC converter 1702 that is generated based on the user input. Based on the DIM, the AC/DC converter may change the value of the current output by the AC/DC converter 1702, thereby adjusting the constant current provided to the LED segments 106. Alternatively, or in addition, the duty cycle of each LED segments 106 may be changed. In this case, because all of the LED segments 106 share the same current, only one LED segment 106 may conduct current at a particular time. A time domain multiplexer may be used to effect this time divisioning.

Figure 18:
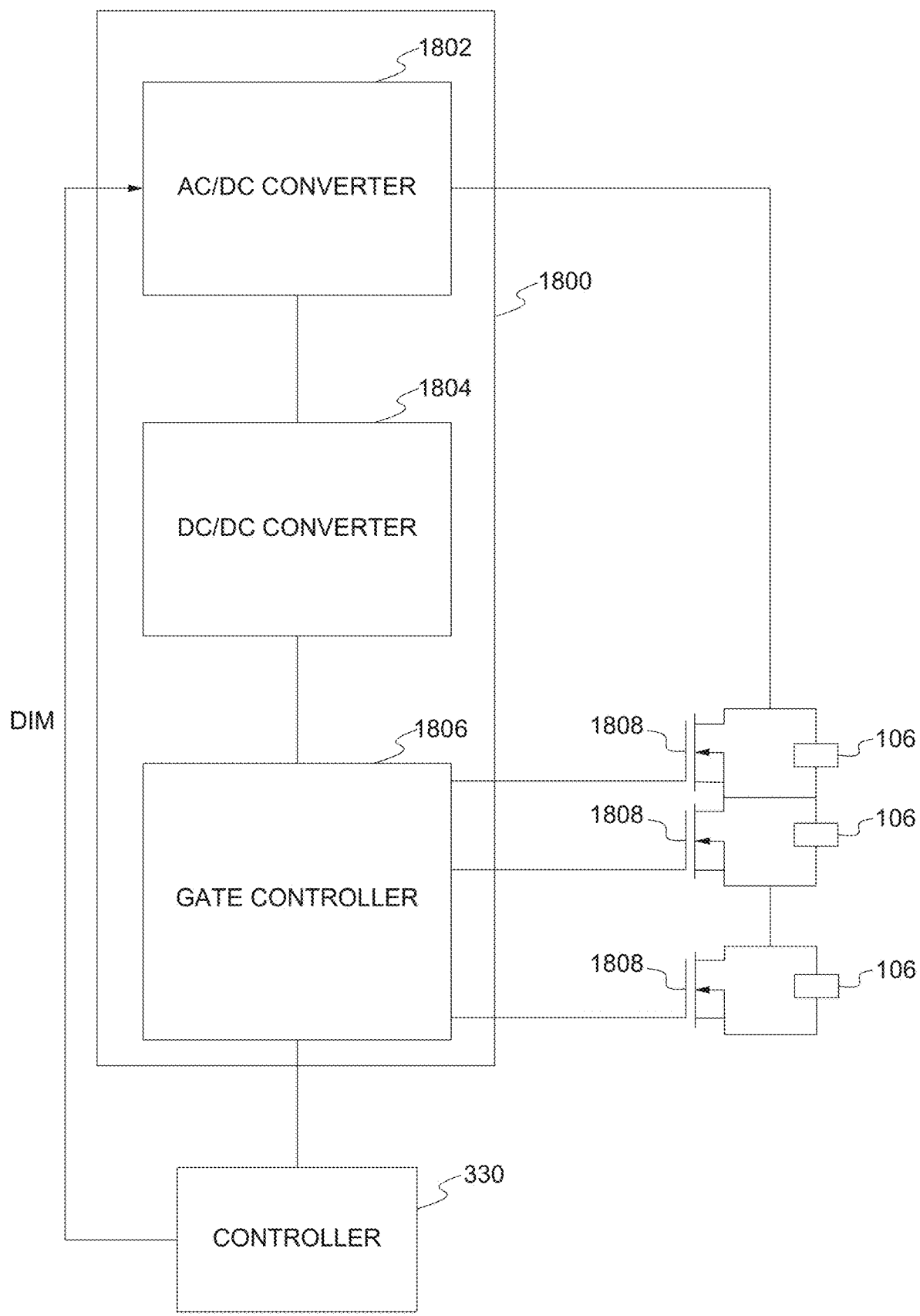
FIG. 18 is a diagram of yet another example of a driver circuit, in accordance with one possible electrical layout of a light fixture.

FIG. 18 is a diagram of an example of a driver circuit 1800, in accordance with yet another possible electrical layout of the light fixtures described herein. As illustrated, the driver circuit may include an AC/DC converter 1802 that is configured to provide constant current to a plurality of LED segments 106 and a DC/DC converter 1804. The DC/DC converter 1804 may configured to reduce the voltage supplied by the AC/DC converter 1802 and feed the reduced voltage to the controller 330 and/or other components of the light fixture 300. The controller 330 may be coupled to the LED segments 106 via a gate controller 1806 and a plurality of shunt (bypass) switches 1808. Each of the switches 1808 may be configured to turn on and off a different one of the LED segments 106 as the LED segments 106 are in series with each other. In operation, the controller 330 may be configured to receive user input and cause the gate controller 1806 to change the duty cycle of one or more of the LED segments 106 based on the user input. Furthermore, based on the user input, the controller 330 may generate a signal DIM and feed that signal to the AC/DC converter 1802. Based on the DIM, the AC/DC converter 1802 may change the peak current of its output. Multiple LED segments 106 may be conducting at the same time if their shunt switches 1808 are not in the bypass mode.

Note that although the term constant current is used herein, the constant current is able to vary. That is, while current is being supplied to the LED segments or DC/DC converter, depending on the implementation, the current is constant. However, the current may change between different the LED segments or DC/DC converters.

Figure 19A:
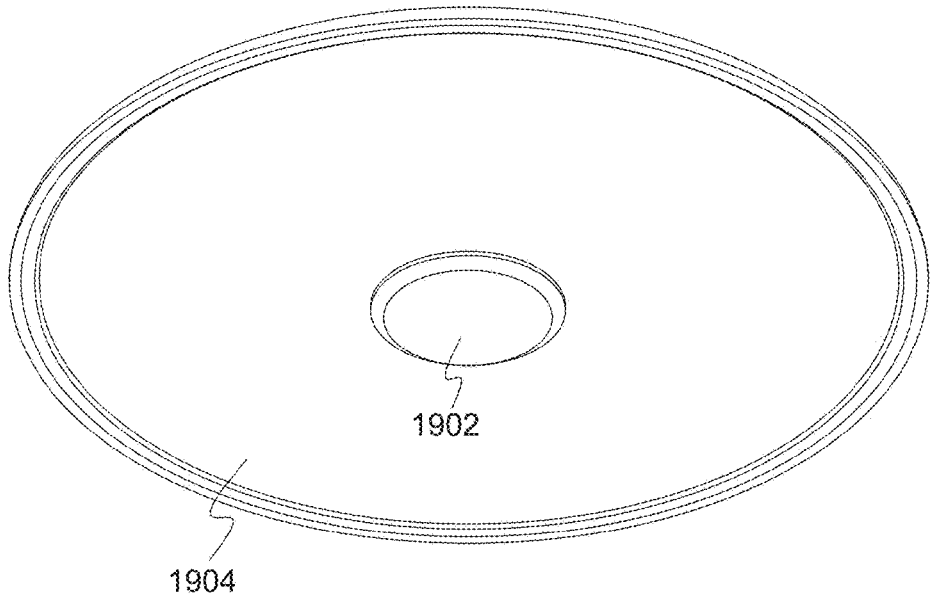
FIG. 19A is a diagram of a perspective view of an assembled light engine, in accordance with one possible electrical layout of a light fixture.
Figure 19B:
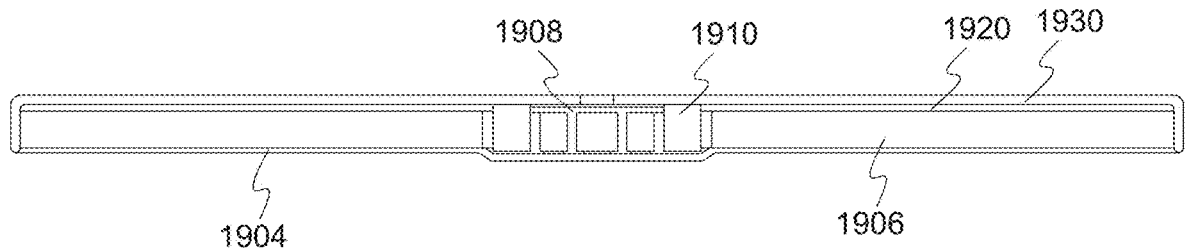
FIG. 19B is a diagram of a side view of the assembled light engine, in accordance with one possible electrical layout of a light fixture.

Alternate views of the light engine are shown in FIGS. 19A and 19B. FIG. 19A is a diagram of a perspective view of an assembled light engine, in accordance with one possible electrical layout of a light fixture. FIG. 19B is a diagram of a side view of the assembled light engine, in accordance with one possible electrical layout of a light fixture. FIG. 19A shows the light guide 1904 and a front bezel cap or motion sensor 1902. FIG. 19B shows the flexible circuit 1908 surrounded by a center supporting rod 1910. The reflector 1920 extends above the light guide 1906 and the heat dissipation element 1930 covers the entire structure, with an airgap between the light guide 1906 and the heat dissipation element 1930. The heat dissipation element 1930 may extend to cover the sides of the structure to protect against moisture ingress, in cooperation with a sealant, such as glue or a gasket. Another sealant may be used to seal the front bezel cap or motion sensor 1902. A collimating film may be present between the LEDs and the light guide 1906.

Figure 19C:
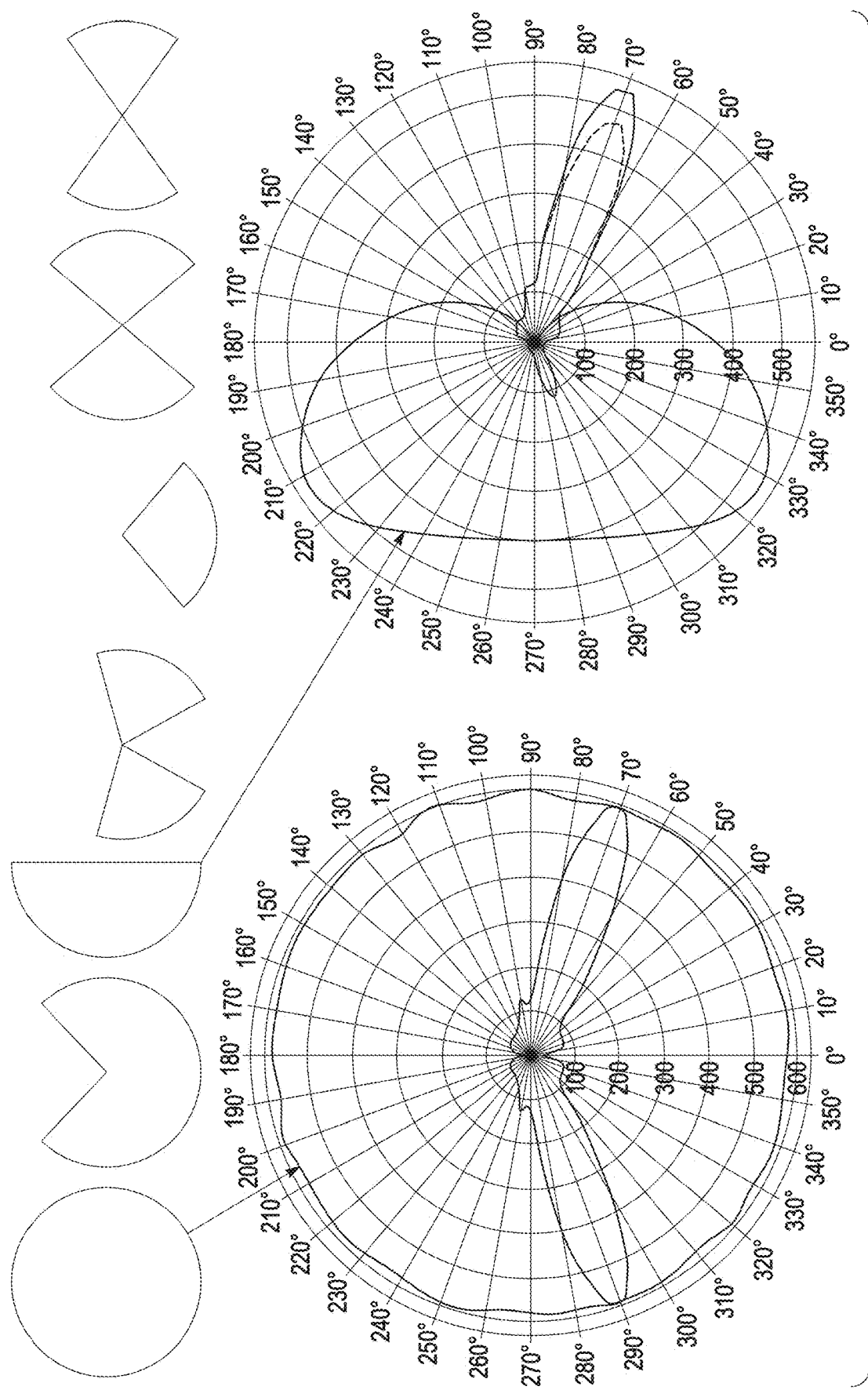
FIG. 19C are luminance distributions, in accordance with some aspects of the disclosure.

FIG. 19C are luminance distributions, in accordance with some aspects of the disclosure. The figures at the top show possible dynamically controlled activation/deactivation patterns of the LEDs (for an octagonal LED structure), with the luminance distributions of some of the LEDs shown. The luminance distributions shown are for activation of all LEDs and for only half activated in a semicircle.

Figure 21:
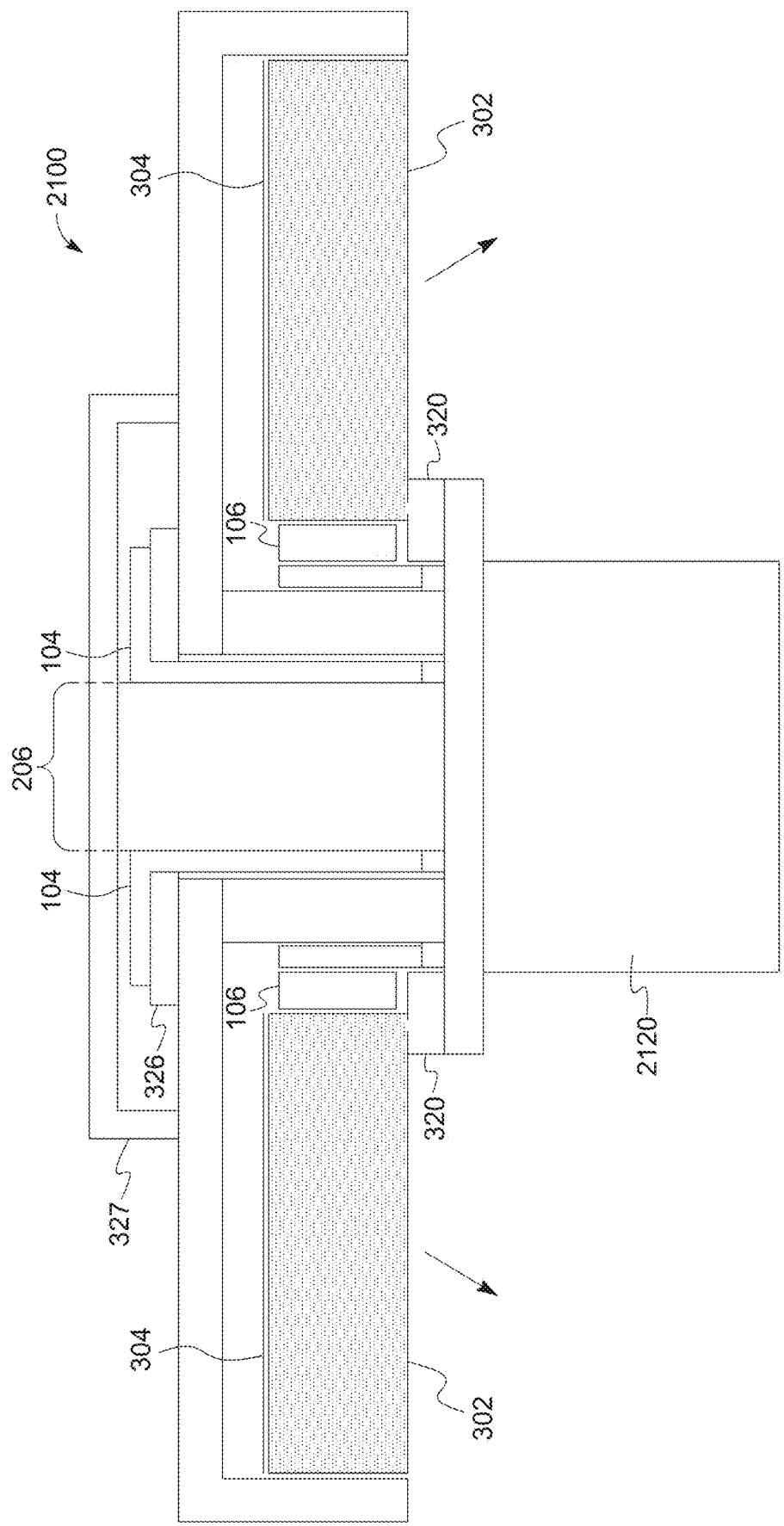
FIG. 21 is a planar cross-sectional view of a light fixture 2100, according to aspects of the disclosure.

FIG. 21 shows a planar cross-sectional side view of a light fixture of FIG. 3, according to aspects of the disclosure. This structure is similar to that of FIG. 7A, with the addition of an underlying support. As illustrated, the pan 324 may have a top surface 312 and a sidewall 314. In the present example, the outer edge 344 of the light guide 302 is covered completely by the sidewall 314 of the pan 324. However, in some implementations, the length L of the sidewall may be less than the thickness T of the light guide 302, such that the outer edge 344 of the light guide 302 is only partially covered by the sidewall 314 of the pan 324. Furthermore, alternative implementations are possible in which sidewall 314 of the pan 324 is altogether omitted. The pan 324 may comprise any applicable material such as aluminum and may act as a heat sink, as further disclosed herein. The light fixture 2100 may be disposed on a post 2120, such as a lamp post. As above, in some embodiments, rather than the opening extending completely through the base 202 to above the PCB 326, the opening may terminate within the base 202, and the terminal portions of the legs 104 of the flexible PCB remain unbent. Wires that extend from the post 2120 may provide the control signals to the LED segments via the flexible PCB.

Figure 22:
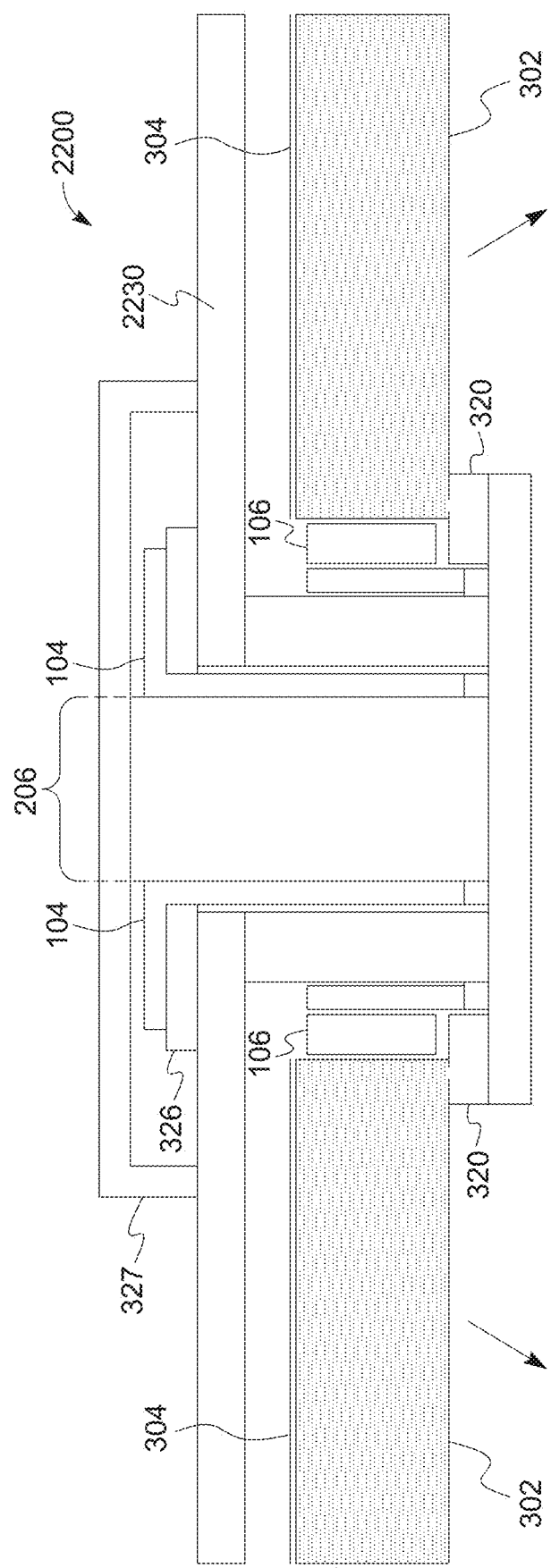
FIG. 22 is a planar cross-sectional view of a light fixture 2200, according to aspects of the disclosure.

FIG. 22 shows a planar cross-sectional side view of a light fixture of FIG. 3, according to aspects of the disclosure. This light fixture 2200 is similar to that of FIG. 7A, with the pan 324 being modified. As illustrated, the pan 324 may have a top surface 312 but not a sidewall 314. Thus, the outer edge 344 of the light guide 302 is not covered by the pan 324 and the outer edge 344 of the light guide 302 is exposed to the environment.

Figure 23:
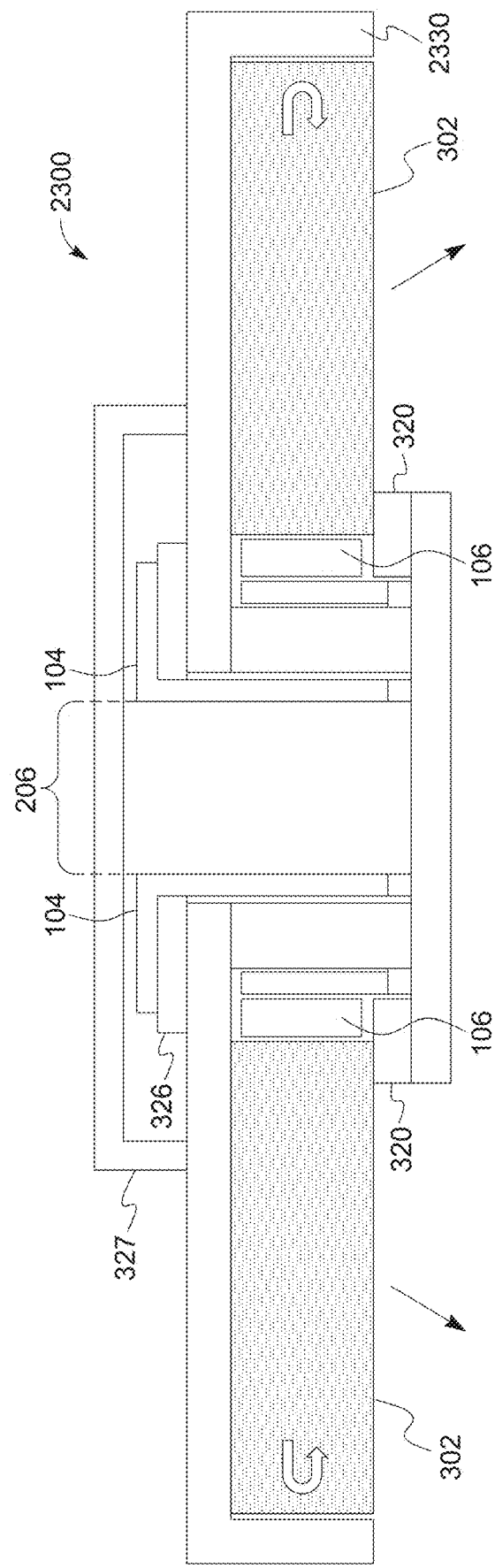
FIG. 23 is a planar cross-sectional view of a light fixture 2300, according to aspects of the disclosure.

FIG. 23 shows a planar cross-sectional side view of a light fixture of FIG. 3, according to aspects of the disclosure. This light fixture 2300 is also similar to that of FIG. 7A, with the pan 324 being modified. As illustrated, the pan 324 may have a highly reflective top surface 312 and a sidewall 314. Thus, the pan 324 may be used as a reflector without the need for an additional reflector.

Figure 24:
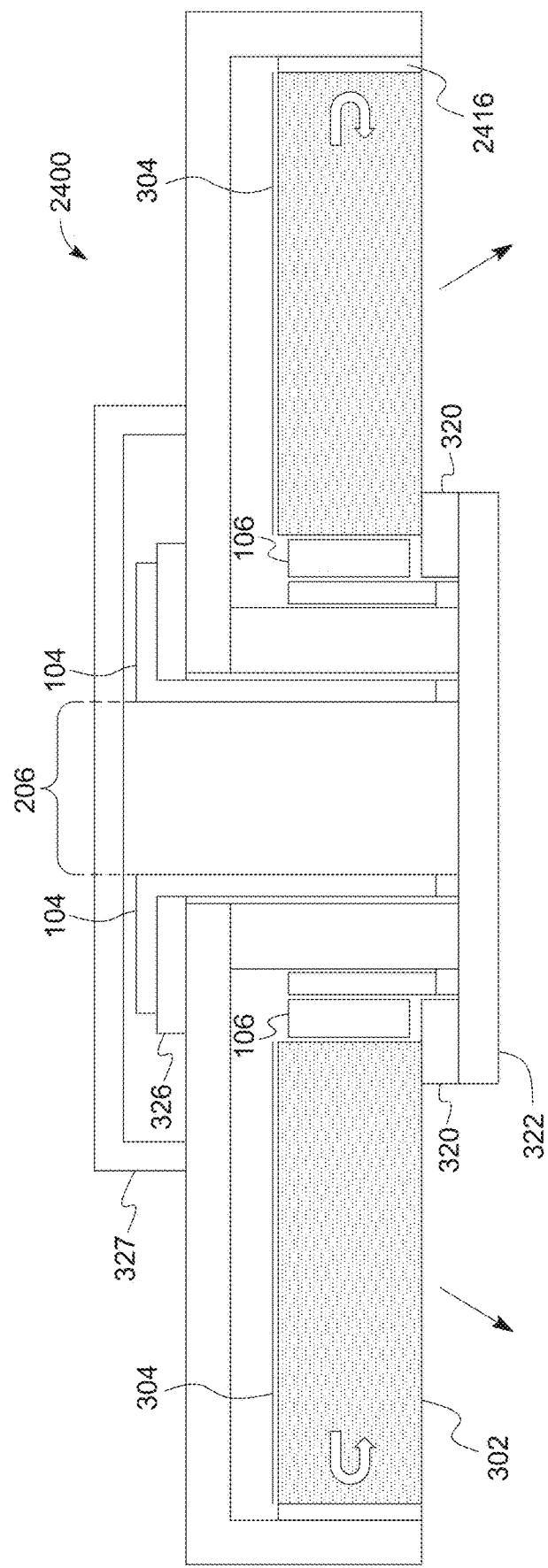
FIG. 24 is a planar cross-sectional view of a light fixture 2400, according to aspects of the disclosure.

FIG. 24 is a planar cross-sectional view of a light fixture, according to aspects of the disclosure. The light fixture 2400 differs from the light fixture 300 of FIG. 3 in that in it includes a reflective gasket 2416 disposed between the pan sidewall 314 and the light guide 302.

Figure 25:
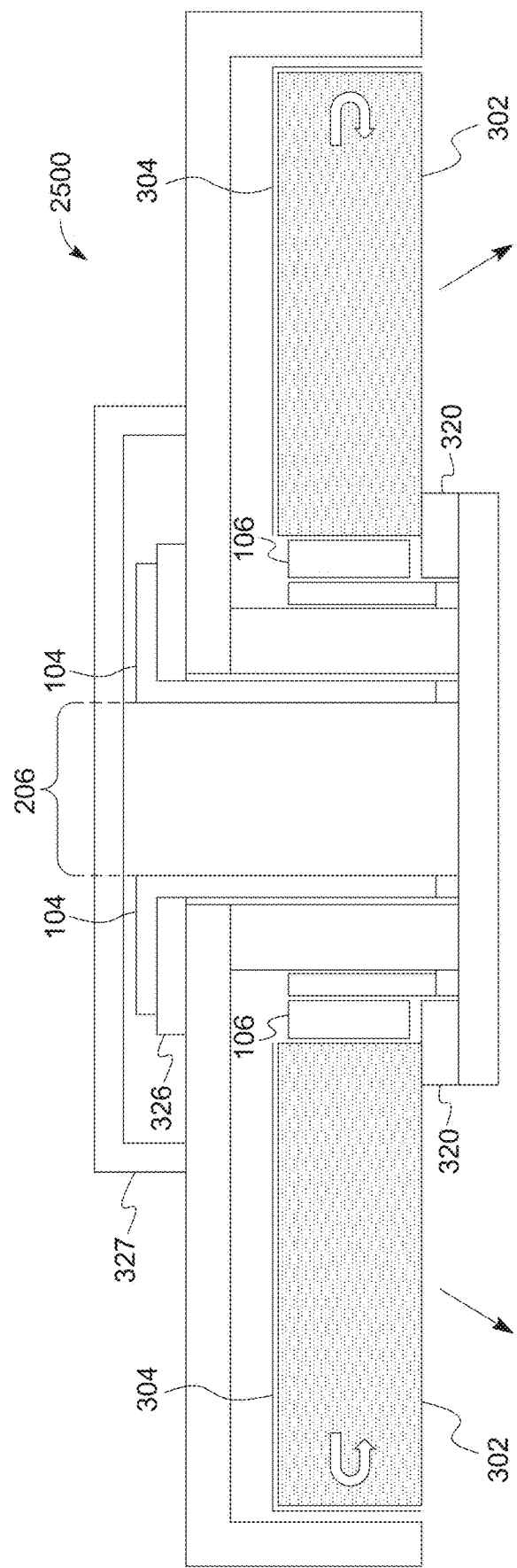
FIG. 25 is a planar cross-sectional view of a light fixture 2500, according to aspects of the disclosure.

FIG. 25 is a planar cross-sectional view of a light fixture, according to aspects of the disclosure. The light fixture 2500 differs from the light fixture 300 of FIG. 3 in that in the reflector 304 extends over the outer edge of the light guide 302 and is disposed between the pan sidewall 314 and the outer edge of the light guide 302.

Figure 26:
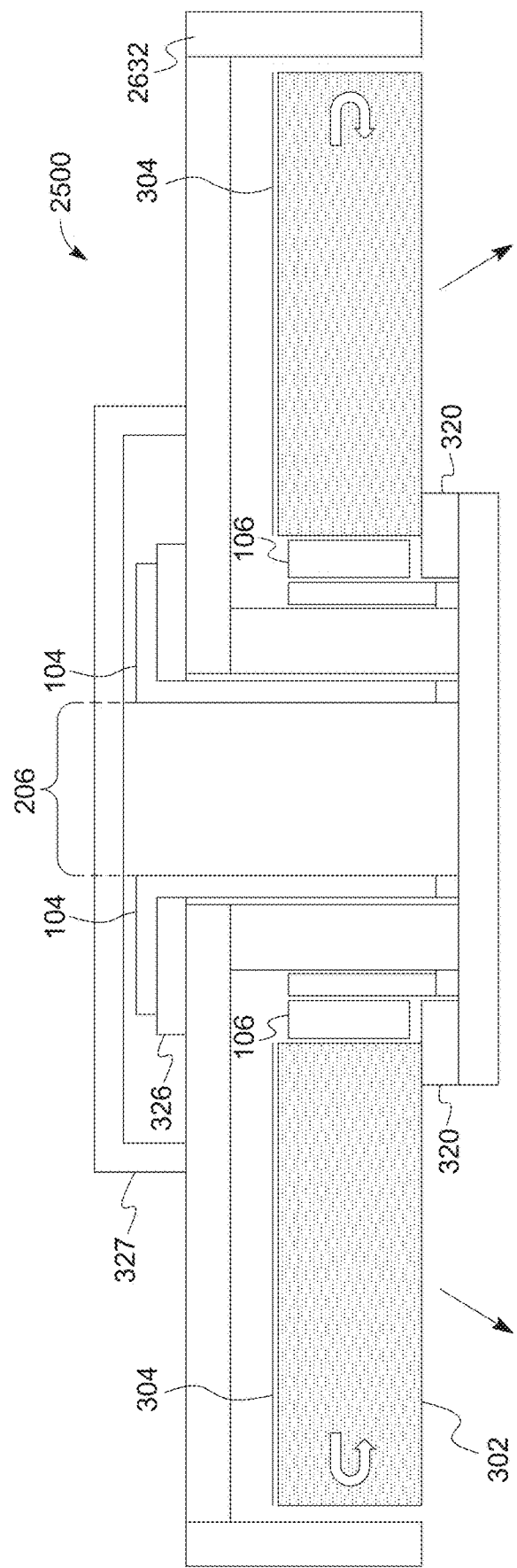
FIG. 26 is a planar cross-sectional view of a light fixture 2600, according to aspects of the disclosure.

FIG. 26 shows a planar cross-sectional side view of a light fixture of FIG. 3, according to aspects of the disclosure. This light fixture 2600 is similar to that of FIG. 7A, with the pan 324 being modified. As illustrated, the pan 324 may have a top surface 312 but not a sidewall 314. Instead, the reflective gasket 2632 is attached to an outer edge of the pan 324 and extends to cover the outer edge of the light guide 302 without extending under the light guide 302.

Figure 27:
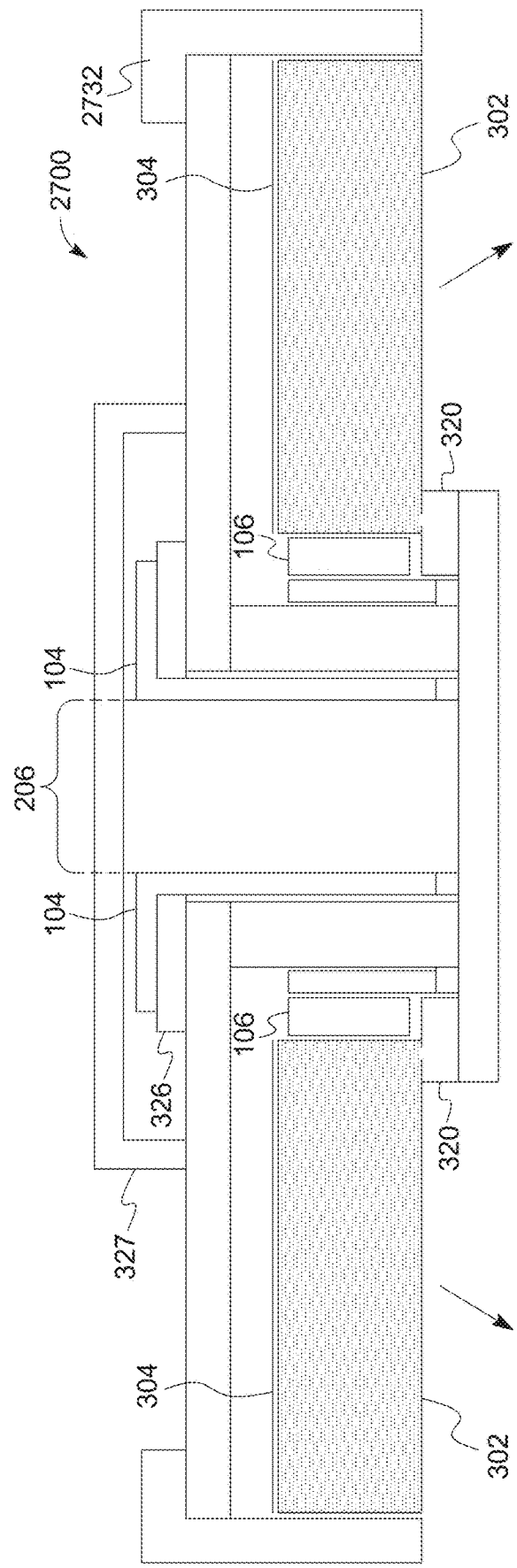
FIG. 27 is a planar cross-sectional view of a light fixture 2700, according to aspects of the disclosure.

FIG. 27 shows a planar cross-sectional side view of a light fixture of FIG. 3, according to aspects of the disclosure. This light fixture 2700 is similar to that of FIG. 26, with the reflective gasket 2732 being modified. As illustrated, the reflective gasket 2632 again extends to cover the outer edge of the light guide 302 without extending under the light guide 302. In this case, however, the reflective gasket 2732 has an overhang (is formed in an "L" shape) so that the reflective gasket 2732 also partially covers the upper surface of the light guide 302.

Figure 28:
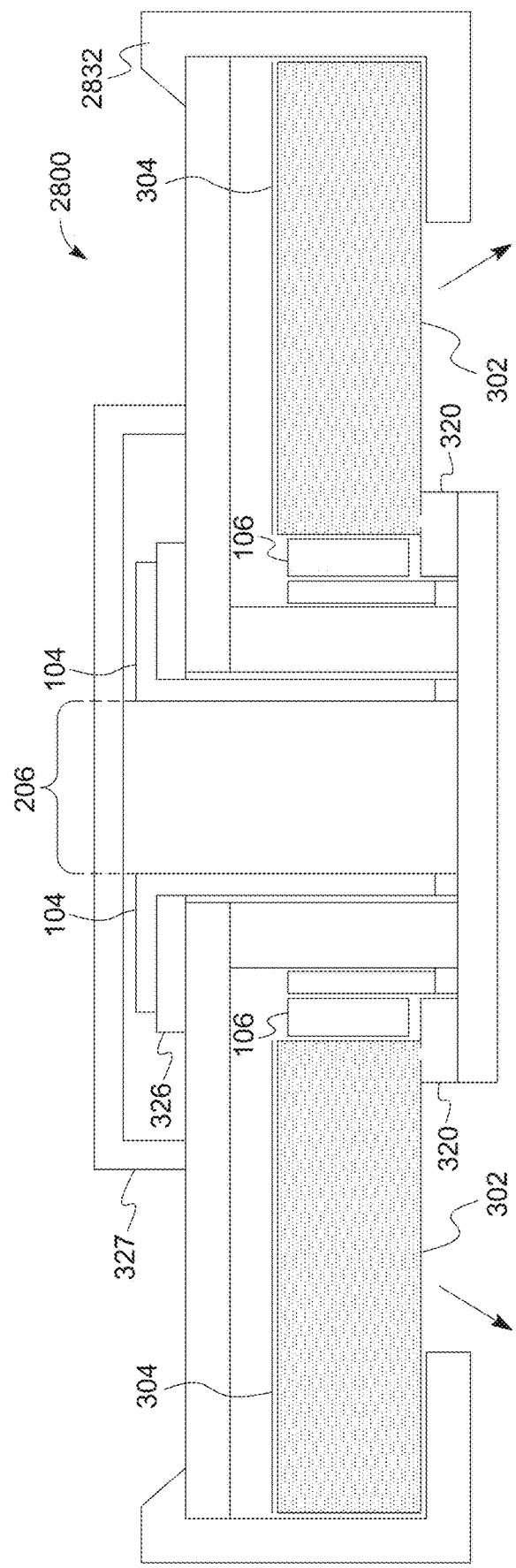
FIG. 28 is a planar cross-sectional view of a light fixture 2800, according to aspects of the disclosure.

FIG. 28 shows a planar cross-sectional side view of a light fixture of FIG. 3, according to aspects of the disclosure. This light fixture 2800 is similar to that of FIG. 27, with the reflective gasket 2632 again being modified. As illustrated, the reflective gasket 2832 again extends to cover the outer edge of the light guide 302, but this time extends under the light guide 302. In addition, the reflective gasket 2832 has a bezeled overhang so that the reflective gasket 2832 also partially covers the upper surface of the light guide 302. The reflective gasket 2632 is thus formed substantially in an "C" shape.

Figure 29:
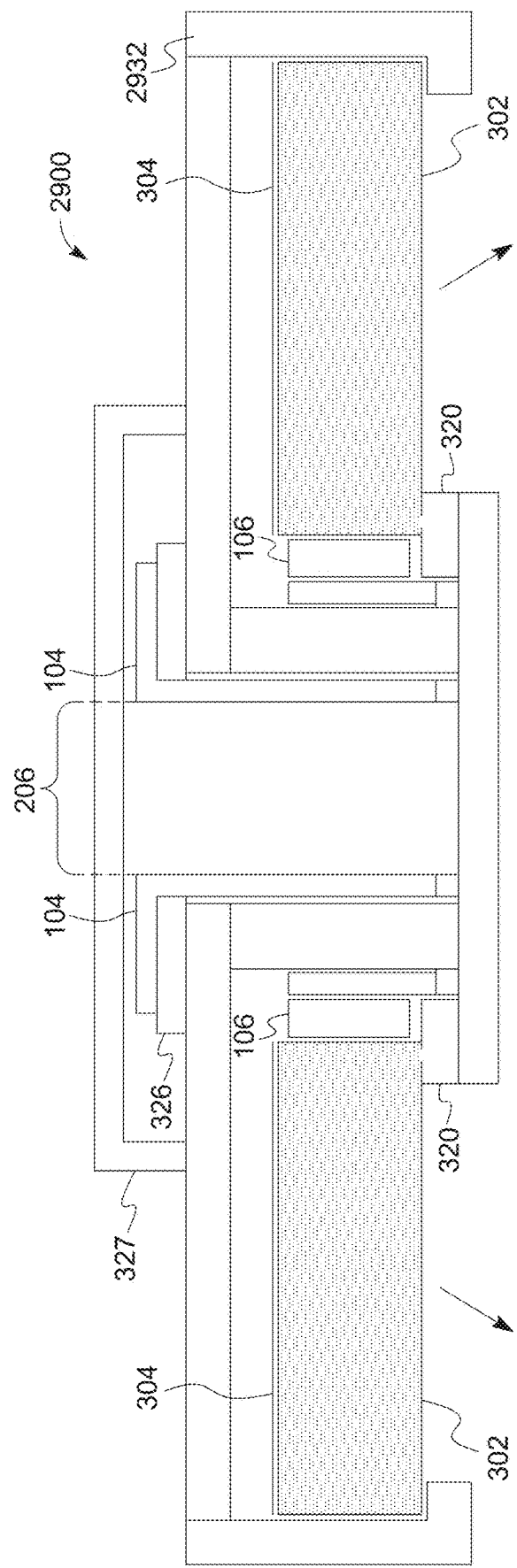
FIG. 29 is a planar cross-sectional view of a light fixture 2900, according to aspects of the disclosure.

FIG. 29 shows a planar cross-sectional side view of a light fixture of FIG. 3, according to aspects of the disclosure. This light fixture 2900 is similar to that of FIG. 28, with the reflective gasket 2632 again being modified. As illustrated, the reflective gasket 2932 is again formed in an "L shape", again extending to cover the outer edge of the light guide 302. In this embodiment, however, the reflective gasket 2932 extends under the light guide 302 but does not have an overhang.

Figure 30:
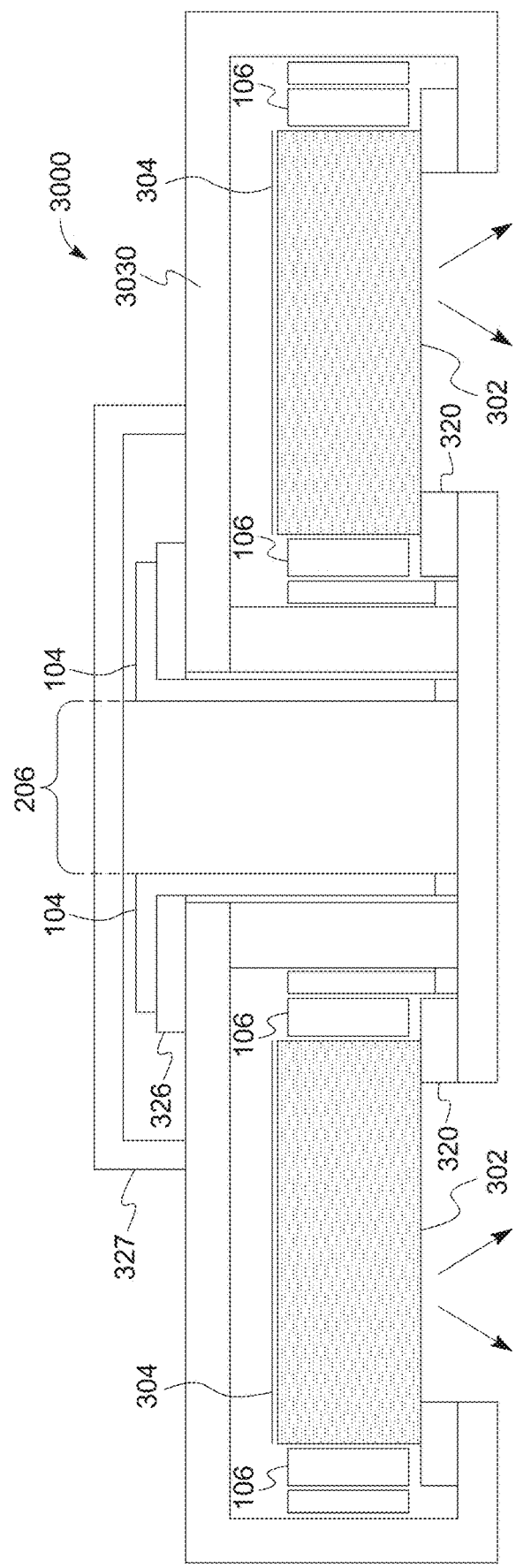
FIG. 30 is a planar cross-sectional view of a light fixture 3000, according to aspects of the disclosure.

FIG. 30 shows a planar cross-sectional view of a light fixture, according to aspects of the disclosure. The light fixture 300 differs from the light fixture 800 of FIG. 8 the light guide 302 has a substantially rectangular shape. Thus, unlike the light fixture 800 of FIG. 8, the light guide 802 does not contain a recess 806. Like the light fixture 800, multiple LED segments 106 are present—in the center and on an outer edge of the light guide 802. The pan 808 is provided with a lip to cover the outer edge LED strips 106.

Figure 31B:
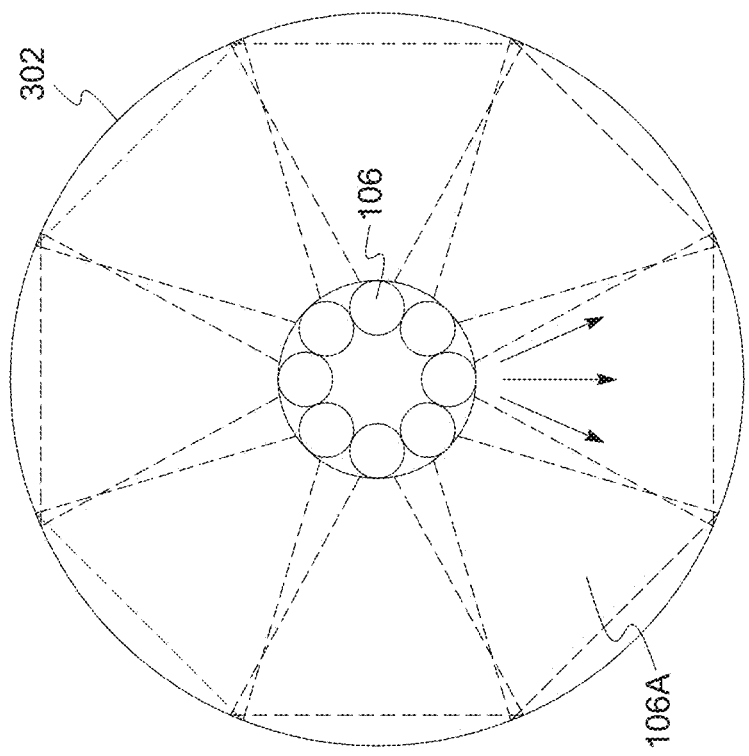
FIG. 31B is a top view of a center-lit configuration, according to aspects of the disclosure.
Figure 31A:
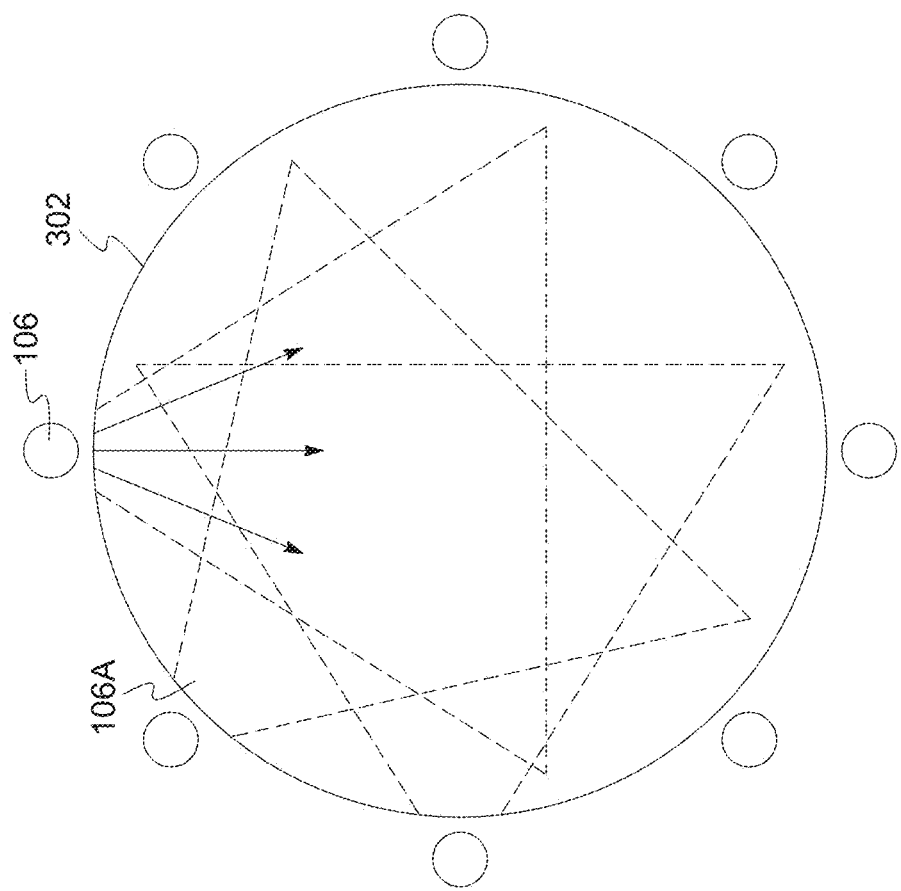
FIG. 31A is a top view of an edge-lit configuration, according to aspects of the disclosure.

FIG. 31A is a top view of an edge-lit configuration, according to aspects of the disclosure. As shown in FIG. 31A multiple LED segments 106 are disposed at an edge of a light guide 302. The LED segments 106 are disposed symmetrically having constant angular difference between adjacent LED segments 106. As can be seen, if an insufficient number of the LED segments 106 are active, the resulting light 106a in the light guide 302 may result in a non-uniform light distribution pattern. The use a greater number of LEDs, however, may increase the etendue/beam width.

FIG. 31B is a top view of a center-lit configuration, according to aspects of the disclosure. As shown in FIG. 31B, however, the use of LED segments 106 at the center of the light guide 302 may result in a more uniform, if narrower, distribution of the resulting light 106a.

As above, the interior of a vehicle (e.g., a car, a van, an SUV, a truck, a train, a plane, a cart, a ship, a boat, a recreational vehicle (RV), etc.) may be illuminated in accordance with implementations of the disclosed subject matter. A vehicle may generally refer to any means of transporting people or goods whether on land, air, water or other surface. The interior of a vehicle may include a lighting system which includes a light guide, such as the one or more light guides disclosed herein. The light guide plate may be shaped to illuminate different vehicle areas based on modification in light characteristics of the one or more independently addressable LED segments, as disclosed herein. The light guide plate may generate a light distribution that is any applicable shape such as a circular, oval, square, or rectangular shape. As disclosed herein, the light guide plate may have an inner surface that is configured or shaped to receive light from the plurality of independently addressable LED segments. The light guide plate may extend outward from the plurality of independently addressable LED segments and may be configured (e.g., shaped, arranged, positioned, etc.) to provide illumination from the plurality of independently addressable LED segments inside the vehicle.

The lighting system may include a light engine, as disclosed herein. The lighting system may be configured such that one or more lighting characteristics of different independently addressable LED segments are modified based on received information, as disclosed herein. As an example, the lighting system may illuminate a first vehicle area by activating an independently addressable LED segment based on information that the first area is occupied by an individual. The lighting system may dynamically update the illumination of the interior of the vehicle based one or more changes in the information provided to the lighting system.

Figure 34:
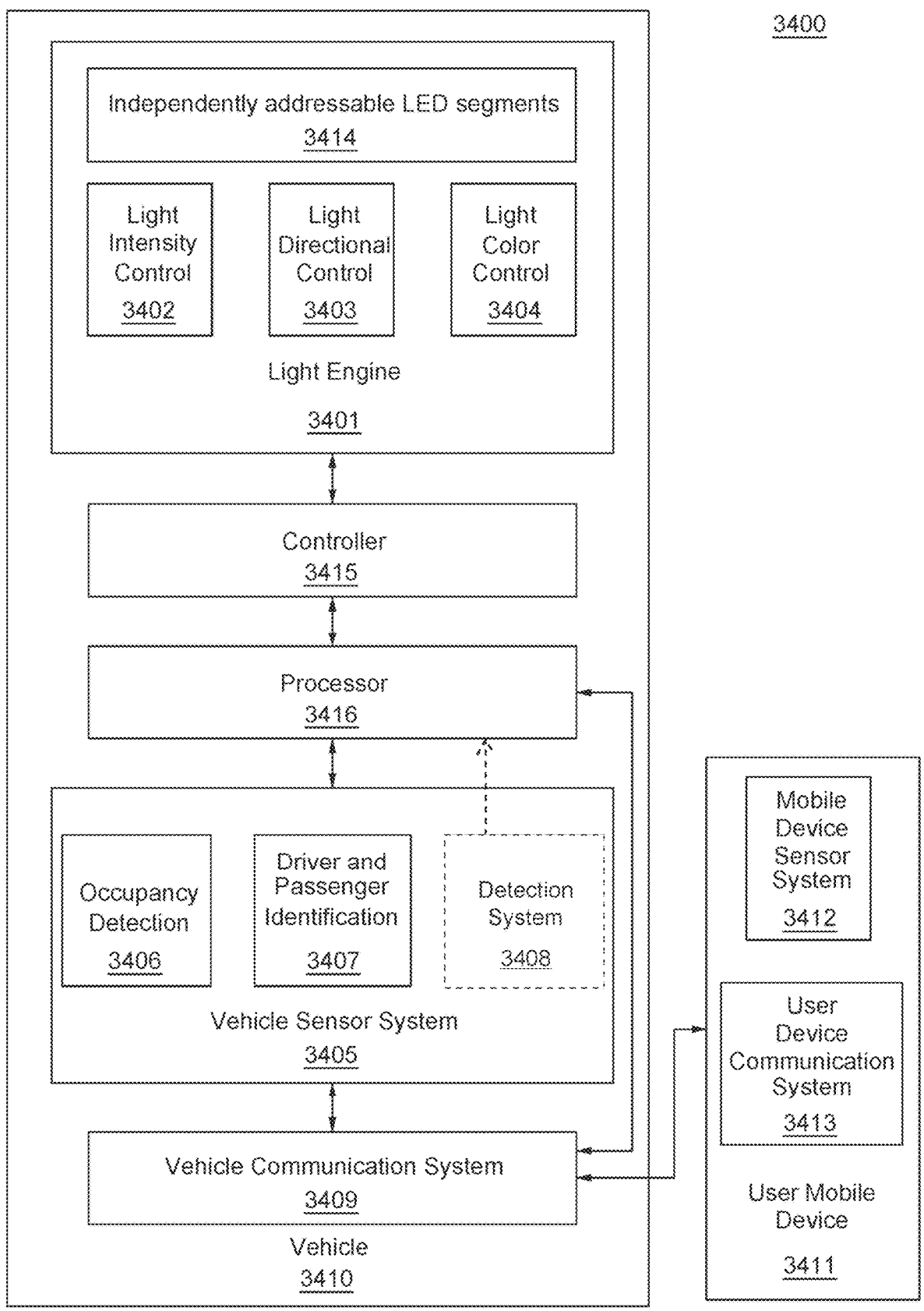
FIG. 34 is a diagram of a vehicle interior lighting system, according to aspects of the disclosure.

FIG. 34 shows a vehicle interior lighting system 3400 for a vehicle 3410 that includes a light engine 3401. The light engine 3401 may include a plurality of independently addressable LED segments 3414 and may also include a light intensity control module 3402, a light directional control module 3403, and a light color control module 3404. According to an implementation, the light intensity control module 3402, light directional control module 3403, and the light color control module 3404 may be external to the light engine and may, for example, be part of the controller 3415, processor 3416, or other external component. The controller 3415 may be configured to receive a signal from processor 3416 and may cause one or more light characteristics of light emitted via the light engine and/or a light guide plate that receives light emitted by the light engine. The processor 3416 may receive a information from either the vehicle sensor system 3405 or the vehicle communication system 3409 and may generate and provide a signal to the controller 3415 based on the information. The information may be one or more of image data, video data, and location-tracked image data, facial recognition data, face detection data, shape recognition data, machine learning data, computer vision data, weather data, environmental data, user profile data, and object location data. Further, the information may be based on one or more of occupancy detection, object detection, passenger detection, weight detection, pressure detection, driver and/or passenger identification via an image, an identifier, a mobile device, a user input, historical data, gaze detection, occupant positioning, a vehicle component and/or mode, or the like. Such information may be collected by an occupancy detection system 3406 and/or a driver and passenger identification system 3407 which may be part of the vehicle sensor system 3405 or may be collected by a detection system 3408 which may be part of the vehicle sensor system 3405 or may be external to the vehicle sensor system 3405. According to this implementation, the vehicle sensor system may include sensors and generate information based on vehicle specific components and a detection system may include sensors and generate information independent or partially independent of vehicle specific components. Further, the information may be an update to an object location from a previously detected or known object location. The processor 3416 may receive the information from a vehicle communication system 3409 which includes one or more sensors, profile information, vehicle component information (e.g., seat position, door position, steering wheel position, speed, ambient conditions, etc.). The vehicle communication system 3409 may be in communication with internal vehicle components and/or a user mobile device 3411 which includes a mobile device sensor system 3412 and/or a user device communication system 3413.

The light engine 3401 may include a plurality of independently addressable LED segments 3414 and each segment may include one or a plurality of LEDs. The LED segments 3414 may include a plurality of the same or similar LEDs or may include a group of LEDs that are different than each other. For example, an independently addressable LED segment may include a first LED configured to emit a first color and a second LED configured to emit a second color. The light engine 3401 may further include a flexible PCB having a base and a plurality of legs extending from the base, as disclosed herein. One or more of the plurality of legs extending from the base may be connected to one or more of the independently addressable LED segments 3414 such that a signal may traverse across a portion of a leg (e.g., via an integrated bus or electrical conductors) from a contact.

The light intensity control module 3402 may be configured to adjust the luminance provided by one or more independently addressable LED segments 3414 or the illuminance at a vehicle area. For example, the controller 3415 may provide a light control signal to the light intensity control module 3402 such that the light intensity control module 3402 subsequently provides a signal to the independently addressable LED segments 3414 via corresponding flexible PCB leg. The signal may cause one or more of the independently addressable LED segments to modify luminance intensity (e.g., increase intensity, decrease intensity, turn on/off LED segment, turn on/off one or more LEDs in an LED segment, etc.). As disclosed herein, although the light intensity control module 3402 is shown as part of the light engine 3401, it may be part of the controller 3415 or processor 3416.

The light directional control module 3403 may be part of the light engine 3401 or may be external to the light engine 3401 and be part of the controller 3415, processor 3416 or other external component. The light directional control module 3403 may be configured to adjust which independently addressable LED segments are activated or may communicate with the light intensity control module 3402 to adjust the intensity of one or more LED segments such that light is emitted in specific vehicle areas and/or in specific vehicle areas at a given intensity. For example, the controller 3415 may provide a light control signal to the light directional control module 3403 such that the light directional control module 3403 provides a signal to the independently addressable LED segments 3414 via corresponding flexible PCB leg. The signal may cause one or more of the independently addressable LED segments to activate or deactivate to steer light within the interior of the vehicle to a specific vehicle area.

The light color control module 3404 may be configured to adjust the color, temperature, or the like, provided by one or more independently addressable LED segments 3414. For example, the controller 3415 may provide a light control signal to the light color control module 3404 such that the light color control module 3404 provides a signal to the independently addressable LED segments 3414 via corresponding flexible PCB leg. The signal may cause one or more of the independently addressable LED segments to modify a color or related attribute of light emitted by the one or more independently addressable LED segments. As disclosed herein, although the light color control module 3404 is shown as part of the light engine 3401, it may be part of the controller 3415 or processor 3416.

A controller 3415 may be connected to the one or more legs that extend from a base of the flexible PCB via the one or more corresponding contacts on each leg. As disclosed herein, according to an implementation, the one or more legs may bend or may curve across multiple planes such that the controller 3415 may be in contact with the one or more legs on a different plane than the plane on which the corresponding independently addressable LED segments 3414 are located or attached to the one or more legs. The controller 3415 may be configured to generate and provide light control signals to modify one or more light characteristics of the one or more independently addressable LED segments 3414, as further disclosed herein. The controller 3415 may modify the one or more light characteristics by sending one or multiple light control signals to the one or more independently addressable LED segments 3414 via contacts on one or more legs in electrical contact with the one or more independently addressable LED segments 3414.

The controller 3415 may be an internal or external controller or microcontroller, and may convert incoming data (e.g., convert a processor provided signal such as serial control data, etc.) into lighting control signals such as Pulse Width Modulation (PWM) signals, and apply such signals to control the one or more independently addressable LED segments 3414. The controller 3415 may be a PWM generator and control the independently addressable LED segments 3414 based on one or more techniques that the controller may implement, such as, (Digital Multiplex)/ serial conversion to PWM, DALI (Digital Addressable Lighting Interface)/1-10V dimmer conversion to PWM, PWM generation, an unmodulated output, EIA/TIA-485 standard based output, or the like. According to an implementation, the controller 3415 may generate a first type of signal, such as a PWM signal with a first width to control a first light characteristic (e.g., brightness) and may generate a second type of signal, such as a PWM signal with a second width to control a second light characteristic (e.g., intensity).

The controller 3415 may modify the one or more light characteristics based on one or more signals received from a processor 3416. According to implementations, the controller 3415 and the processor 3416 may be the same component, may be housed in the same housing, or may be housed in separate housings. A housing may include a support structure having an outer surface, an inner surface, and/or a hole. The plurality of independently addressable LED segments may be attached to the base of a flexible PCB such that the base of the flexible PCB is positioned on the outer surface of the housing and the plurality of legs extend through the hole and over the inner surface, as disclosed herein.

The processor 3416 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), a state machine, and the like. The processor 3416 may perform signal coding, data processing, power control, input/output processing, and/or any other functionality that enables the light engine to operate in accordance with the subject matter disclosed herein.

Figure 32A:
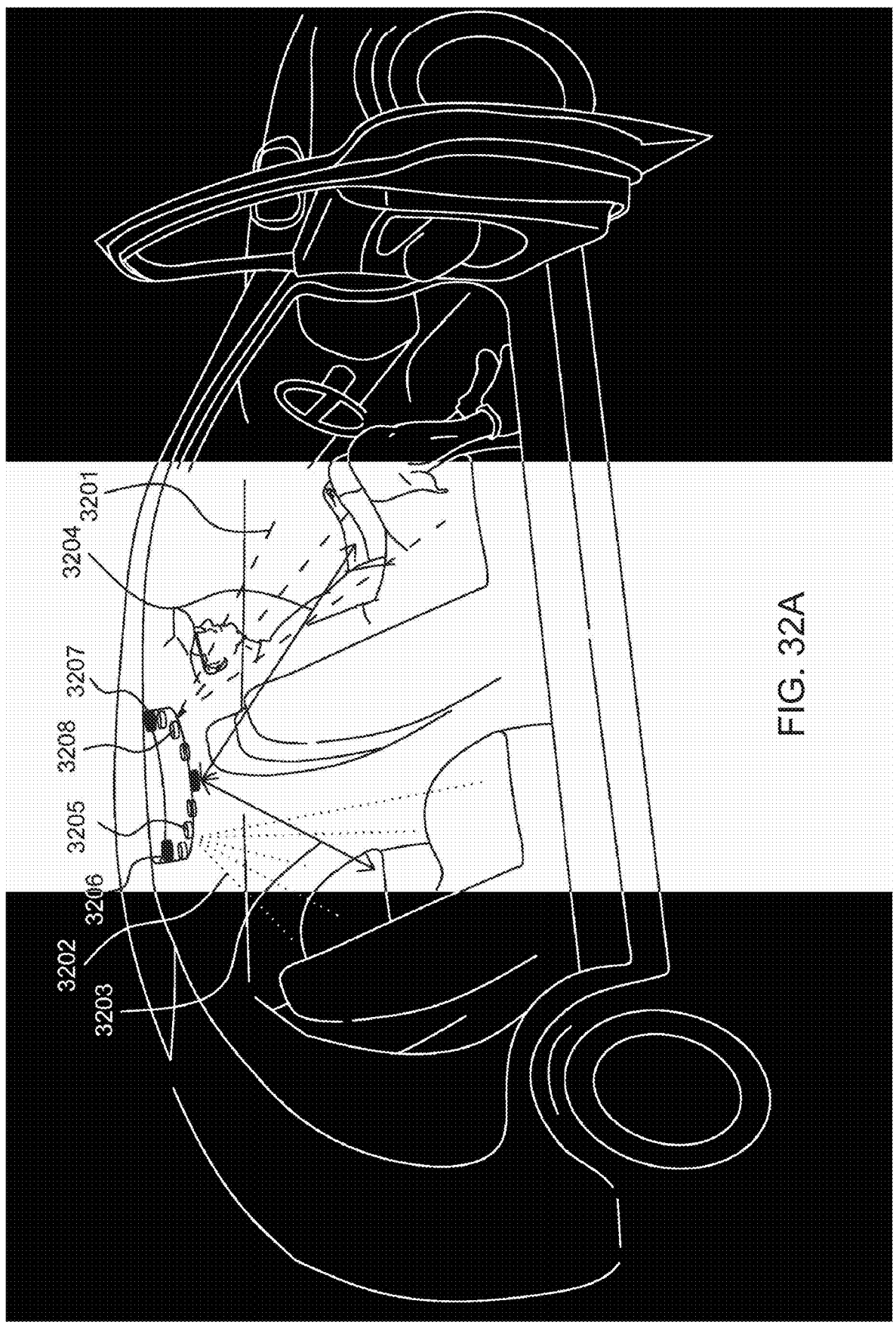
FIG. 32A is a cross sectional view of a light engine with dynamically controllable LED segments to illuminate the interior of a vehicle, according to aspects of the disclosure.

The vehicle sensor system 3405 may be housed in the same housing as the light engine 3401, as shown in FIG. 32A and further disclosed herein, or may be external to the light engine 3401. For example, the vehicle sensor system 3405 may be located within an opening in a light guide such that the opening also includes the light engine 3401. According to this example, the vehicle sensor system 3405 may be in a gap that is created inside of a plurality of the independently addressable LED segments 3414 that are part of the light engine 3401. As an example of an external vehicle sensor system 3405, a detection system 3408 may include a gaze sensor which may be located on the dashboard of a vehicle such that the sensor is in line of sight with a driver of the vehicle. The gaze detection sensor may send a first input signal to a processor 3416 that is located in the same housing as the light engine 3401 on the ceiling of the vehicle.

A vehicle sensor system 3405 may include one or more sensors (collectively referred to as a sensor), user input receivers, or the like, which may generate information based on one or more of occupancy detection, object detection, passenger detection, weight detection, pressure detection, (e.g., by occupancy detection module 3406), driver and/or passenger identification via an image, an identifier, a mobile device, a user input, historical data (e.g., by a driver and passenger identification module 3407), gaze detection and/or occupant positioning (e.g., by a detection system 3408), a vehicle component and/or mode, or the like, which are part of the vehicle sensor system 3405.

According to an implementation, the detection system 3408 may be external to the vehicle sensor system. According to this implementation, the detection system 3408 may not be part of a vehicle sensor system 3405 such that it may rely on one or more features of the vehicle sensor system 3405 to detect (e.g., sense, collect, gather) information. The detection system 3408 may provide information directly to the processor 3416 or may provide information to the vehicle sensor system 3405 which provides the information or a modified form of the information to the processor 3416. A detection system 3408 may be self-powered or may be part of the circuitry of the vehicle 3410. The detection system 3408 may include one or more sensors as disclosed herein in relation to the vehicle sensor system 3405 and/or the vehicle communication system 3409. As an example, the detection system 3408 may be independent of the vehicle 3410 such that it may be housed in the same housing light engine 3401 and may detect motion within vehicle areas. This example detection system 3408 may provide motion information directly to the processor 3416 and one or more light characteristics may be modified based on the information, as disclosed herein.

The vehicle sensor system 3405 may be activated at all times (e.g., while the vehicle has battery power), when the vehicle engine is activated, when the vehicle is locked or unlocked, based on an object's (e.g., individual's) proximity to the vehicle, and/or based on a time lapse between an action or activity. Example implementations of the vehicle sensor system 3405 are further disclosed in reference to FIG. 32A-FIG. 33.

The vehicle communication system 3409 may provide the processor 3416 with a information based on a user profile module. A user profile module may include preferences for one or more users. The user profile module may include or may be connected to a storage unit configured to store one or more user preferences, user profiles, and/or user characteristics. The user preferences may be input by a user or may be ascertained by components of the vehicle. As a first example, the user profile may include light intensity or light color preferences for the user. The light intensity or light color preferences for the user may be provided by the user during an initial set-up of the vehicle. As another example, the user profile module may include the seat location (depth, height, lumbar support, etc.) settings for a user. The seat location may be automatically set as a default seat location based on multiple uses of the vehicle in that seat location. The user profile module may provide information to the processor 3416 and, as further disclosed herein, one or more light characteristics of light emitted by the light engine 3401 may be modified based on the information. For example, a first user may enter a vehicle and the seat location may be adjusted based on determining that the individual that entered the vehicle is the first user (e.g., by correlating the first user's mobile device or key with the first user). Accordingly, information indicating the seat location may be provided to the processor 3416 and a light characteristic (e.g., illumination area) may be modified, via the light engine, to illuminate an area based on the seat location.

The vehicle communication system 3409 may provide the processor 3416 with information based on a user input module. A user input module may be any component or device that receives input provided by a user and may include input by a device separate and/or external to the vehicle interior such as a user mobile device 3411. A user mobile device 3411 may include a mobile device sensor system 3412 and/or a user device communication system 3413. The user mobile device 3411 may communicate with the vehicle communication system via a wireless transmission such as a WiFi transmission, a Bluetooth transmission, an IR transmission, a NFC transmission, a cellular transmission, or the like or by a wired or contact (E.g., Qi connection) based transmission. For example, the vehicle communication system 3409 may be configured to automatically connect to a user mobile device 3411 via a Bluetooth connection when the user enters the vehicle 3410. The connection may result in the vehicle communication system 3409 sending information based on determining a user location (e.g., seat position), a user profile, a user preference, or the like. Further, the user may provide an input using his or her user mobile device 3411 such as providing an input to change a light characteristic, changing a vehicle setting, or the like. For example, a user may use an imbedded application on the user mobile device 34111 to change the intensity of light at the user's location in the vehicle. The vehicle communication system 3409 may receive this input and may provide information to the processor 3416 based on the input.

According to an implementation, a light characteristic may be modified to provide a spot of reduced horizontal illumination surrounding or on a moving object (e.g., a user). The spot of reduced horizontal illumination may follow the moving object and may, for example, increase the contrast around the moving object. According to a specific implementation, the horizontal illumination may track the moving object while the vertical plane remains the same such that the same vertical planes of the vehicle is illuminated as the object moves.

Further, the vehicle communication system 3409 may receive an input from a user input module via a vehicle interior component. A vehicle interior component may be a physical selection component (e.g., a center counsel button, a dashboard button, a seat adjustment button, a light adjustment button, etc.), a sensory input receiver (e.g., a touch input, a voice command, a motion gesture, a gaze change, etc.), or the like. For example, a user may input a change in light intensity using a voice command. The vehicle communication system 3409 may receive the voice command and provide information to the processor 3416 based on the voice command.

The vehicle communication system 3409 may obtain information from one or more vehicle interior components or attributes such as an accelerometer, a speedometer, an onboard CPU, an alert system, a vehicle door sensor, a vehicle occupancy detector, or the like. For example, the vehicle communication system 3409 may receive an input from a vehicle speed sensor or accelerometer and, based on a predetermined setting, may provide information to the processor 3416 such that any light that illuminates a driver's area is turned off.

Figure 35:
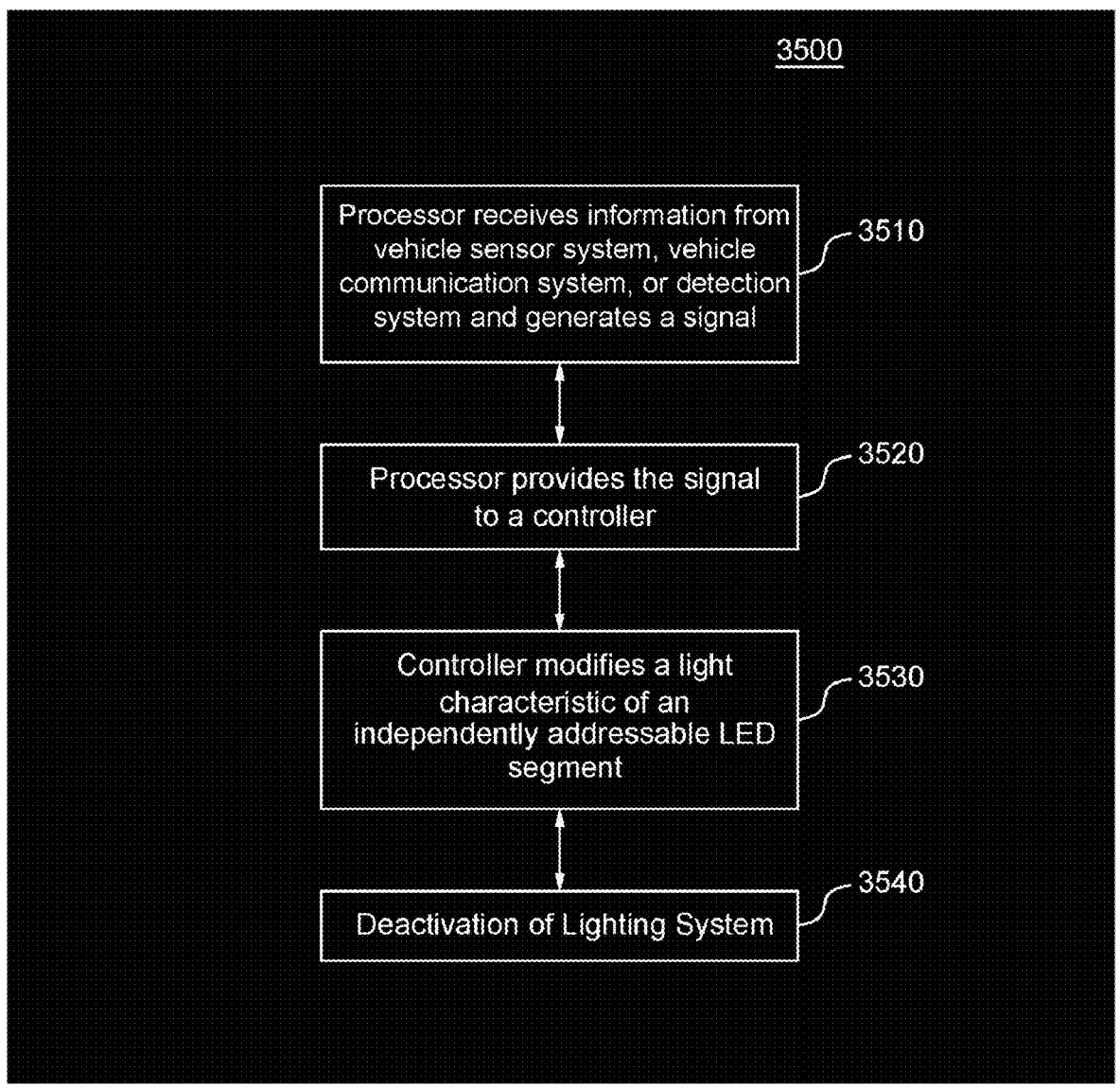
FIG. 35 is a flowchart for modifying a light characteristic, according to aspects of the disclosure.

FIG. 35 shows a flowchart for modifying a light characteristic, according to aspects of the disclosure. As described herein in reference to FIG. 34, at step 3510 of FIG. 35, a processor 3416 may receive information from a vehicle sensor system 3405, a vehicle communication system 3409, and/or a detection system 3408. The information may be provided by a wired transmission or a wireless transmission (e.g., a WiFi transmission, a Bluetooth transmission, an IR transmission, a NFC transmission, and a cellular transmission, etc.). The vehicle sensor system 3405, the vehicle communication system 3409, and/or detection system 3408 may be in the same housing as the processor 3416 or may be external to the housing that the processor 3416 is contained within. The housing may include a support structure having an outer surface, an inner surface, and/or a hole. The housing may be configured such that it does not block light emitted from a light guide plate and towards different vehicle areas. The plurality of independently addressable LED segments may be attached to the base of a flexible PCB such that the base of the flexible PCB is positioned on, adjacent to, or near the outer surface of the housing and the plurality of legs extend through the hole and over the inner surface, as disclosed herein. According to an implementation, the vehicle communication system 3409 may be external to the vehicle, as further shown in FIG. 37.

At step 3520 of FIG. 35, the processor 3416 may generate a signal based on the information and may provide the signal to the controller 3415. The processor 3416 may generate the signal based on one or more of the modules (light intensity control module 3402, light directional control module 3403, and light color control module 3404), as disclosed herein, or may provide the signal to one or more of the modules via the controller 3415. The processor 3416 may provide the signal to the controller 3415 by a wired transmission or a wireless transmission (e.g., a WiFi transmission, a Bluetooth transmission, an IR transmission, a NFC transmission, and a cellular transmission, etc.).

At step 3530 of FIG. 35, the controller 3415 may provide a controller signal to one or more of the independently addressable LED segments 3414. The independently addressable LED segments 3414 may be connected to the controller 3415 via legs that extend from a base of a flexible PCB. Some or all of the legs may include an integrated bus line that connects one or more independently addressable LED segments 3414 to a respective contact on the some or all of the legs. The contacts may be electrically connected to the controller such that a signal provided by the controller is provided to one or more independently addressable LED segments 3414 via the integrated bus line.

The controller signal provided by the controller 3415 causes a modification of a light characteristic of at least one independently addressable LED segment 3414. The controller 3415 may generate the signal based on one or more of the modules (light intensity control module 3402, light directional control module 3403, and light color control module 3404). The controller signal may cause one or more of the independently addressable LED segments 3414 or one or more of the plurality of LEDs in one or more independently addressable LED segments 3414 to activate, deactivate, increase or decrease: intensity, brightness, contrast, saturation, hue, temperature, a polarization, etc., physically change (e.g., move, shift, tilt, open/close a cover), or otherwise modify a light characteristic. Modifying a light characteristic may result in a change in illumination of one or more vehicle areas such as, but not limited to, an area being illuminated or not illuminated, an intensity, brightness, contrast, saturation, hue, temperature, etc, based change in illumination, or the like. A vehicle area may be any applicable area of a vehicle and may vary between vehicles. For example, a car or truck may have a driver area, a front passenger area, a rear right passenger area, a rear middle passenger area, a rear left passenger area, a front row, a middle row, and a back row. A train may have a passenger car area, a conductor area, an inter-car area, an intra-car area, an entrance area, or the like. A plane may have a cockpit area, a preparation area, a passenger area, an entrance area, a window area, a isle area, or the like. A boat or ship may have a deck area, a port area, a shaft area, an upper area, a lower area, a storage area, a control area, or the like.

At step 3540 the lighting system may be deactivated such that one or all of the components including, but not limited to, the processor 3416, the controller 3415, the independently addressable LED segments 3414 including their respective LEDs, the vehicle sensor system 3405, the vehicle communication system 3409, and the detection system 3408 may be turned off. The components may turn off as a result of loss of power from the vehicle 3410 or may be turned off based on a threshold amount of time passing after a given action (e.g., vehicle turned off, lack of sensed motion or object, etc.). It will be understood that a deactivated component, as applied herein, may refer to a mode of suspension where a given component may be in an idle state but may still be powered.

FIG. 32A shows an example implementation of the disclosed subject matter. As shown in FIG. 32A, the vehicle may include a controller 3206, a processor 3207, a back row independently addressable LED segment 3205, a front row independently addressable LED segment 3208, and a sensor (not shown). The sensor may receive a back row sensor signal 3203 and may provide information to the processor 3207 based on not detecting an object in the back row via the back row sensor signal 3203. Based on the information, the processor 3207 may provide a corresponding signal to the controller 3206. The controller 3206 may provide a light control signal to the back row independently addressable LED segment 3205 via a contact on the leg of a flexible PCB that the back row independently addressable LED segment 3205 is placed on. The back row independently addressable LED segment 3205 may emit light such that an intense light 3202 illuminates the back row area of the vehicle. The intense light may allow visibility to an individual who is entering the vehicle.

The sensor may receive a front row sensor signal 3204 and may provide information to the processor 3207 based on detecting an object (an individual in this example) in the front row via the front row sensor signal 3204. Based on the information, the processor 3207 may provide a corresponding signal to the controller 3206. The controller 3206 may provide a light control signal to the front row independently addressable LED segment 3208 via a contact on the leg of a flexible PCB that the front row independently addressable LEI) segment 3208 is placed on. The front row independently addressable LED segment 3208 may emit light such that an dim light 3201 illuminates the front row area of the vehicle. The dim light may allow a low amount of visibility for the individual sitting in the front row without illuminating an uncomfortable amount of bright light onto the individual.

It shall be noted that the front row and the back row are independently illuminated based on modifying a lighting characteristic of a back row independently addressable LED segment 3205 separate and apart from a front row independently addressable LED segment 3208. The processor 3207 may receive one or multiple inputs and may provide one or multiple outputs to the controller 3206. The controller 3206 may then independently address one or multiple LED segments based on the signal(s) received from the processor 3207.

As a further example, as shown in FIG. 32A, the sensor signals 3203 and 3204 may be generated when the vehicle door is open such that the back row independently addressable LED segment 3205 and the front row independently addressable LED segment 3208 may only be activated because the door is open. The back row independently addressable LED segment 3205 and the front row independently addressable LED segment 3208 may each be deactivated prior to the door being opened and after the door being shut. An indication that the door is open may be provided to the processor 3207 by a vehicle communication system, such as vehicle communication system 3609 of FIG. 34.

Figure 32B:
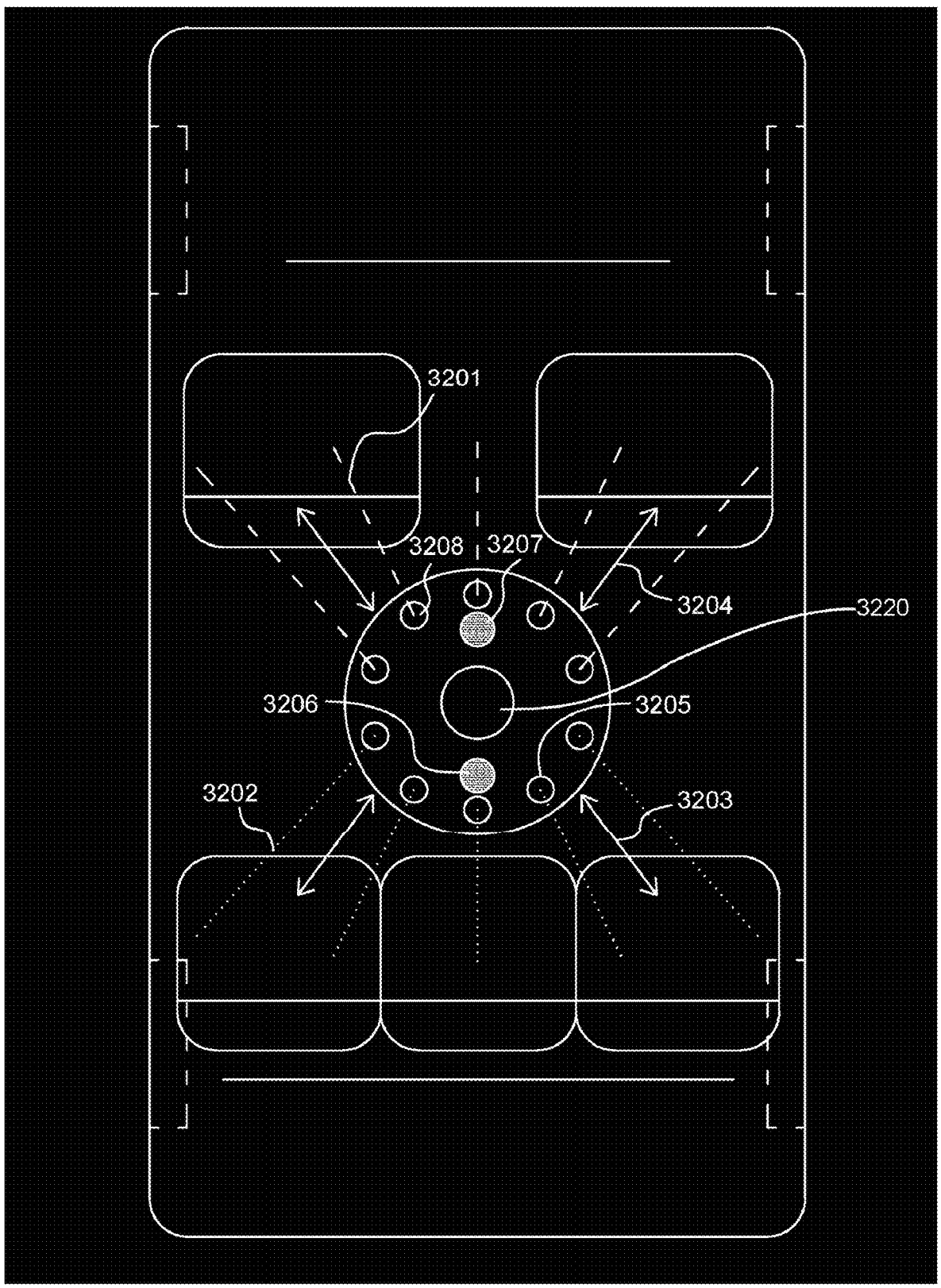
FIG. 32B is a top view of a light engine with dynamically controllable LED segments to illuminate the interior of a vehicle, according to aspects of the disclosure.

FIG. 32B shows a top view of the elements shown in FIG. 32A. As shown, the back row independently addressable LED segment 3205 may emit light such that an intense light 3202 illuminates the back row area of the vehicle. Notably, the back row independently addressable LED segment 3205 may include multiple LED segments such that when one or more of the segments is activated, the resulting illumination is directed to the back row vehicle area. As also shown, the front row independently addressable LED segment 3208 may emit light such that a dim light 3201 illuminates the front row area of the vehicle. Notably, the front row independently addressable LED segment 3208 may include multiple LED segments such that when one or more of the segments is activated, the resulting illumination is directed to the front row vehicle area.

As shown in FIG. 32B, a mounting element 3220 may be attached to a light guide plate or to a light engine and may be used to mount the light guide plate and light engine to a surface (e.g., a vehicle ceiling, as shown). The mounting element may be structurally strong to support the weight of a light guide plate, a light engine, one or more additional plates, etc. It will be understood that the light guide plate may be shaped such that the vertical light emission emitted via the light guide plate is emitted in a downward direction such that the ceiling is not unnecessarily or undesirably illuminated. The mounting element 3220 may include a heat dissipating material such that heat generated by the light engine is dissipated across the mounting element 3220 and/or into the surface that the mounting element 3220 is attached to (e.g., a vehicle ceiling). The mounting element 3220 may be made of any applicable material such as a metal, a plastic, or a combination of materials. According to an implementation, one or more sensors may be positioned inside the mounting element 3220.

FIG. 32C shows another example implementation of the disclosed subject matter. A back row sensor signal 3203 may provide information to the processor 3207 and may indicate that no object is detected in the back row. A front row sensor signal 3204 may provide information to the processor 3207 and may indicate that an object (e.g., an individual) is detected in the front row. Accordingly, the processor 3207 may provide a signal to the controller 3206 and the controller 3206 may activate the back row independently addressable LED segment 3205. According to this implementation, the front row independently addressable LED segment 3208 may not be activated and only the back row of the vehicle may be illuminated.

Further, as shown in FIG. 32C, the back door 3210 of the vehicle is open while the front door 3209 of the vehicle is closed. A vehicle communication system, such as vehicle communication system 3609 of FIG. 34 may provide information to the processor 3207 indicating that the back door 3210 of the vehicle is open and/or the front door 3209 of the vehicle is closed. Based on the information, the processor 3207 may provide a signal to the controller 3206 and the controller 3206 may activate the back row independently addressable LED segment 3205. According to this implementation, the front row independently addressable LED segment 3208 may not be activated and only the back row of the vehicle may be illuminated as an individual may be able to visually see the back row vehicle area as the individual enters the vehicle.

Figure 33:
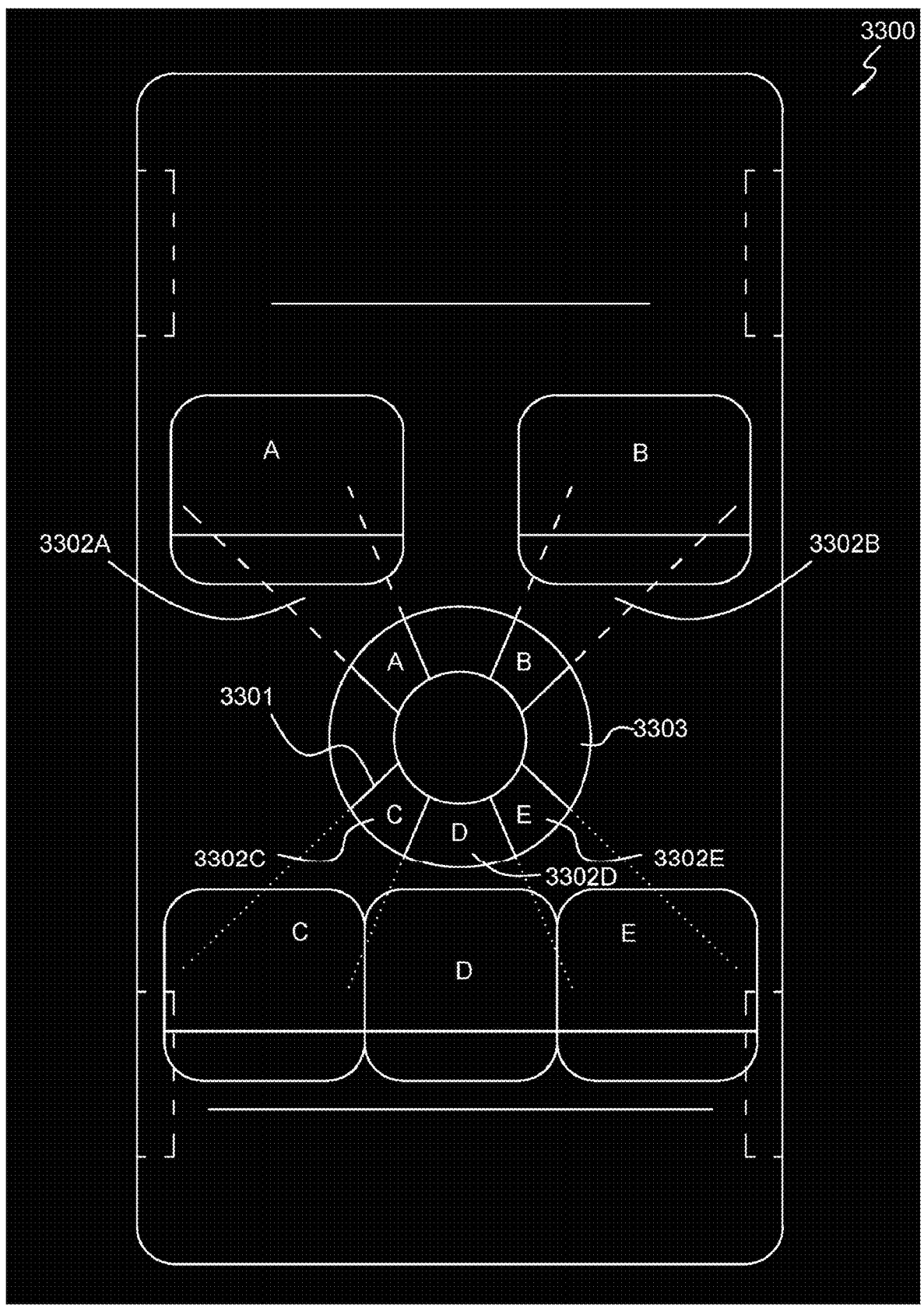
FIG. 33 is a top view of a light engine with dynamically controllable LED segments configure to illuminate different vehicle areas, according to aspects of the disclosure.

FIG. 33 shows an example implementation of independently addressable LED segments 3202A through 3202E arranged in a circular pattern on the ceiling of a vehicle 3300. As disclosed herein, the location of independently addressable LED segments 3202A through 3202E may correspond to a vehicle area of illumination. For example, modifying a light characteristic via independently addressable LED segments 3202A may correspond to the modification of a light characteristic in vehicle area A, modifying a light characteristic via independently addressable LED segments 3202B may correspond to the modification of a light characteristic in vehicle area B, modifying a light characteristic via independently addressable LED segments 3202C may correspond to the modification of a light characteristic in vehicle area C, modifying a light characteristic via independently addressable LED segments 3202D may correspond to the modification of a light characteristic in vehicle area D, and modifying a light characteristic via independently addressable LED segments 3202E may correspond to the modification of a light characteristic in vehicle area E. It will be understood that although a circular pattern is shown herein, a plurality of independently addressable LED segments may be arranged in any applicable configuration and may be arranged such that they are located in different vehicle areas (e.g., a vehicle ceiling, vehicle dashboard, vehicle door, vehicle floor, vehicle window, or the like). For example, a first subset of independently addressable LED segments may be located in a first vehicle area and a second subset of independently addressable LED segments may be located in a second vehicle area.

As shown in FIG. 33, a light guide plate 3303 may be provided. It will be understood that although the light guide plate 3303 may fully or partially surround the plurality of independently addressable LED segments 3202A-E and that the independently addressable LED segments 3202A-E, as shown in FIG. 33 include a portion of the light guide plate 3303 (e.g., towards the outer edge of the circular disc shown in FIG. 33. As disclosed herein, the light guide plate 3303 may have an inner surface that is opposite to or may face one or more of the independently addressable LED segments 3202A-E. The inner surface of the light guide plate 3303 may be configured (e.g., shaped, arranged, positioned, etc.) to receive light from the plurality of independently addressable LED segments 3202A-E. For example, each of the independently addressable LED segments 3202A-E may include an active layer such that all or most of the light emitted from the active layer of each of the respective independently addressable LED segments 3202A-E is directed towards and into the inner surface of the light guide plate 3303. According to an implementation, one or more of the independently addressable LED segments 3202A-E may include wavelength converting layer that converts a wavelength of light emitted by the one or more active layers. The light guide plate 3303 may extend outward from the inner surface and/or the plurality of independently addressable LED segments and may be configured (e.g., shaped, arranged, positioned, etc.) to provide illumination from the plurality of independently addressable LED segments inside the vehicle. The light guide plate 3303 may extend outward to create a light guide plate shape such as a triangular shape, a chamfered shape, a, convex shape, a concave shape, or the like. As disclosed herein, the light guide plate 3303 may direct light to one or more different areas of a vehicle. The light may be directed towards the one or more different areas based on the shape of the light guide plate 3303 and/or based on a characteristic of the plurality of independently addressable LED segments 3202A-E.

Figure 36:
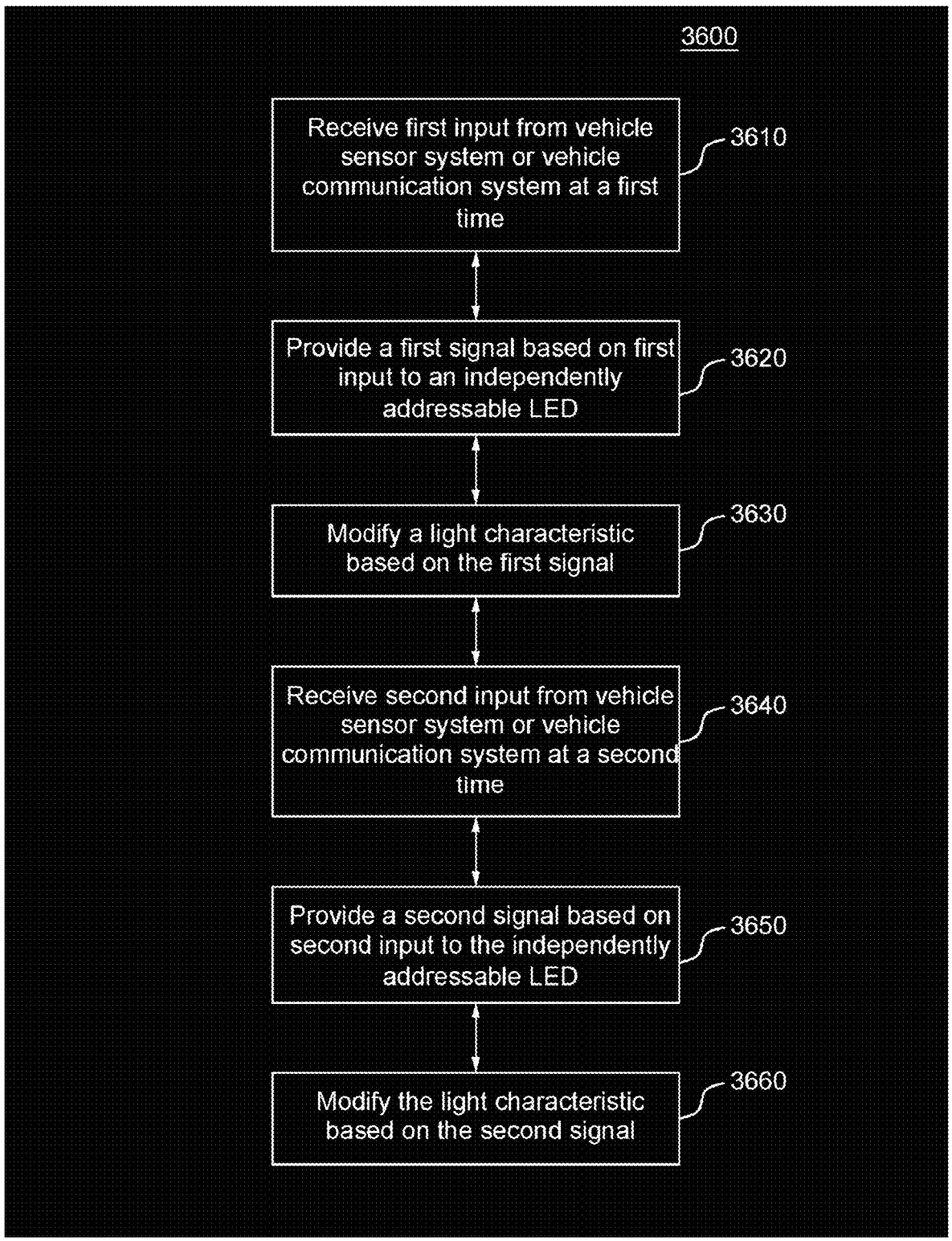
FIG. 36 is a flowchart for dynamically modifying light characteristics, according to aspects of the disclosure.

According to an implementation of the disclosed subject matter, one or more light characteristics may be dynamically updated. As shown in FIG. 36, a first information may be received from a vehicle sensor system, a vehicle communication system, or a detection system, at a first time, as shown at step 3610. As disclosed herein, the first information may be received by a processor which may generate and provide a signal to a controller. The first information may be based on a first object characteristic (e.g., an object location, an object size, a gaze location, a user input, and a vehicle component (e.g., a door position, a window position, a seat position, a vehicle speed, and a vehicle gear, etc.), or the like.). The controller may receive the processor generated signal to generate and provide a first signal based on the first information to at least one independently addressable LED segment at step 3620. The controller may provide the first signal to the at least one independently addressable LED segment via a leg of a flexible PCB comprising a contact in electrical contact with the controller and in electrical contact with the independently addressable LED segment via an integrated bus. At least one light characteristic of the LED segment may be modified based on the first signal at step 3630. As an example, with reference to FIG. 33, a first object may be sensed by an object detection sensor, at vehicle area E, at a first time. The object detection sensor may provide the first information to a processor that provides a signal to a controller to illuminate area E based on the first information. The controller may provide a controller signal to an independently addressable LED segment 3302E which activates to illuminate vehicle area E via light guide plate 3303.

As shown in FIG. 36, a second information may be received from the vehicle sensor system, the vehicle communication system, or the detection system at a second time, as shown at step 3640. As disclosed herein, the second information may be received by a processor which may generate and provide a signal to a controller. The second information may be based on the first object characteristic or a different object characteristic. The controller may receive the processor generated signal to generate and provide a second signal based on the second information to at least one independently addressable LED segment at step 3650. At least one light characteristic of the LED segment may be modified based on the second signal at step 3660. The modified light characteristic at step 3660 may be the same as or different than the light characteristic at step 3630, Further, the independently addressable LED segment of step 3640 may be the same as or different than the independently addressable LED segment of step 3620. Continuing the previous example, with reference to FIG. 33, the first object may be sensed, by an object detection sensor, at vehicle area C, at a second time (e.g., an individual may move from vehicle area E to vehicle area C). The object detection sensor may provide a second information to a processor that provides a signal to a controller to illuminate area C based on the second information. The controller may provide a controller signal to independently addressable LED segment 3302C which activates to illuminate vehicle area C via light guide 3303. Additionally, the controller may provide a controller signal to independently addressable LED segment 3302E which deactivates and no longer illuminates vehicle area E.

Notably, the vehicle sensor system and/or the vehicle communication system may dynamically update based on a time period, a predetermined event (e.g., a sensor reading, user input, a vehicle characteristic, etc.). Update information may be provided to the processor accordingly, and one or more light characteristics may be modified as a result, as disclosed herein.

As disclosed herein, a vehicle sensor system and/or a vehicle communication system may include one or more sensors. The one or more sensors may include an infra-red (IR) sensor, passive infra-red sensor (PIR), a camera, a motion detection sensor, a microwave sensor a weight sensor, a pressure sensor, an ultra sound sensor, a proximity sensor, a capacitive sensor, a photoelectric sensor, an inductive sensor, a magnetic sensor, or the like. Notably, a sensor may be any physical (including electronic, magnetic, or chemical) device that detects or measures a property. A sensor may further record, transmit, indicate, generate feedback from or otherwise respond to the detection or measurement of the property.

One or more sensors may be located within an opening in a light guide which may or may not also include the light engine. The one or more sensors may be placed such that they are not visible to an observer external to the light guide. The one or more sensors may be placed in the opening adjacent to, above, below, behind or in front of independently addressable LED segments, a controller, a processor, or the like. A cap may be placed at an end of the light guide plate such that the one or more sensors are able to detect their respective objects, actions, or events despite the cap. The one or more sensors may be flush with or may be within any plane created by the light guide (e.g., above a horizontal plane created by the bottom most portion of the light guide.

As non-limiting examples, a PIR may detect body heat (e.g., infrared energy) to provide object detection (e.g., body detection) and/or object movement (body movement) within a pre-determined range of volume. An IR sensor, PIR sensor, or any motion based sensor may generate a virtual grid within a given volume with cubes inside the grid serving as measurement markers. If an object traverses within a given volume (e.g., an individual moving from the front to the back of a train), then the object may block or reflect within a threshold amount of grid zones, which may provide a motion indication. An ultrasonic sensor may emit pulses of ultrasonic waves and measure the reflections that are returned to the sensor. A comparison between a first returned wave and a second returned wave may indicate motion of an object.

Two or more sensors may be combined or operated simultaneously to reduce potential false results. For example, a PIR sensor could be combined with a microwave sensor such that an input to a processor is generated only if both sensors are triggered. In this example, as each of the two sensors operates in different areas of the spectrum, the motion sensors are less likely to trigger based on a false action, object, or event.

A weight sensor may constantly or periodically calculate the weight of an object or the vehicle may include a trigger mechanism such that an object over a certain weight automatically triggers the mechanism.

A sensor that is part of a vehicle sensor system and/or a vehicle communication system may be housed in the same housing as a light engine, as disclosed herein, or may be external to one or more components of the light engine. Notably, specific sensors such as a gaze detection sensor may be better suited to be located external to, for example, a ceiling mounted light engine as they may be better configured to detect a gaze if located at or near the dashboard or other user facing location.

Figure 37:
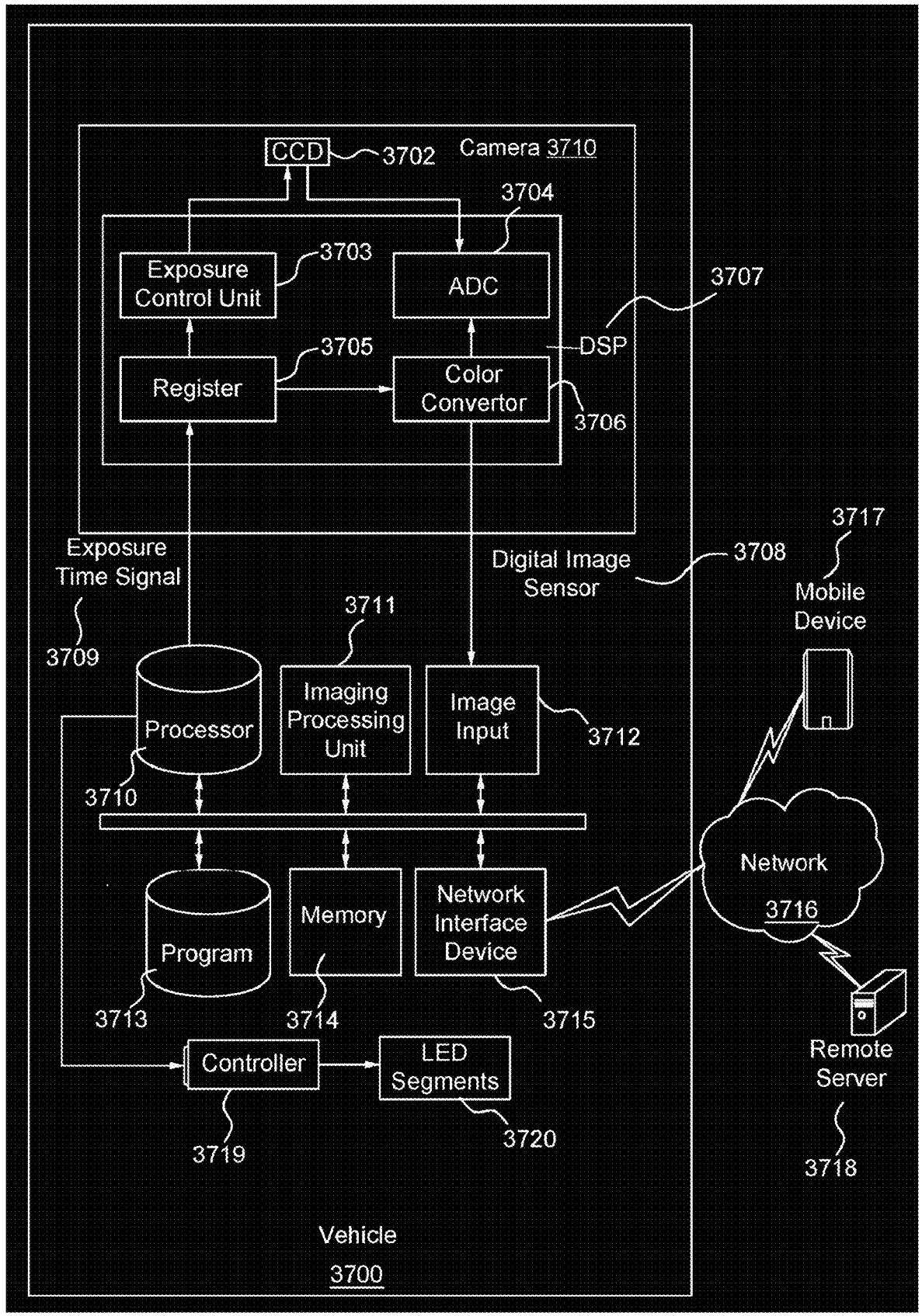
FIG. 37 is a diagram of a vehicle lighting system with a camera, according to aspects of the disclosure.

FIG. 37 shows an example camera 3701 sensor that is part of a vehicle sensor system in a vehicle 3700. The camera 3701 may be configured to detect objects, movement, and may further be configured for facial recognition to identify one or more individuals that are in a vehicle (e.g., to apply applicable user profiles and modify lighting characteristics, as disclosed herein). The camera 3701 may be located inside the vehicle and may be housed in the same housing as the independently addressable LED segments 3720, controller 3719, and/or processor 3710, as disclosed herein. Alternatively, the camera 3701 may be located in a vehicle area external to one or more of the independently addressable LED segments 3720, controller 3719, and/or processor 3710.

As shown in FIG. 37, the camera 3701 may comprise a charge coupled device (CCD) 3702 and digital signal processor (DSP) 3707 that communicate with each other, as shown. The DSP 3707 may also communicate with the processor 3710 and/or an image input 3712 to which the DSP connects. An imaging processing unit 3711 may also be included and may be external to a light engine or may be part of a light engine. The processor 3710 may send an exposure time signal back to the camera 3710's DSP 3707. A program 3713 may be stored in memory 3714 along with one or more sensor thresholds, controls, user profiles, images, and the like. The DSP 3707 may further comprise an analog digital converter (ADC) 3704 that receives a CCD 3702 input, a color converter unit 3706 that outputs a digital image signal to the image input 3712 of the imaging processing unit 3711. An exposure control unit 3703 may output a signal to the CCD 3702 to optimize the collection of an image or a series of images (e.g., a video). A register 3705 may receive an exposure signal from the processor and may output corresponding signals to the exposure control unit 3703 and the color converter unit 3706. The processor 3710 may output a signal to a controller 3719, as disclosed herein. The signal may be based on an input received from the camera 3701 and analyzed, modified, or otherwise developed based on one or more of the image input 3712, image processing unit 3711, memory 3714, and program 3713.

According to an implementation, the image input 3712 may receive an input from a network 3716 via a network interface device 3715. The network 3716 may receive the input from a mobile device 3717, a remote server 3718 or any other applicable database or network device. According to this implementation, the camera 3701 may not be present or utilized. As a specific example, a user may use her mobile device 3717 for facial recognition. The mobile device may provide the facial recognition-based data to the network interface device 3715 via the network 3716. Based on the facial recognition data, the processor 3710 may associate the user's image with a stored user image in the memory 3714 and the program 3713 may associate the stored user image in the memory 3714 with a specific user profile (which may also, optionally, be stored in the memory). The processor 3710 may generate a signal based on the user profile input and may provide the signal to the controller 3719. The controller may modify a light characteristic via one or more independently addressable LED segments 3720 based on the signal. As a result, beam and/or beam pattern generated by a light guide associated with the independently addressable LED segments 3720 may be modified and, accordingly, the illumination of one or more vehicle areas may be modified, as disclosed herein.

According to an implementation, the vehicle interior lighting system 3400 of FIG. 34 may communicate with a network 3716, as shown in FIG. 37 for one or more purposes. The lighting system may communicate with the network 3716 via a network interface device 3715. The network 3716 may provide firmware, software, or other electronic updates to the vehicle interior lighting system 3400. For example, a user profile may be provided by the network 3716 when a user first purchases a vehicle. The user profile may be used to modify lighting characteristics, as disclosed herein, when the user first uses the vehicle, such that the vehicle feels personalized form the first use of the vehicle. Such electronic updates may be provided based on a manufacturer update or may be user initiated. In this implementation, the camera 3701 may or may not be present in the vehicle 3700.

Although some of the concepts disclosed herein are presented in the context of adaptive automotive lighting, it will be understood that the disclosed segmented LED chip implementations, adaptive lighting system implementations, and processes for operating adaptive lighting systems can be employed in any context. For example, they can be used in indoor lighting systems, street lighting systems, stage lighting systems, decorative lighting systems, and greenhouse lighting systems. Thus, the disclosure is not limited to the examples presented herein.

Figure 38:
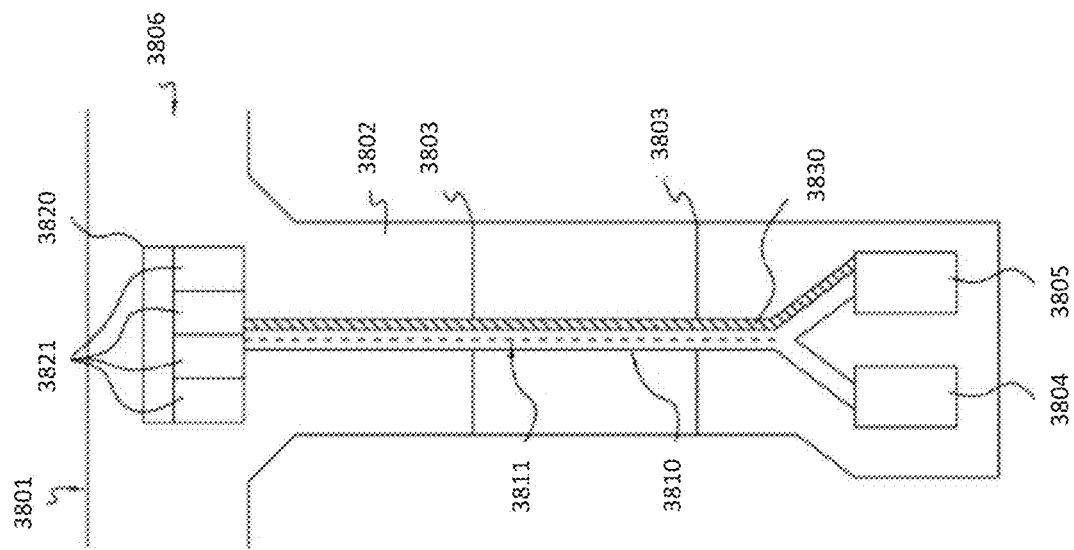
FIG. 38 is a diagram of an example LED strip with an integrated bus line.

FIG. 38 is a diagram of a flexible printed circuit board 3801, which may similar to flexible printed circuit board 100 of FIG. 1A. The flexible printed circuit board 3801 may include a body 3806 which includes a LED segment (or LED bank) 3820 which may include one or more LEDs 3821. The one or more LEDs 3821 may emit the same color light or may emit different colored lights. LEDs 3821 which emit different colored lights may emit light such that the when viewed from an external point, the different colored lights combine to produce a single color that is a blend of the different colored lights. The LED strip 3801 also may include a leg 3802 which may be flexible such that it bends, folds, curves, or otherwise shapes itself. For example, the leg 3802 may bend at bend points 3803 to wrap around an object or structure such as base 338 of FIGS. 2A-2D and 3A. A bend, as used herein, may be a change in direction of one or more portions of a leg such that, for example, a first portion of the leg is in a first plane and a second portion of the leg is in a second plane. Additional bends may be present such that, for example, a third portion of the leg is in a third plane and so on for additional portions of the leg. It will be understood that the bend points 3803 are an example only and the leg 3802 may include multiple additional bend points, may be configured to bend without bend points, may be a flexible tape, or the like. According to an implementation, the LED strip 3801 may have an adhesive backing for affixing the LED strip 3801 to an object or structure such as base 338 of FIGS. 2A-2D and 3A.

The leg 3802 may include electrical contacts 3804 and 3805 for controlling the LEDs 3821 in the LED bank 3820. For example, the contacts 3804 and 3805 may be used to provide a signal to the LEDs 3821 in the bank 3820. The signal may be, for example, one of: (1) turning off/on the LEDs 3821, (2) changing the brightness of the LEDs 3821 (3) changing the color of light output by the LEDs 3821, and/or (4) controlling another characteristic of the operation of the LEDs 3821. The contacts may include any conductive material such as, but not limited to, silver, copper, gold, platinum, and/or palladium.

The LEDs 3821 in LED bank 3820 may be connected to one another in series, in parallel, and/or in any other suitable way and may be configured to output the same color of light or different colors of light such as, for example, red, green, and blue. Additionally or alternatively, the LEDs 3821 may output light having the same correlated color temperature (CCT). Additionally or alternatively, the light outputs of at least two LEDs 3821 in the LED bank 3820 may have different CCTs.

Light emitted from the LEDs 3821 may be emitted into a light guide, such as the light guide shown in the previous figures. The light guide may guide the light emitted by the LEDs 3821 based on the shape and characteristics of the light guide and the apparatus in general, which features may include, but are not limited to, texture, curves, dimensions, pans, plates, and the like. For example, FIGS. 7A-10A show light guides with outer edges that are shaped to distribute light in a given pattern, based on the edge. FIGS. 10B and 10C show examples of such distributions. The LEDs 3821 may be deposited in an inner cavity of a light guide or may be deposited along an outer edge of a light guide such that they emit light into the light guide. An example such configuration is shown in FIG. 14A.

One or more of the LEDs 3821 may be a micro LED such that the one or more LEDs 3821 may have a width W in the range of 10-500 microns. Furthermore, the one or more LEDs 3821 may have a length L in the range of 10-500 microns and a height H in the range of 5-30 microns. The width W of any of the one or more LEDs 3821 may be the same or different from the length L of the same LED.

According to an implementation, at least one contact of the contacts 3804 and 3805 may be connected to the LED bank 3820 via an integrated bus line 3810. The integrated bus line 3810 may connect the contact 3804 and/or 3805 to the LED bank 3820 and LEDs 3821 such that an electrical signal may travel from the contact 3804 and/or 3805 to the LED bank 3820 via the integrated bus line 3810.

The integrated bus line 3810 may be provided such that the use of separate wires may be avoided, to provide an electrical signal from the contact 3804 and/or 3805 to the LED bank 3820. Accordingly, the integrated bus line 3810 may allow for a low profile solution which replaces wires that may use additional space and suffer damage. The integrated bus line 3810 may also mitigate a concern related to damaging wires during a manufacturing process (e.g., by catching the wire against a sharp edge or object).

The integrated bus line 3810 may traverse the length of substantially the entire leg 3802. The integrated bus line 3810 may be, for example, at least 10 mm long according to an implementation and may be, for example, at least 5 mm long according to another implementation. The integrated bus line 3810 may be narrower than the width of the leg 3802 and may have a width of less than 5 mm according to an implementation and less than 3 mm according to another implementation.

The integrated bus line 3810 may connect to multiple contacts such as contact 3804 and to contact 3805 and may receive multiple signals from the multiple contacts. According to an implementation, the integrated bus line may receive a control signal from contact 3804 and may provide a ground connection via contact 3805. The integrated bus line 3810 may carry the multiple electronic signals such that it is split in two or more parts throughout the length of the integrated bus line. As an example, integrated bus line 3810 is shown to be spilt by a dividing line 3811 which may isolate the signal from contact 3804 from the signal from contact 3805. The isolation may be based on the dividing line 3811 including an insulator or dielectric material which isolates the signal from contact 3804 from the signal from contact 3805. Alternatively, according to an implementation, the dividing line 3811 may be a physical gap between one side of the integrated bus line 3810 and a different side of the integrated bus line 3810. It will be understood that although two contacts 3804 and 3805 are shown in FIG. 38, there may be three or more contacts and multiple dividing lines provided in an integrated bus line.

The integrated bus line 3810 may be insulated by a dielectric material, such as polyimide, at one or more edges, ends, or surfaces such that the signals carried by the integrated bus line 3810 are insulated from exiting the integrated bus line 3810. As an example, the integrated bus line 3810 may include dielectric material 3830 which may insulate the ground connection via contact 3805 from being interrupted by a portion of the leg 3802 that is external to the integrated bus line 3810.

According to implementations disclosed herein, an integrated bus line may include a conductive material configured to transfer an electrical signal from a contact to an LED bank. As non-limiting examples, the integrated bus line may include a copper trace, an aluminum trace, and a combination aluminum/copper trace such as, for example, an aluminum coated copper trace.

Figure 39:
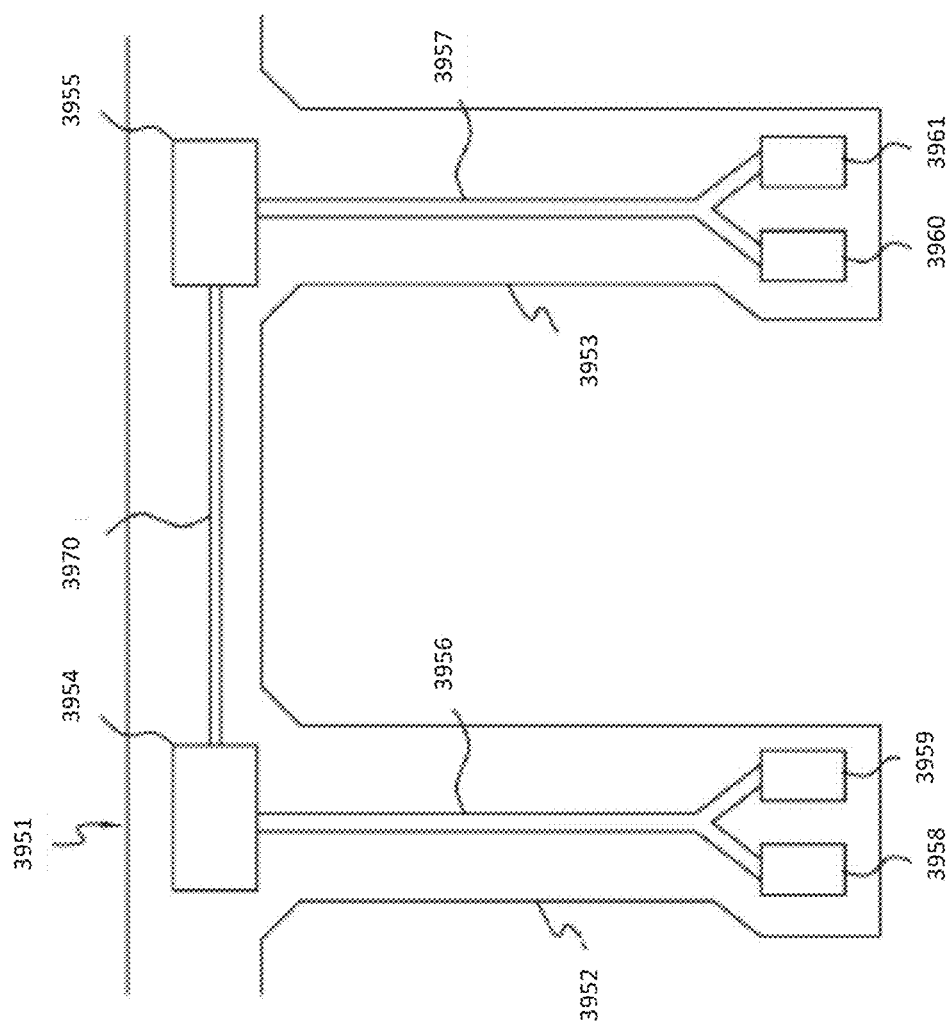
FIG. 39 is a diagram of an example LED strip with multiple legs.

A controller, such as controller 330 of FIGS. 15-18 or gate controller 1806 of FIG. 18 may be provide a signal to contacts such as contacts 3804 and/or 3805 of FIG. 38 or contacts 3858, 3859, 3860, and/or 3861 of FIG. 39. The controller may be connected to a contact via a control board which includes one or more traces or wires that are in contact with a controller. The controller may provide an electrical signal based on a signal from a component, such as a driver, a converter, or may generate the signal based on a different input signal provided to the controller.

According to an implementation, a flexible printed circuit board, such as flexible printed circuit board 3851 of FIG. 39, may include multiple legs, such as leg 3852 and leg 3853. Each leg and may include an integrated bus line which connects contacts to LED banks for each respective leg. For example, as shown in FIG. 39, leg 3852 may include an integrated bus line 3856 which connects contacts 3858 and 3853 to LED bank 3854. Additionally, as shown in FIG. 39, leg 3853 may include an integrated bus line 3857 which connects contacts 3860 and 3861 to LED bank 3855.

According to an implementation, as shown in FIG. 39 and as further disclosed herein, an integrated bus line may connect two LED banks such as the integrated bus line 3870 of FIG. 39 which connects LED bank 3854 and 3855.

Figure 40A:
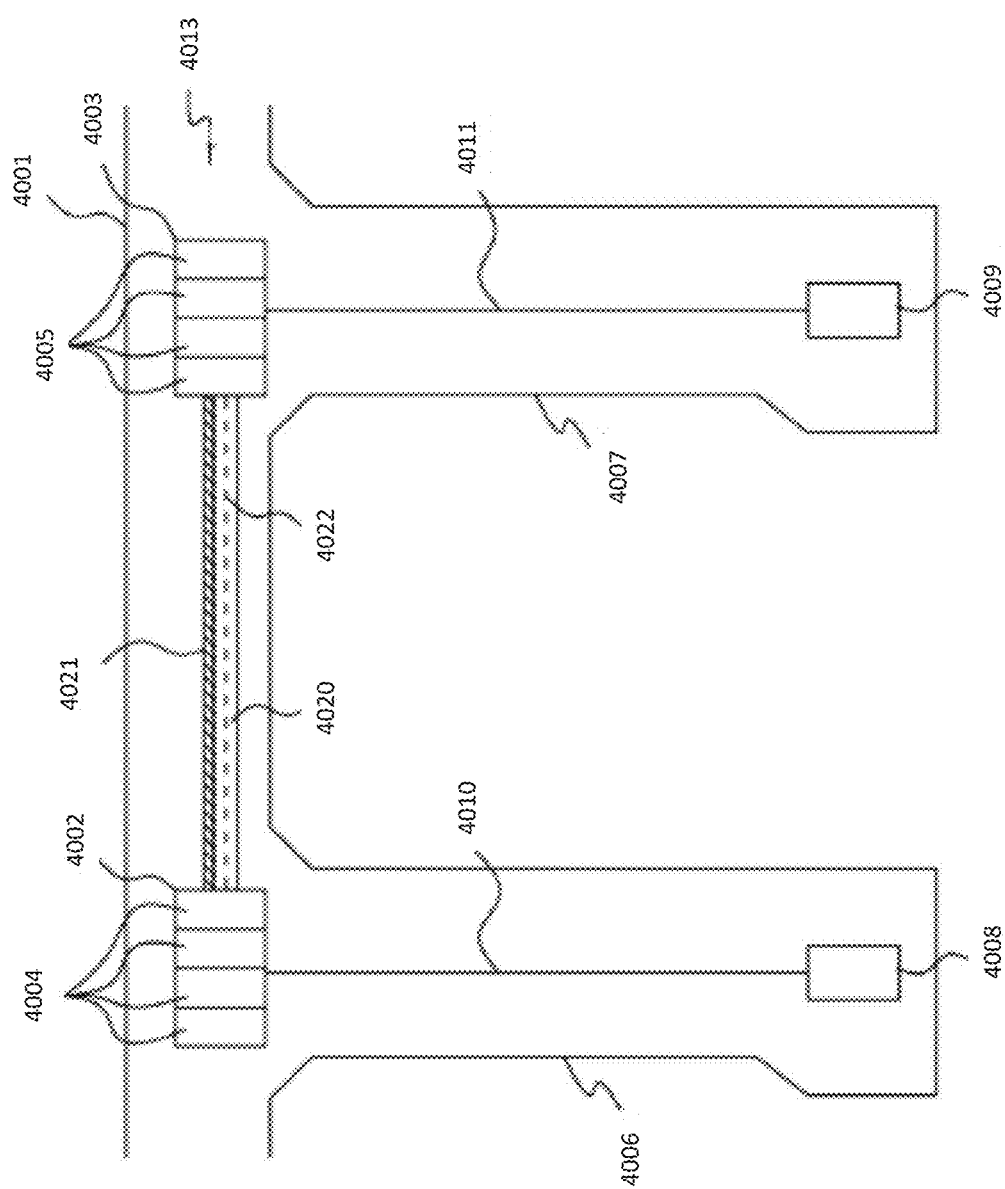
FIG. 40A is a diagram of an example LED strip with an integrated bus line between LED banks.

According to an implementation of the disclosed subject matter, two or more LED banks may be connected via an integrated bus line. As shown in FIG. 40A, a flexible printed circuit board 4001 may include an integrated bus line 4020 that connects a first LED bank 4002 and a second LED bank 4001. The LED strip 4001 may include a body 4013 which includes the LED banks 4003 and 4003. Each of the LED banks may include one or more LEDs, such as one or more LEDs 4004 of LED bank 4002 and one or more LEDs 4005 of LED bank 4003. The LED strip 4001 also may include multiple legs, each leg corresponding to an LED bank such as leg 4006 corresponding to LED bank 4002 and leg 4007 corresponding to LED bank 4003. As disclosed herein, each leg may be flexible such that the leg is able to bend, fold, curve, or otherwise shape itself.

According to an implementation, the LED strip 4001 may have an adhesive backing for affixing the LED strip 3801 to an object or structure such as base 392 of FIGS. 2A-2D and 3A.

Each leg may include one or more contacts such as contact 4008 of leg 3916 and contact 4009 of leg 4007. Each contact on a leg may be connected to the respective LED bank for that leg via any applicable manner such as via a flexible circuit, as disclosed herein and shown in FIGS. 38 and 39, or via wires. According to an implementation, only one of the legs may include a contact that is connected to the leg's corresponding LED bank, as further disclosed herein.

Electrical contacts 4008 and/or 4009 may provide a signal obtained from a controller, as disclosed herein, to one or more of the LED banks. For example, the contacts 4008 and/or 4009 may be used to provide a signal to the LEDs banks 4002 and/or 4001. It will be understood that a signal provided to an LED bank may correspond to providing the signal to the LEDs in the LED bank (e.g., providing a signal to LED bank 4002 may correspond to providing a signal to the LEDs 4004. The signal may be, for example, one of: (1)

turning off/on the LEDs in an LED bank, (2) changing the brightness of the LEDs in an LED bank (3) changing the color of light output by the LEDs in an LED bank, and/or (4) controlling another characteristic of the operation of the LEDs in an LED bank. The contacts 4008 and 4009 may include any conductive material such as, but not limited to, silver, copper, gold, platinum, and/or palladium.

The LEDs 4004 and/or 4005 in LED banks 4002 and/or 4003 may be connected to one another in series, in parallel, and/or in any other suitable way and may be configured to output the same color of light or different colors of light such as, for example, red, green, and blue. Additionally or alternatively, the LEDs 4004 and/or 4005 may output light having the same correlated color temperature (CCT). Additionally or alternatively, the light outputs of at least two LEDs in a given LED may have different CCTs.

Light emitted from the LEDs 4004 and/or 4005 may be emitted into a light guide, such as the light guide shown in FIGS. 3-4B, 7A-10A, and 11-14. The light guide may guide the light emitted by the LEDs 4004 and/or 4005 based on the shape and characteristics of the light guide and the apparatus in general, which features may include, but are not limited to, texture, curves, dimensions, pans, plates, and the like. For example, FIGS. 7A-10A show light guides with outer edges that are shaped to distribute light in a given pattern, based on the edge. FIGS. 10B and 10C show examples of such distributions. The LEDs 4004 and/or 4005 may be deposited in an inner cavity of a light guide or may be deposited along an outer edge of a light guide such that they emit light into the light guide. An example such configuration is shown in FIG. 14.

One or more of the LEDs 4004 and/or 4005 may be a micro LED such that the one or more LEDs 4004 and/or 4005 may have a width W in the range of 10-500 microns. Furthermore, the one or more LEDs 4004 and/or 4005 may have a length L in the range of 10-500 microns and a height H in the range of 5-30 microns. The width W of any of the one or more LEDs 4004 and/or 4005 may be the same or different from the length L of the same LED.

According to an implementation, LED bank 4002 and 4003 may be connected to each other via an integrated bus line 4020. The integrated bus line 4020 may connect the LED banks 4002 and 4003 such that an electrical signal may travel from the LED bank 4002 to the LED bank 4003 via the integrated bus line 4020.

The integrated bus line 4020 may be provided such that wires are not needed to provide an electrical signal from the LED bank 4002 to the LED bank 4003. Accordingly, the integrated bus line 4020 may allow for a low profile solution which replaces the need for wires that may require additional space. The integrated bus line 4020 may also mitigate a concern related to damaging wires during a manufacturing process (e.g., by catching the wire against a sharp edge or object).

The integrated bus line 4020 may traverse the length between two or more consecutive LED banks or may connect two or more non-consecutive LED banks. The integrated bus line 4020 may be, for example, at least 10 mm long according to an implementation and may be, for example, at least 5 mm long according to another implementation. The integrated bus line 4020 may be narrower than the width of the body 4013 and may have a width of less than 5 mm according to an implementation and less than 3 mm according to another implementation.

The integrated bus line 4020 may carry the multiple electronic signals such that it is split in two or more parts throughout the length of the integrated bus line 4020. As an example, integrated bus line 4020 may be spilt by a dividing line 4022 which may isolate the multiple signals. The isolation may be based on the dividing line 4022 including an insulator or dielectric material which isolates the signal. Alternatively, according to an implementation, the dividing line 4022 may be a physical gap between one side of the integrated bus line 4020 and a different side of the integrated bus line 4020.

The integrated bus line 3810 may be insulated by a dielectric material at one or more edges, ends, or surfaces such that the signals carried by the integrated bus line 3810 are insulated from exiting the integrated bus line 3810. As an example, the integrated bus line 3810 may include dielectric material 3830 which may insulate the ground connection via contact 3805 from being interrupted by a portion of the leg 3802 that is external to the integrated bus line 3810.

According to implementations disclosed herein, an integrated bus line may include a conductive material configured to transfer an electrical signal from a contact to an LED bank. As non-limiting examples, the integrated bus line may include a copper trace, an aluminum trace, and a combination aluminum/copper trace such as, for example, an aluminum coated copper trace.

A controller, such as controller 330 of FIGS. 15-18 or gate controller 1806 of FIG. 18 may be provide a signal to contacts such as contacts 4008 and/or 4009. The signal may be provided to an LED bank such as LED bank 4002 which may receive the controller provided signal via contact 4008. The LED bank 4002 may transfer that signal or a modified version of that signal to LED bank 4003 via integrated bus line 4020. By sharing a signal or a modified version of a signal between a first LED bank and a second LED bank, the disclosed subject matter may be implemented such that a strip has a single or a reduced number of legs as a single or a reduced number of signals are required as a single LED bank can receive a signal and provide the signal or a modified version of the signal to additional LED banks.

Figure 40B:
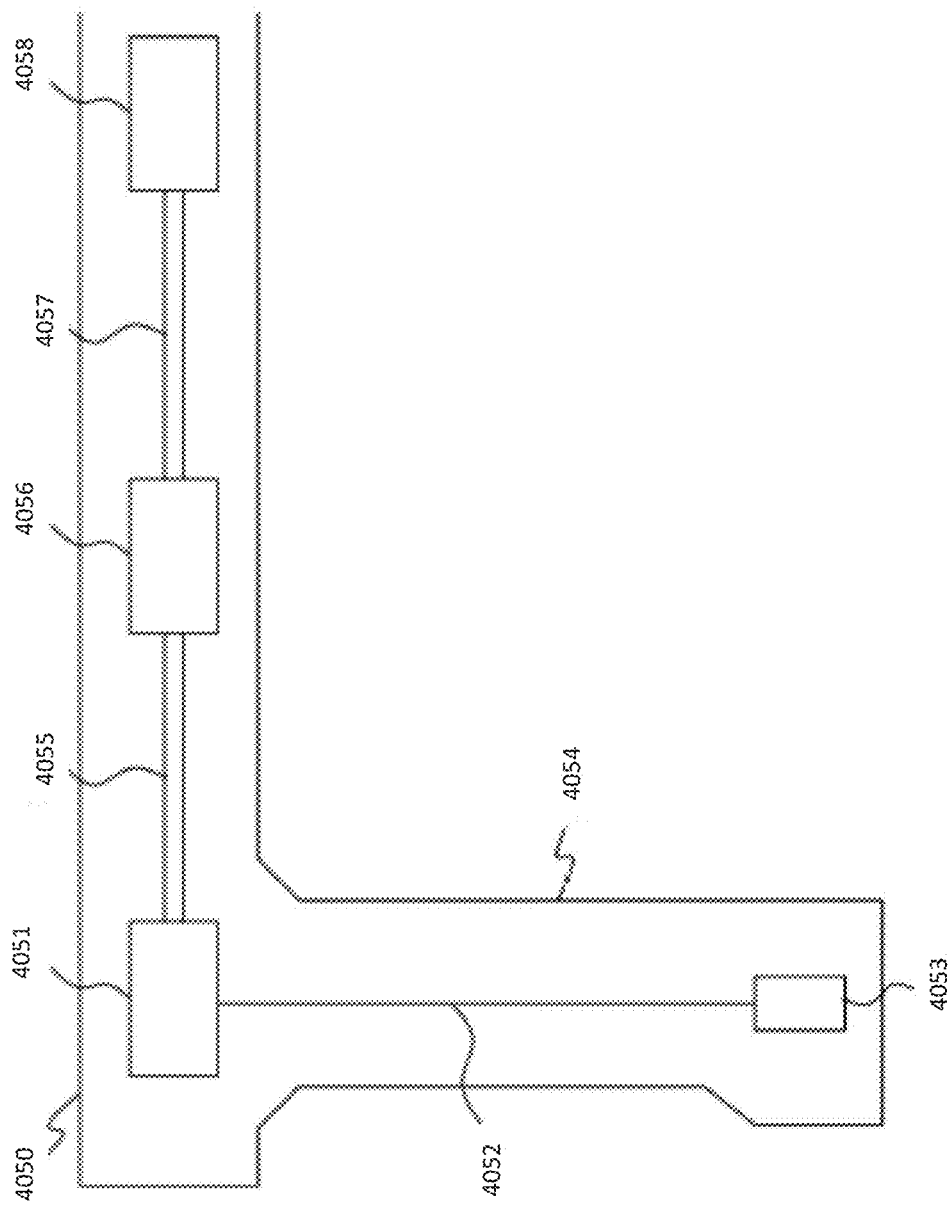
FIG. 40B is a diagram of another example LED strip with an integrated bus line between LED banks.

As an example, FIG. 40B comprises a flexible printed circuit board 4050 which includes a first LED bank 4051, and a leg 4054 which includes contact 4053 connected to the first LED bank 4051 via a wire 4052. The first LED bank is connected to a second LED hank 4056 via an integrated bus line 4055. The first LED bank 4050 and/or and second LED bank 4056 are connected to a third LED bank 4058 via an integrated bus line 4057. According to this example, a controller may provide a signal to contact 4053, and that signal may be provided to LED bank 4051. LED bank 4051 may then provide the same signal to LED bank 4056 via integrated bus line 4055. LED bank 4056 may provide the same signal to LED bank 4058 via integrated bus line 4057. Such a configuration may allow multiple LED banks to receive a signal from a single contact without the use of potentially cumbersome wires connecting each of the LED banks. Such a configuration may also reduce wear inherent to such wires during use and damage to such wires during manufacturing.

Furthermore, using integrated bus lines as disclosed in implementations herein may reduce additional manufacturing steps of soldering wires between multiple components and thereby reducing the overall cost and time of manufacturing.

Although the above light fixtures show the reflector as having a cylindrical shape with a substantially rectangular cross-section, like the other elements being formed in a shape circular or multi-sided (e.g., octangular) shape, the various aspects are not so limited. For example, the reflector may extend over the outer edge of the light guide and have a frustoconical shape. The frustoconical shape has a trapezoidal cross-section, similar to the shape of the light guide in FIG. 10A. The underlying light guide may retain the same frustoconical shape.

As mentioned above, other elements may be incorporated into the above light fixtures. For example, a diffuser may be used disposed under the light guide, to diffuse light directed out from the light guide to an external environment. The diffuser may be formed from a any material that diffuses or scatters light. In some embodiments, the diffuser may be formed from translucent material, such as ground or greyed glass, or may use a diffraction element to scatter the light. The diffuser may be attached to the pan/heat dissipation element using glue or some other adhesive, for example. The diffuser may have an opening that is colinear with the opening of the base. The diffuser may provide uniform light diffusion.

Similarly, throughout the examples above, the light guide is shown as having a circular shape (from a top view). However, in other embodiments, the light guide may have other shapes. Another shape may be an ovular shape. Whichever shape is used, in some embodiments, the lighting may be offset from the center of the light guide. The amount of offset may be dependent on the lighting effect desired, and the reflector and diffuser and other elements may be used to change the effects of the offset. If the light guide shape is non-circular, for example, ovular, the offset may be in the direction of the major axis, minor axis or neither axis. Similarly, if multiple illumination sources 200 are present, one or both of the illumination sources 200 may be offset from the center. The illumination sources 200 may be symmetrically offset or not symmetrically offset. As a result of the offset, the control (duty cycle/current) of the individual LED segments of the illumination sources 200 may be adjusted to produce lighting effects different from those of center lit light guides.

Note that although a majority of the examples describe center-edge-lit light guide panel, in some embodiments outer-edge-lit light guide panel (OEL) modules, or combinations of the two (OCEL) may be used, with each set of LEDs independently controllable. This may enable control of light distribution in the vertical planes in addition to control in the horizontal planes.

According to an implementation of the disclosed subject matter, in which the light engine is installed in a vehicle, a light guide may include one or more external surfaces. An external surface may be a light guide surface that is visible from one or vehicle areas. Light illuminated on one or more external surfaces may exhibit a soft light distribution pattern on the one or more external surfaces. The soft light distribution pattern may be exhibited based on a surface feature such as surface texture, surface pattern, surface features, and/or the like, of the one or more external surfaces. A surface feature may be part of the external light guide surface or may be provided via a surface plate or other light guide component.

As disclosed herein, one or more addressable LED segments may emit light onto an inner surface of a light guide. For example, a first addressable LED segment may emit light onto an inner first portion of a light guide and a second addressable LED segment may emit light onto an inner second portion of the light guide. Light emitted onto the inner portion of a light guide may be emitted onto an external surface of the light guide and may further be emitted onto one or more vehicle areas. For example, light emitted onto an inner first portion of a light guide may be emitted onto a first external portion of the light guide and onto a first vehicle area. Similarly, light emitted onto an inner second portion of a light guide may be emitted onto a second external portion of the light guide and onto a first vehicle area. The light emitted onto an external surface of the light guide may be visible, on the external surface, from one or more vehicle area (e.g., a front vehicle area, a back vehicle area, etc.). The light illuminated on an external surface of the light guide may exhibit a smooth distribution such that it tapers from a high illuminance to a low or no illuminance with a gradient. Although tapering an illuminance is disclosed, it will be understood that one or more of brightness, intensity, contrast, color, or the like may taper from a first point to a second point on the external surface of a light guide.

According to an implementation, light illuminated on an external surface may taper from a maximum illuminance to a minimum illuminance over a distance of at least 1 cm. According to another implementation, light illuminated on an external surface may taper from a maximum illuminance to a minimum illuminance over a distance of at least 3 cm. An external surface of the light guide may be illuminated by light emitted by multiple independently addressable LED segments (e.g., 2-8 different independently addressable LED segments). Accordingly, multiple soft light distribution patterns may be illuminated onto an external surface of the light guide. One or more of the soft light distribution patterns may overlap such that a first soft light distribution pattern from light emitted by a first independently addressable LED segment tappers from a maximum illuminance to a minimum illuminance over a first distance (e.g., 1 cm) and a second soft light distribution pattern from light emitted by a second independently addressable LED segment tappers from a maximum illuminance to a minimum illuminance over a second distance (e.g., 1 cm or 3 cm).

The present disclosure is provided as an example only. At least some of the elements discussed with respect to these figures can be arranged in different order, combined, and/or altogether omitted. It will be understood that the provision of the examples described herein, as well as clauses phrased as "such as," "e.g.", "including", "in some aspects," "in some implementations," and the like should not be interpreted as limiting the disclosed subject matter to the specific examples. Although the examples presented throughout the disclosure are presented in the context of light emitting diodes, it will be understood that any other suitable type of light source can be used instead.

Although some of the concepts disclosed herein are presented in the context of adaptive automotive lighting, it will be understood that the disclosed segmented LED chip implementations, adaptive lighting system implementations, and processes for operating adaptive lighting systems can be employed in any context. For example, they can be used in indoor lighting systems, street lighting systems, stage lighting systems, decorative lighting systems, and greenhouse lighting systems. Thus, the disclosure is not limited to the examples presented herein.

The figures provided herein are provided as an example only. At least some of the elements discussed with respect to these figures can be arranged in different order, combined, and/or altogether omitted. It will be understood that the provision of the examples described herein, as well as clauses phrased as "such as," "e.g.", "including", "in some aspects," "in some implementations," and the like should not be interpreted as limiting the disclosed subject matter to the specific examples. Thus, although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Having described the invention in detail, those skilled in the art will appreciate that, given the present disclosure, modifications may be made to the invention without departing from the spirit of the inventive concepts described herein. Therefore, it is not intended that the scope of the invention be limited to the specific embodiments illustrated and described.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is being claimed is:

1. A vehicle interior lighting system comprising:
    a light engine comprising:
        a plurality of independently addressable light emitting diode (LED) segments, each independently addressable LED segment comprising at least one LED;
        a flexible printed circuit board (PCB) having a base and plurality of legs extending from the base, each leg supporting an independently addressable LED segment;
        a support structure having an outer surface and an inner surface defining a hole through the support structure, the plurality of independently addressable LED segments attached to the base of the flexible PCB, the base of the flexible PCB positioned on one of the inner surface and the outer surface, the plurality of legs extending over another of the inner surface and the outer surface;
        a light guide plate having one of an inner surface and an outer surface configured to receive light from the plurality of independently addressable LED segments, the light guide plate extending from the plurality of independently addressable LED segments and configured to provide illumination from the plurality of independently addressable LED segments inside a vehicle;
    a processor configured to receive information from at least one type of system including a vehicle sensing system, a vehicle communication system, and a detection system, and generate a signal; and
    a controller, electrically coupled to one or more legs of the flexible PCBs, the controller configured to provide one or more light control signals to modify at least one light characteristic of at least one of the plurality of independently addressable LED segments based on the signal.

2. The system of claim 1, wherein at least some of the plurality of independently addressable LED segments are arranged to increase or decrease illumination in different vehicle locations inside a vehicle in response to the one or more light control signals.

3. The system of claim 2, wherein the different vehicle locations within the vehicle include at least one of a driver area, a front passenger area, a rear right passenger area, a rear middle passenger area, a rear left passenger area, a front row, a middle row, and a back row.

4. The system of claim 1, wherein at least some of the plurality of independently addressable LED segments are arranged to modify at least one of light intensity, brightness, contrast, hue, saturation, color, temperature, and polarization characteristics in different locations inside a vehicle in response to the one or more control signals.

5. The system of claim 1, wherein the information received by the processor represents at least one of image data, video data, and location-tracked image data, facial recognition data, face detection data, shape recognition data, machine learning data, computer vision data, weather data, environmental data, user profile data, and object location data.

6. The system of claim 1, wherein the light engine is located on at least one of a vehicle ceiling, a vehicle dashboard, a vehicle window, a vehicle floor, and a vehicle door.

7. The system of claim 1, further comprising a first set of LED segments located at a first vehicle position and a second set of LED segments located at a second vehicle position, one of the first and second sets of LED segments being the plurality of LED segments, the first and second sets of LED segments controlled by the controller.

8. The system of claim 1, wherein the vehicle sensing system is disposed within an opening in the light guide plate.

9. The system of claim 1, wherein the vehicle sensing system is disposed within a gap created between the plurality of the independently addressable LED segments.

10. The system of claim 1, wherein the vehicle sensing system comprises a detection system disposed within the light engine, the detection system configured to detect motion within vehicle areas.

11. The system of claim 1, wherein the controller is configured to provide one or more light control signals to modify at least one light characteristic of at least one of the plurality of independently addressable LED segments based on the signal to provide a spot of reduced horizontal illumination surrounding or on a moving object within the vehicle that tracks the moving object.

12. A vehicle interior lighting system comprising:
    a light engine comprising:
        a plurality of independently addressable light emitting diode (LED) segments, each LED segment comprising a plurality of LEDs;
        a flexible printed circuit board (PCB) having a body and a plurality of legs extending from the body, each leg supporting an independently addressable LED segment;

a support structure having an outer surface and an inner surface defining a hole through the support structure, the plurality of independently addressable LED segments attached to the base of the flexible PCB, the base of the flexible PCB positioned on one of the inner surface and the outer surface, the plurality of legs extending over another of the inner surface and the outer surface;

a sensor system comprising a sensor;

a processor configured to receive a first input from the sensor system; and a controller configured to modify at least one light characteristic of at least one of the plurality of independently addressable LED segments based on the first input.

13. The system of claim 12, wherein the sensor is one of an infra-red (IR) sensor, a camera, a motion detection sensor, a weight sensor, a pressure sensor, an ultra sound sensor, a proximity sensor, a capacitive sensor, a photoelectric sensor, an inductive sensor, and a magnetic sensor.

14. The system of claim 12, wherein the sensor communicates with the processor via a wireless transmission.

15. The system of claim 12, wherein the light engine further comprising a light guide plate, the light guide plate having an inner surface configured to receive light from the plurality of independently addressable LED segments, the light guide plate extending outward from the plurality of independently addressable LED segments and configured to provide illumination from the plurality of independently addressable LED segments inside the vehicle.

16. The system of claim 12, wherein the plurality of independently addressable LED segments are attached to the base of the flexible PCB, the base of the flexible PCB is positioned on the outer surface and the plurality of legs extend through the hole and over the inner surface.

17. A method comprising:

receiving a first input from at least one of a vehicle sensing system and a vehicle communication system at a first time;

providing a first signal based on the first input to at least one of a plurality of independently addressable LED segments that are attached to a base of a flexible printed circuit board (PCB) having a plurality of legs, the base of the flexible PCB positioned on one of an inner and outer surface of a support structure and the plurality of legs extending over another of the inner and outer surface, the inner surface defining a hole through the support structure;

modifying at least one light characteristic of at least one of the plurality of independently addressable LED segments based on the first signal;

receiving a second input from the at least one of a vehicle sensing system and the vehicle communication system at a second time; and modifying the at least one light characteristic of at least one of the plurality of independently addressable LED segments based on a second signal provided based on the second input.

18. The method of claim 17, wherein the first input is based on a first object characteristic and the second input is based on a second object characteristic.

19. The method of claim 18, wherein the first object characteristic and the second object characteristic are at least one of an object location, an object size, a gaze location, a user input, and a vehicle component.

20. The method of claim 19, wherein the vehicle component is one of a door position, a window position, a seat position, a vehicle speed, and a vehicle gear.

* * * * *